(12) United States Patent
Juang et al.

(10) Patent No.: US 12,347,758 B2
(45) Date of Patent: Jul. 1, 2025

(54) DUAL-UNDERFILL ENCAPSULATION FOR PACKAGING AND METHODS OF FORMING THE SAME

(71) Applicant: Taiwan Semiconductor Manufacturing Company Limited, Hsinchu (TW)

(72) Inventors: Jing-Ye Juang, Hsinchu (TW); Chia-Kuei Hsu, Hsinchu (TW); Ming-Chih Yew, Hsinchu (TW); Hsien-Wei Chen, Hsinchu (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 449 days.

(21) Appl. No.: 17/829,511

(22) Filed: Jun. 1, 2022

(65) Prior Publication Data
US 2023/0395479 A1    Dec. 7, 2023

(51) Int. Cl.
*H01L 23/498*    (2006.01)
*H01L 21/48*    (2006.01)
(Continued)

(52) U.S. Cl.
CPC .. *H01L 23/49816* (2013.01); *H01L 23/49822* (2013.01); *H01L 23/49833* (2013.01);
(Continued)

(58) Field of Classification Search
CPC ......... H01L 23/49816; H01L 23/49822; H01L 23/49833; H01L 23/49838; H01L 23/49894; H01L 25/105; H01L 21/4857; H01L 24/16; H01L 24/32; H01L 24/73; H01L 25/0657; H01L 2224/16227; H01L 2224/16238; H01L 2224/73204; H01L 2225/06513; H01L 2225/06524; H01L 2924/1431; H01L 2924/1437; H01L 2924/3511; H01L 2924/3512;
(Continued)

(56) References Cited

U.S. PATENT DOCUMENTS

2016/0049345 A1 *    2/2016  Brofman ........... H01L 23/49838
                                                    257/676
2019/0137706 A1 *    5/2019  Xie ...................... G02B 6/4202
(Continued)

*Primary Examiner* — Kyoung Lee
*Assistant Examiner* — Sophia W Kao
(74) *Attorney, Agent, or Firm* — The Marbury Law Group, PLLC

(57) ABSTRACT

A semiconductor structure includes an assembly including an interposer, at least one semiconductor die attached to the interposer including interposer bonding pads, and a die-side underfill material portion located between the interposer and the at least one semiconductor die, a packaging substrate including substrate bonding pads, an array of solder material portions bonded to the interposer bonding pads and the substrate bonding pads, a central underfill material portion laterally surrounding a first subset of the solder material portions, and at least one peripheral underfill material portion contacting corner regions of the interposer and a respective surface segment of the central underfill material portion and having a different material composition than the central underfill material portion.

20 Claims, 59 Drawing Sheets

(51) Int. Cl.
　　*H01L 23/00*　　　(2006.01)
　　*H01L 25/065*　　(2023.01)
　　*H01L 25/10*　　　(2006.01)
(52) U.S. Cl.
　　CPC .. *H01L 23/49838* (2013.01); *H01L 23/49894* (2013.01); *H01L 25/105* (2013.01); *H01L 21/4857* (2013.01); *H01L 24/16* (2013.01); *H01L 24/32* (2013.01); *H01L 24/73* (2013.01); *H01L 25/0657* (2013.01); *H01L 2224/16227* (2013.01); *H01L 2224/16238* (2013.01); *H01L 2224/73204* (2013.01); *H01L 2225/06513* (2013.01); *H01L 2225/06524* (2013.01); *H01L 2924/1431* (2013.01); *H01L 2924/1437* (2013.01); *H01L 2924/3511* (2013.01); *H01L 2924/3512* (2013.01)
(58) Field of Classification Search
　　CPC ....... H01L 23/5384; H01L 2221/68327; H01L 21/6835; H01L 23/5383; H01L 23/5385; H01L 2224/81; H01L 21/561; H01L 21/568; H01L 23/3135; H01L 23/3128; H01L 25/50; H01L 25/0652; H01L 24/13
　　See application file for complete search history.

(56) References Cited

U.S. PATENT DOCUMENTS

| | | | |
|---|---|---|---|
| 2019/0198437 A1* | 6/2019 | Kim | H01L 23/49833 |
| 2020/0006181 A1* | 1/2020 | Chen | H01L 25/105 |
| 2020/0027806 A1* | 1/2020 | Lin | H01L 23/5384 |
| 2022/0013496 A1* | 1/2022 | Park | H01L 25/105 |
| 2022/0020653 A1* | 1/2022 | Kim | H01L 24/13 |
| 2022/0302003 A1* | 9/2022 | Pan | H01L 23/5385 |
| 2022/0367431 A1* | 11/2022 | Chen | H01L 25/0655 |
| 2022/0406671 A1* | 12/2022 | Hsu | H01L 23/562 |

* cited by examiner

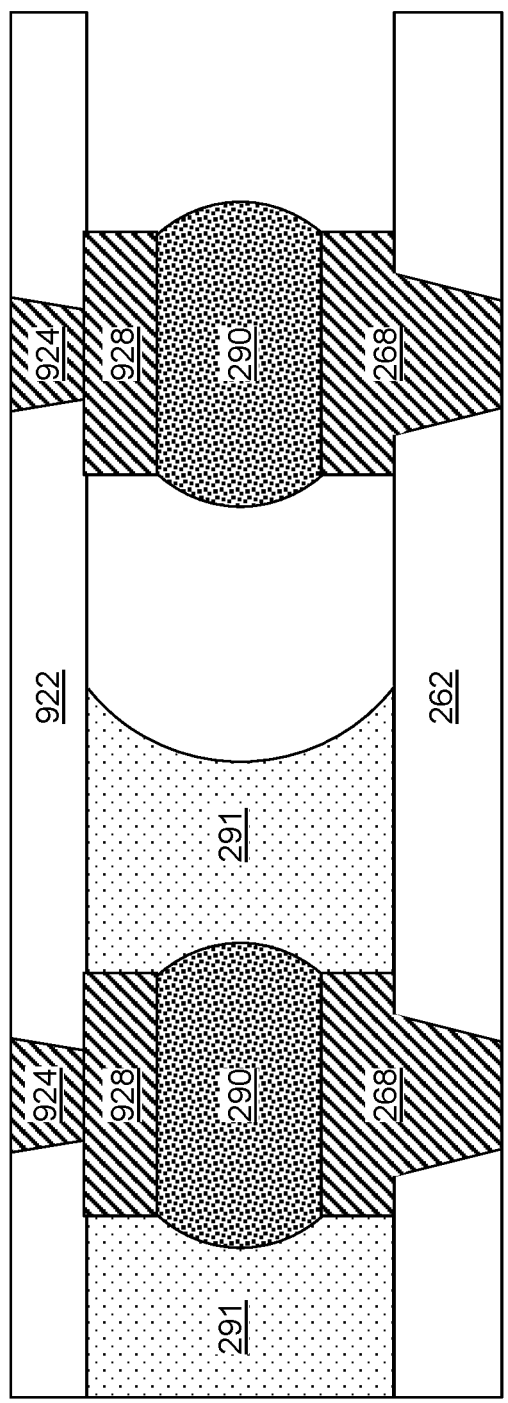

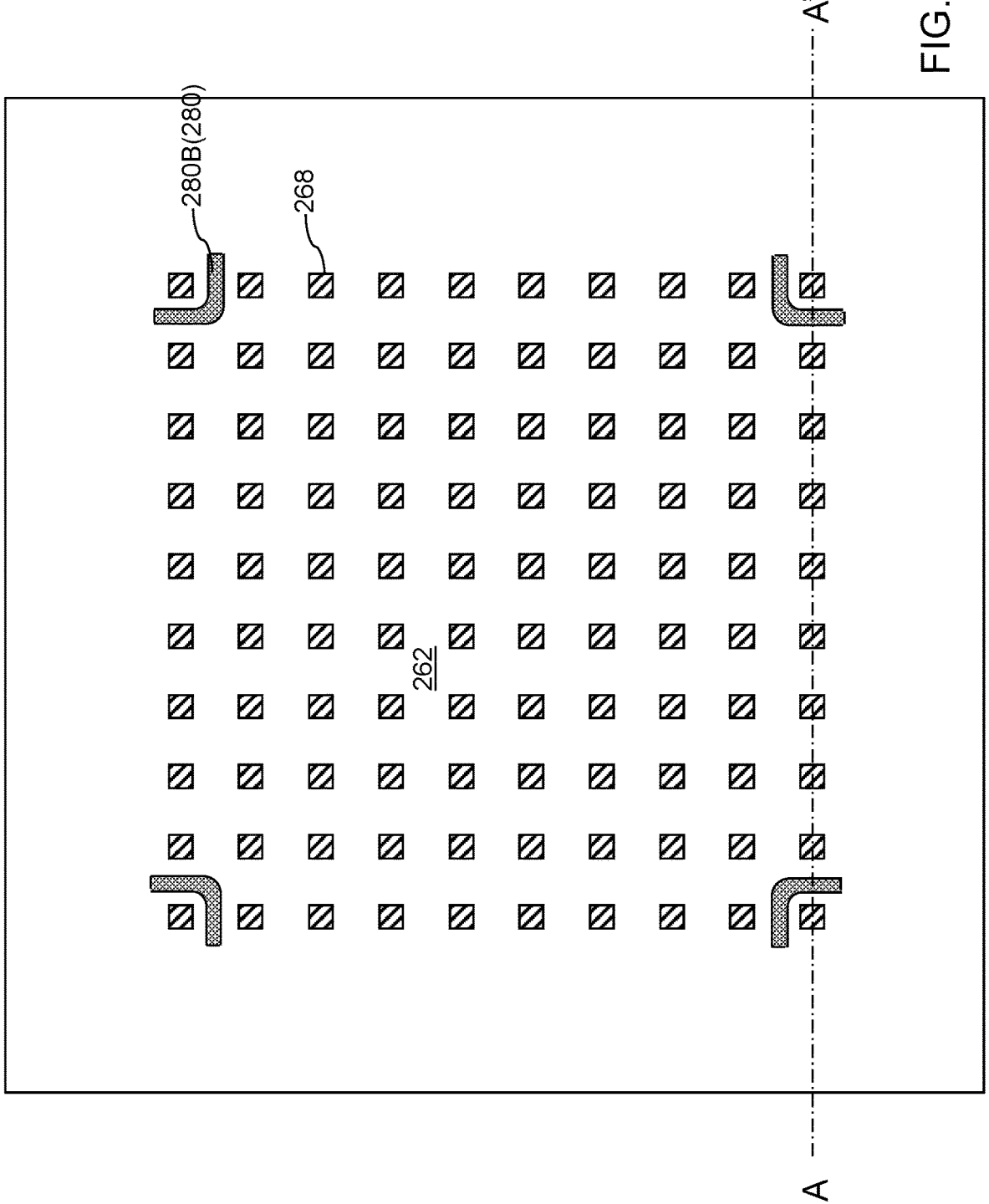

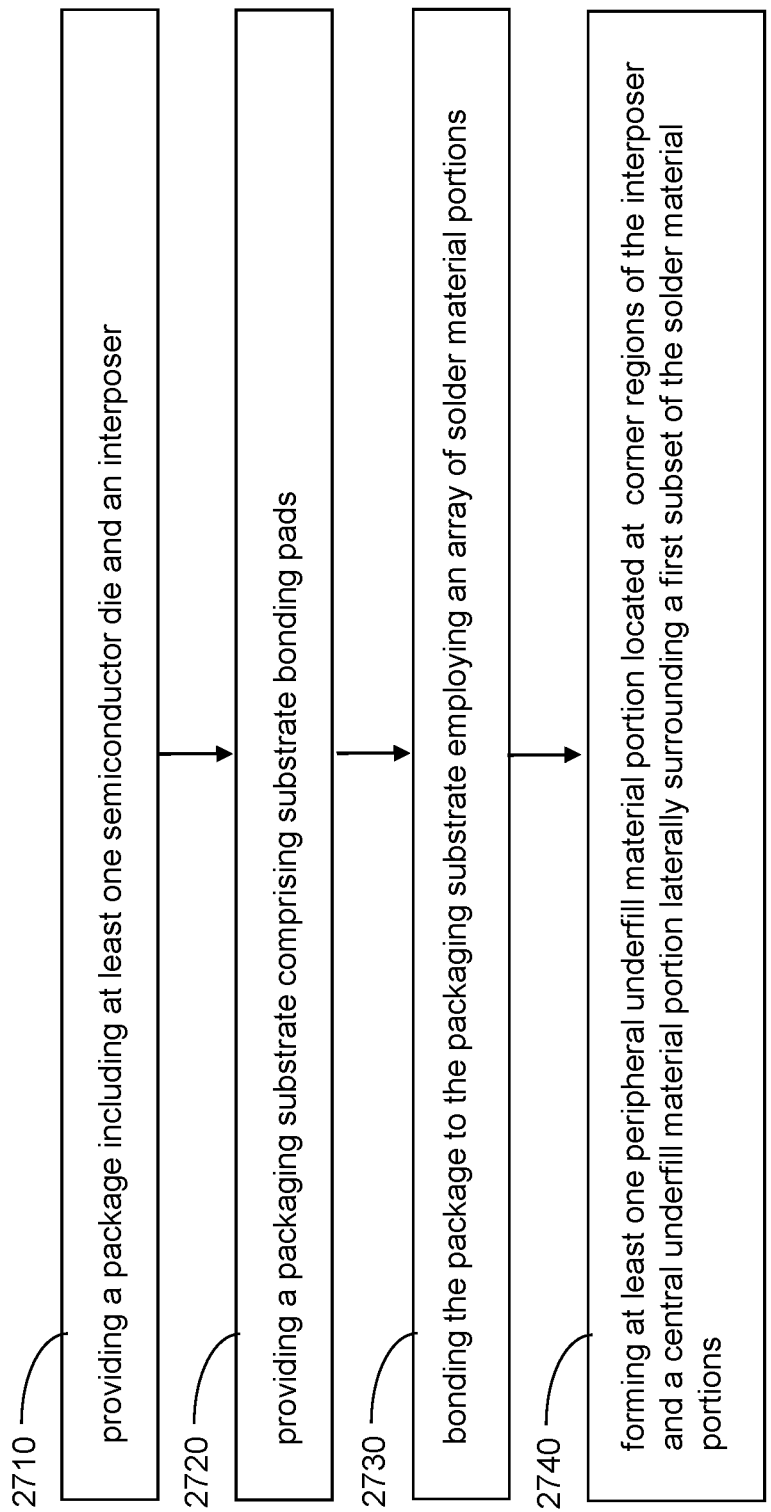

DUAL-UNDERFILL ENCAPSULATION FOR PACKAGING AND METHODS OF FORMING THE SAME

BACKGROUND

Interfaces between a fan-out wafer level package (FOWLP) and an underfill material portion are subjected to mechanical stress during subsequent handling of an assembly of the FOWLP, the underfill material portion, and a packaging substrate, such as the mechanical stress associated with attaching the packaging substrate to a printed circuit board (PCB). In addition, interfaces between a FOWLP and an underfill material portion are subjected to mechanical stress during use within a computing device, such as when a mobile device is accidently dropped to cause a mechanical shock during usage. Cracks may be formed in the underfill material, and may induce additional cracks in a semiconductor die, solder material portions, interposers, and/or various dielectric layers within a semiconductor die or within a packaging substrate. Thus, suppression of the formation of cracks in the underfill material is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 19C, 19D, and 19E are vertical cross-sectional views of various configurations of a region M of the exemplary structure of FIG. 19A.

FIG. 24B is a top-down view of the packaging substrate of FIG. 24A.

FIG. 27 is a flowchart illustrating steps for forming an exemplary structure according to an embodiment of the present disclosure.

DETAILED DESCRIPTION

Figure 1A:
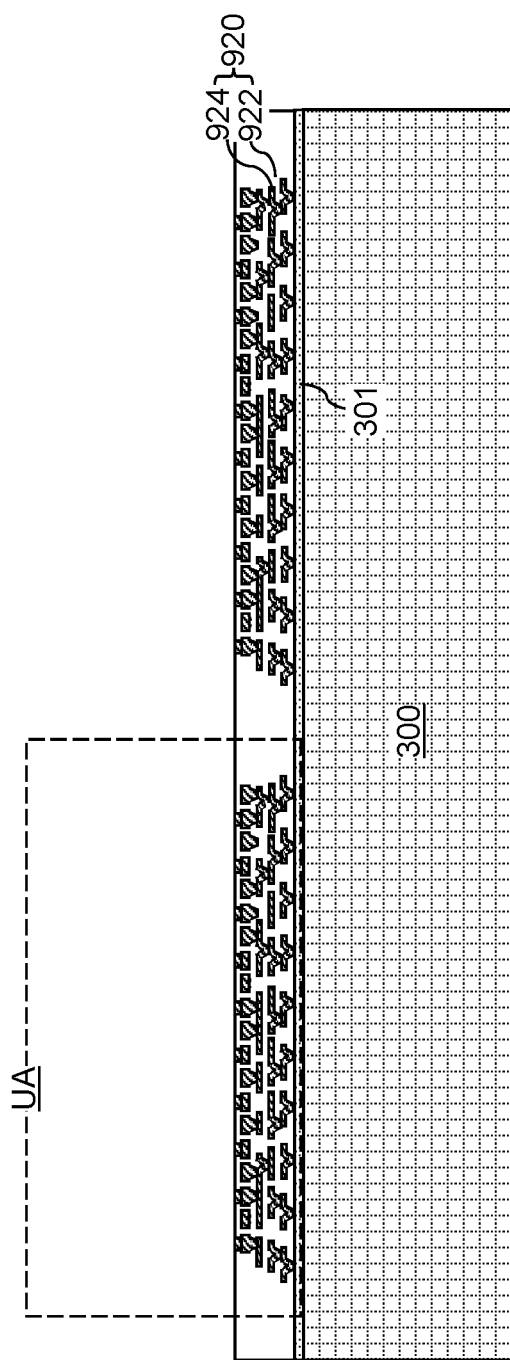
FIG. 1A is a vertical cross-sectional view of a region of a first exemplary structure that includes a first carrier substrate and interposers according to a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments disclosed herein are directed to semiconductor devices, and particularly to uniform application of an underfill material in semiconductor die packaging. Generally, the various embodiment methods and structures disclosed herein may be used to provide a chip package structure such as a FOWLP and fan-out panel level package (FOPLP). While the present disclosure is described using an FOWLP configuration, the various embodiment methods and structures of the present disclosure may be implemented in an FOPLP configuration or any other fan-out package configuration.

Fan-out packages are subject to deformation under stress during subsequent assembly processes and/or during operation under mechanical stress and/or under heat. According to an aspect of the present disclosure, deformation of a fan-out package may be reduced by using multiple underfill material portions. Specifically, a central underfill material portion having a first material composition and at least one peripheral underfill material portion having a second material composition may be used to enhance resistance to stress and deformation in a packaging structure.

Typically, heterogeneous integration is used to integrate a large interposer (such as a CoWoS® interposer or an organic interposer) and a high electrical performance substrate, such as a multi-layer core or a multilayer substrate (which may include 12 or more layers) for a high performance chip. The effective coefficient of thermal expansion for such a structure may be more than four times the coefficient of thermal expansion for silicon. Such a large mismatch of coefficients of thermal expansion between a substrate and semiconductor dies on an interposer may often result in molding crack at fan-out module corners. For these reasons, large fan-out modules formed by molding may be at high crack risk at the corners. According to an aspect of the present disclosure, a central underfill material having a first Young's modulus may be applied to a center portion of an array of solder material portions, and at least one peripheral underfill material having a second Young's modulus that is less than the first Young's modulus may be applied to the corner regions of the array of solder material portions. This configuration effectively reduce the impact of the molding stress, thereby mitigating against the formation of molding cracks in corner regions of an interposer, and providing enhanced reliability to the interposer. The various aspects and embodiments of the methods and structures of the present disclosure are described with reference to accompanying drawings herebelow.

Figure 1B:
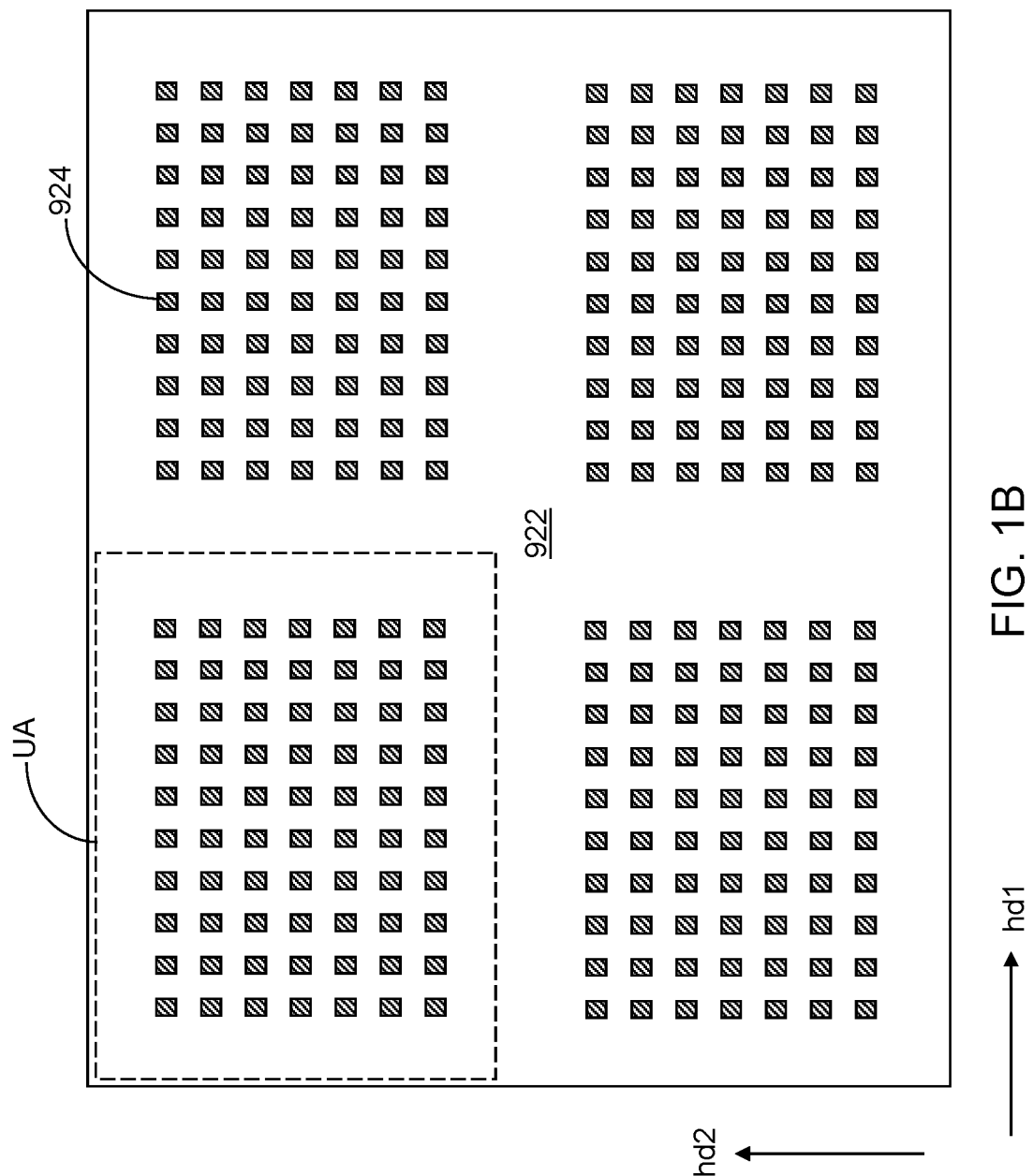
FIG. 1B is a top-down view of the region of the first exemplary structure of FIG. 1A.

Referring to FIGS. 1A and 1B, a first exemplary structure according to an embodiment of the present disclosure may include a first carrier substrate 300 and interposers 920 formed on a front side surface of the first carrier substrate 300. The first carrier substrate 300 may include an optically transparent substrate such as a glass substrate or a sapphire substrate. The diameter of the first carrier substrate 300 may be in a range from 150 mm to 290 mm, although lesser and greater diameters may be used. In addition, the thickness of the first carrier substrate 300 may be in a range from 500 microns to 2,000 microns, although lesser and greater thicknesses may also be used. Alternatively, the first carrier substrate 300 may be provided in a rectangular panel format. The dimensions of the first carrier in such alternative embodiments may be substantially the same.

A first adhesive layer 301 may be applied to the front-side surface of the first carrier substrate 300. In one embodiment, the first adhesive layer 301 may be a light-to-heat conversion (LTHC) layer. The LTHC layer may be a solvent-based coating applied using a spin coating method. The LTHC layer may convert ultraviolet light to heat, which may cause the material of the LTHC layer to lose adhesion. Alternatively, the first adhesive layer 301 may include a thermally decomposing adhesive material. For example, the first adhesive layer 301 may include an acrylic pressure-sensitive adhesive that decomposes at an elevated temperature. The debonding temperature of the thermally decomposing adhesive material may be in a range from 150 degrees to 200 degrees Celsius.

Redistribution structures 920 may be formed over the first adhesive layer 301. Specifically, an interposer 920 may be formed within each unit area UA, which is the area of a repetition unit that may be repeated in a two-dimensional array over the first carrier substrate 300. Each interposer 920 may include redistribution dielectric layers 922 and redistribution wiring interconnects 924. The redistribution dielectric layers 922 include a respective dielectric polymer material such as polyimide (PI), benzocyclobutene (BCB), or polybenzobisoxazole (PBO). Other suitable materials may be within the contemplated scope of disclosure. Each redistribution dielectric layer 922 may be formed by spin coating and drying of the respective dielectric polymer material. The thickness of each redistribution dielectric layer 922 may be in a range from 2 microns to 40 microns, such as from 4 microns to 20 microns. Each redistribution dielectric layer 922 may be patterned, for example, by applying and patterning a respective photoresist layer thereabove, and by transferring the pattern in the photoresist layer into the redistribution dielectric layer 922 using an etch process such as an anisotropic etch process. The photoresist layer may be subsequently removed, for example, by ashing.

Each of the redistribution wiring interconnects 924 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 400 nm, and the copper seed layer may have a thickness in a range from 100 nm to 500 nm. The metallic fill material for the redistribution wiring interconnects 924 may include copper, nickel, or copper and nickel. Other suitable metallic fill materials are within the contemplated scope of disclosure. The thickness of the metallic fill material that is deposited for each redistribution wiring interconnect 924 may be in a range from 2 microns to 40 microns, such as from 4 microns to 10 microns, although lesser or greater thicknesses may also be used. The total number of levels of wiring in each interposer 920 (i.e., the levels of the redistribution wiring interconnects 924) may be in a range from 1 to 10. A periodic two-dimensional array (such as a rectangular array) of interposers 920 may be formed over the first carrier substrate 300. Each interposer 920 may be formed within a unit area UA. The layer including all interposers 920 is herein referred to as an interposer layer. The interposer layer includes a two-dimensional array of interposers 920. In one embodiment, the two-dimensional array of interposers 920 may be a rectangular periodic two-dimensional array of interposers 920 having a first periodicity along a first horizontal direction hd1 and having a second periodicity along a second horizontal direction hd2 that is perpendicular to the first horizontal direction hd1.

Figure 2A:
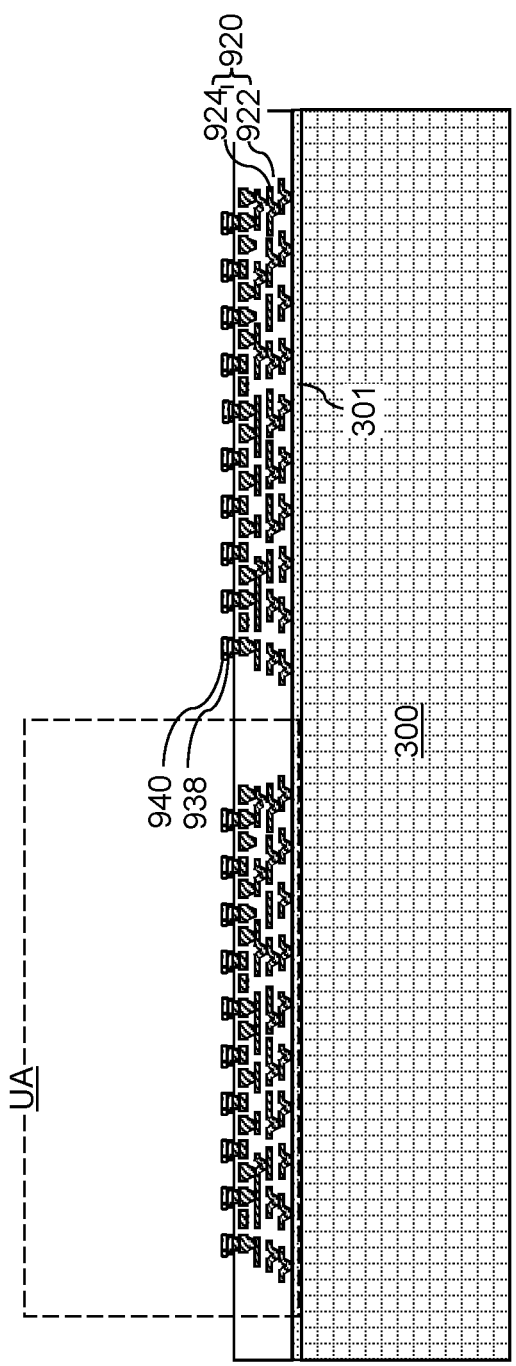
FIG. 2A is vertical cross-sectional view of a region of the first exemplary structure after formation of redistribution-side bonding structures and first solder material portions according to the first embodiment of the present disclosure.
Figure 2B:
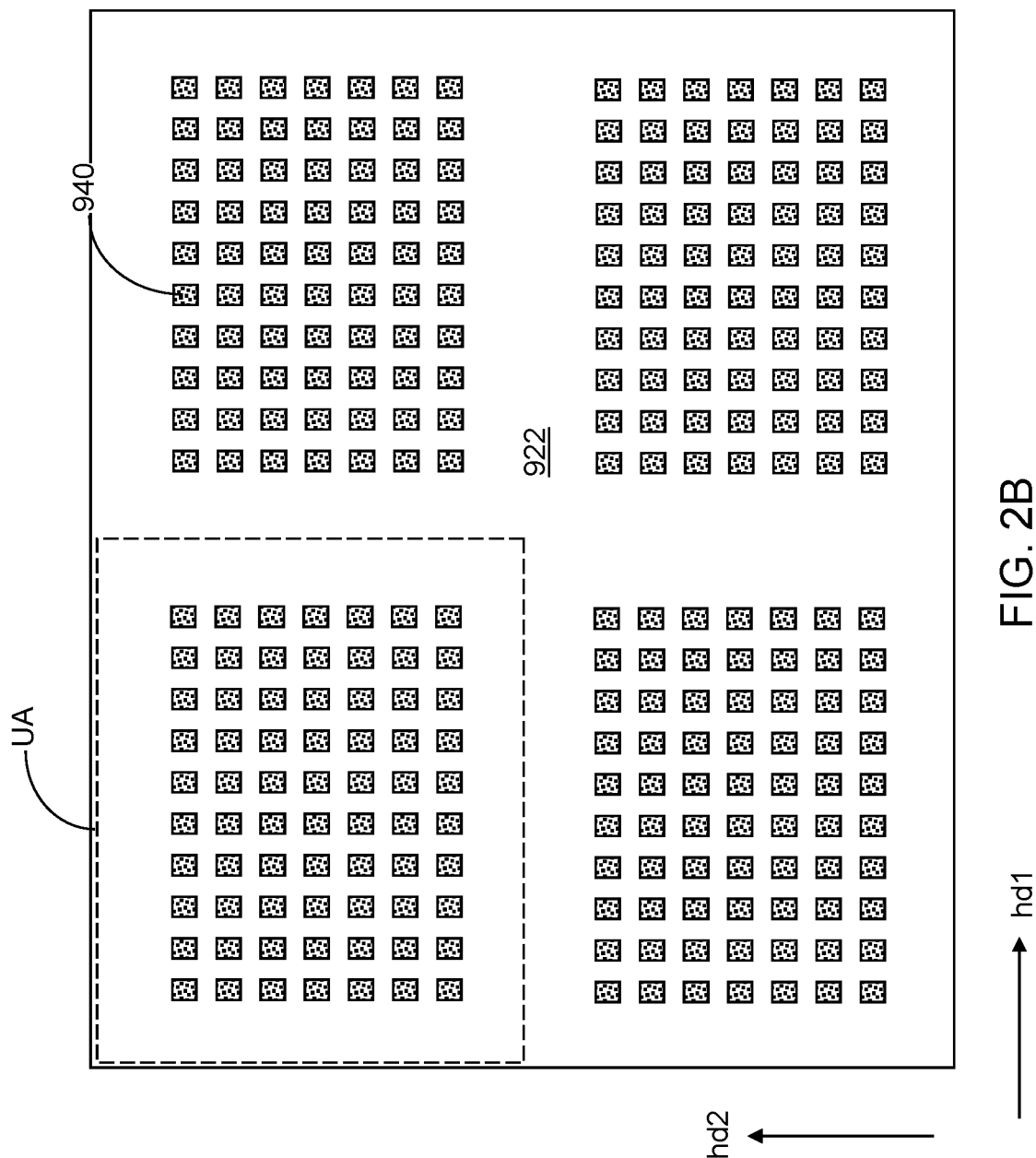
FIG. 2B is a top-down view of the region of the first exemplary structure of FIG. 2A.

Referring to FIGS. 2A and 2B, at least one metallic material and a first solder material may be sequentially deposited over the front-side surface of the interposers 920. The at least one metallic material comprises a material that may be used for metallic bumps, such as copper. The thickness of the at least one metallic material may be in a range from 5 microns to 60 microns, such as from 10 microns to 30 microns, although lesser and greater thicknesses may also be used. The first solder material may comprise a solder material suitable for C2 bonding, i.e., for microbump bonding. The thickness of the first solder material may be in a range from 2 microns to 30 microns, such as from 4 microns to 15 microns, although lesser and greater thicknesses may also be used.

The first solder material and the at least one metallic material may be patterned into discrete arrays of first solder material portions 940 and arrays of metal bonding structures, which are herein referred to as arrays of redistribution-side bonding structures 938. Each array of redistribution-side bonding structures 938 is formed within a respective unit area UA. Each array of first solder material portions 940 is formed within a respective unit area UA. Each first solder material portion 940 may have a same horizontal cross-sectional shape as an underlying redistribution-side bonding structures 938.

In one embodiment, the redistribution-side bonding structures 938 may include, and/or may consist essentially of, copper or a copper-containing alloy. Other suitable materials are within the contemplated scope of disclosure. The thickness of the redistribution-side bonding structures 938 may be in a range from 5 microns to 60 microns, although lesser or greater thicknesses may also be used. The redistribution-side bonding structures 938 may have horizontal cross-sectional shapes of rectangles, rounded rectangles, circles, regular polygons, irregular polygons, or any other two-dimensional curvilinear shape having a closed periphery. In one embodiment, redistribution-side bonding structures 938 may be configured for microbump bonding (i.e., C2 bonding), and may have a thickness in a range from 10 microns to 30 microns, although lesser or greater thicknesses may also be used. In this embodiment, each array of redistribution-side bonding structures 938 may be formed as an array of microbumps (such as copper pillars) having a lateral dimension in a range from 10 microns to 25 microns, and having a pitch in a range from 20 microns to 50 microns.

Figure 3A:
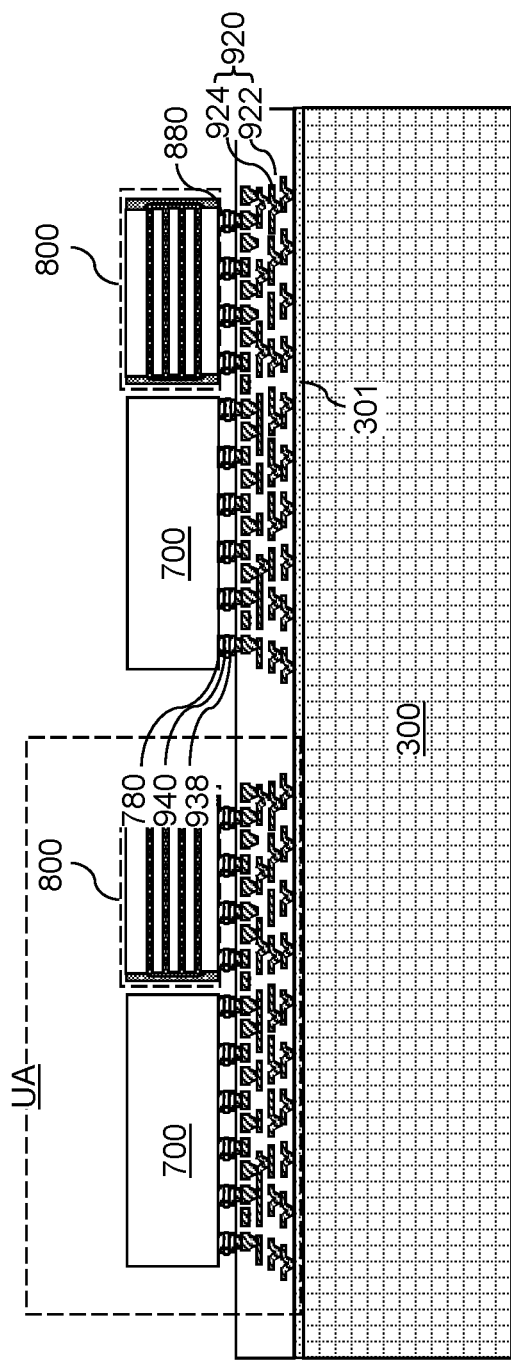
FIG. 3A is a vertical cross-sectional view of a region the first exemplary structure after attaching semiconductor dies according to the first embodiment of the present disclosure.
Figure 3B:
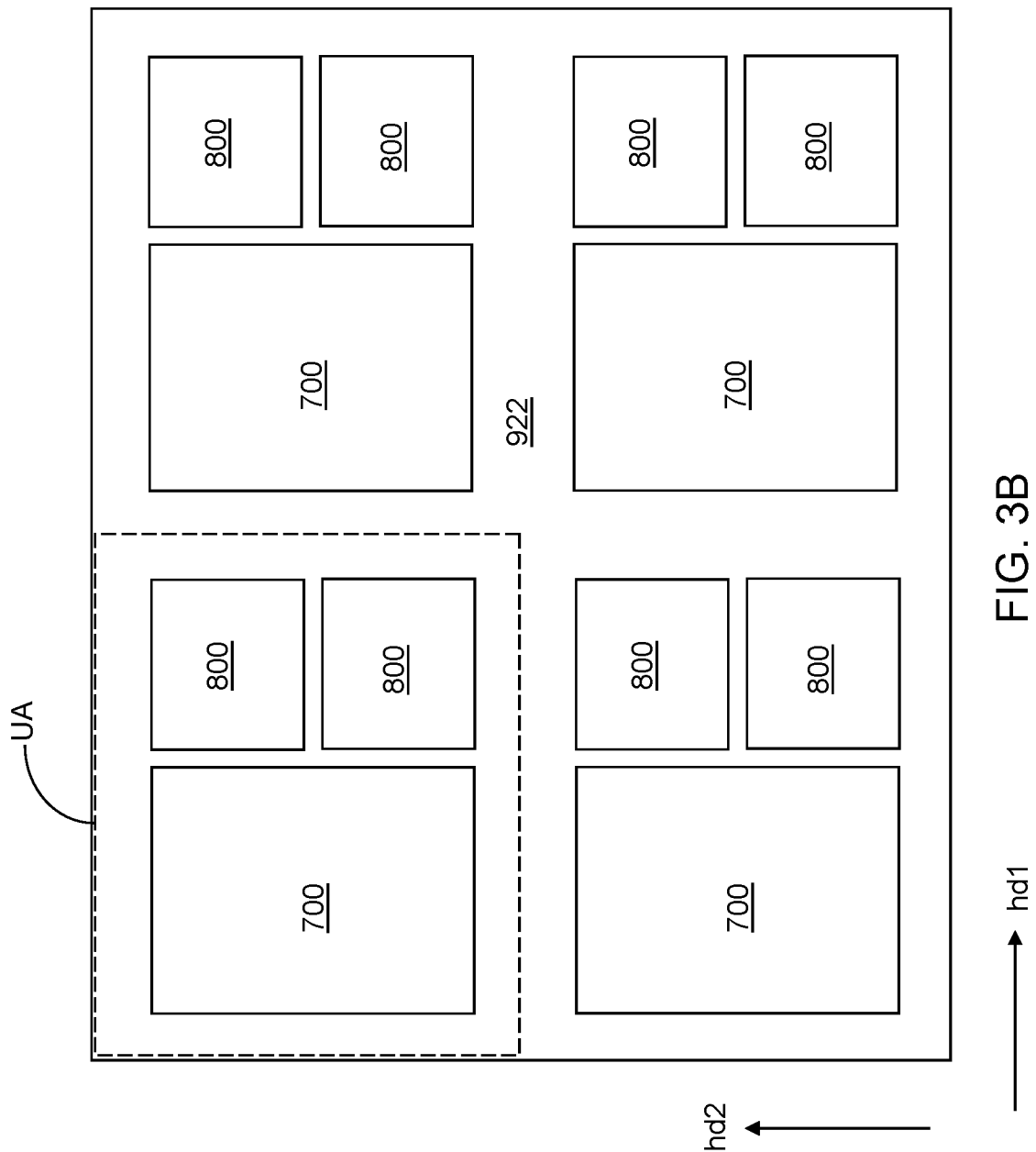
FIG. 3B is a top-down view of the region of the first exemplary structure of FIG. 3A.

Referring to FIGS. 3A and 3B, a set of at least one semiconductor die (700, 800) may be bonded to each interposer 920. In one embodiment, the interposers 920 may be arranged as a two-dimensional periodic array, and multiple sets of at least one semiconductor die (700, 800) may be bonded to the interposers 920 as a two-dimensional periodic rectangular array of sets of the at least one semiconductor die (700, 800). Each set of at least one semiconductor die (700, 800) includes at least one semiconductor die. Each set of at least one semiconductor die (700, 800) may include any set of at least one semiconductor die known in the art. In one embodiment, each set of at least one semiconductor die (700, 800) may comprise a plurality of semiconductor dies (700, 800). For example, each set of at least one semiconductor die (700, 800) may include at least one system-on-chip (SoC) die 700 and/or at least one memory die 800. Each SoC die 700 may comprise an application processor die, a central processing unit die, or a graphic processing unit die. In one embodiment, the at least one memory die 800 may comprise a high bandwidth memory (HBM) die that includes a vertical stack of static random access memory dies. In one embodiment, the at least one semiconductor die (700, 800) may include at least one system-on-chip (SoC) die and a high bandwidth memory (HBM) die including a vertical stack of static random access memory (SRAM) dies that are interconnected to one another through microbumps and are laterally surrounded by an epoxy molding material enclosure frame.

Each semiconductor die (700, 800) may comprise a respective array of die-side bonding structures (780, 880). For example, each SoC die 700 may comprise an array of SoC metal bonding structures 780, and each memory die 800 may comprise an array of memory-die metal bonding structures 880. Each of the semiconductor dies (700, 800) may be positioned in a face-down position such that die-side bonding structures (780, 880) face the first solder material portions 940. Each set of at least one semiconductor die (700, 800) may be placed within a respective unit area UA. Placement of the semiconductor dies (700, 800) may be performed using a pick and place apparatus such that each of the die-side bonding structures (780, 880) may be placed on a top surface of a respective one of the first solder material portions 940.

Generally, an interposer 920 including redistribution-side bonding structures 938 thereupon may be provided, and at least one semiconductor die (700, 800) including a respective set of die-side bonding structures (780, 880) may be provided. The at least one semiconductor die (700, 800) may be bonded to the interposer 920 using first solder material portions 940 that are bonded to a respective redistribution-side bonding structure 938 and to a respective one of the die-side bonding structures (780, 880). Each set of at least one semiconductor die (700, 800) may be attached to a respective interposer 920 through a respective set of first solder material portions 940.

Figure 3C:
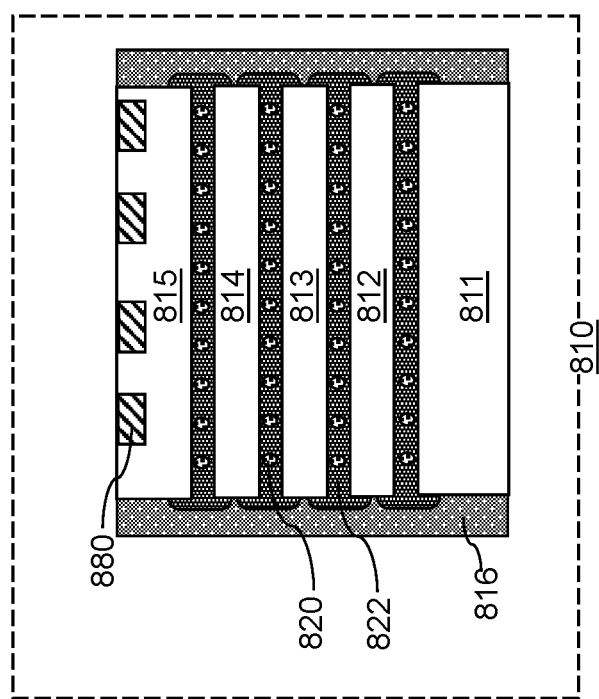
FIG. 3C is a magnified vertical cross-sectional view of a high bandwidth memory die.

Referring to FIG. 3C, a high bandwidth memory (HBM) die 810 is illustrated, which may be used as a memory die 800 within the first exemplary structures of FIGS. 3A and 3B. The HBM die 810 may include a vertical stack of static random access memory dies (811, 812, 813, 814, 815) that are interconnected to one another through microbumps 820 and are laterally surrounded by an epoxy molding material enclosure frame 816. The gaps between vertically neighboring pairs of the random access memory dies (811, 812, 813, 814, 815) may be filled with a HBM underfill material portions 822 that laterally surrounds a respective set of microbumps 820. The HBM die 810 may comprise an array of memory-die metal bonding structures 880 configured to be bonded to a subset of an array of redistribution-side bonding structures 938 within a unit area UA. The HBM die 810 may be configured to provide a high bandwidth as defined under JEDEC standards, i.e., standards defined by The JEDEC Solid State Technology Association.

Figure 4:
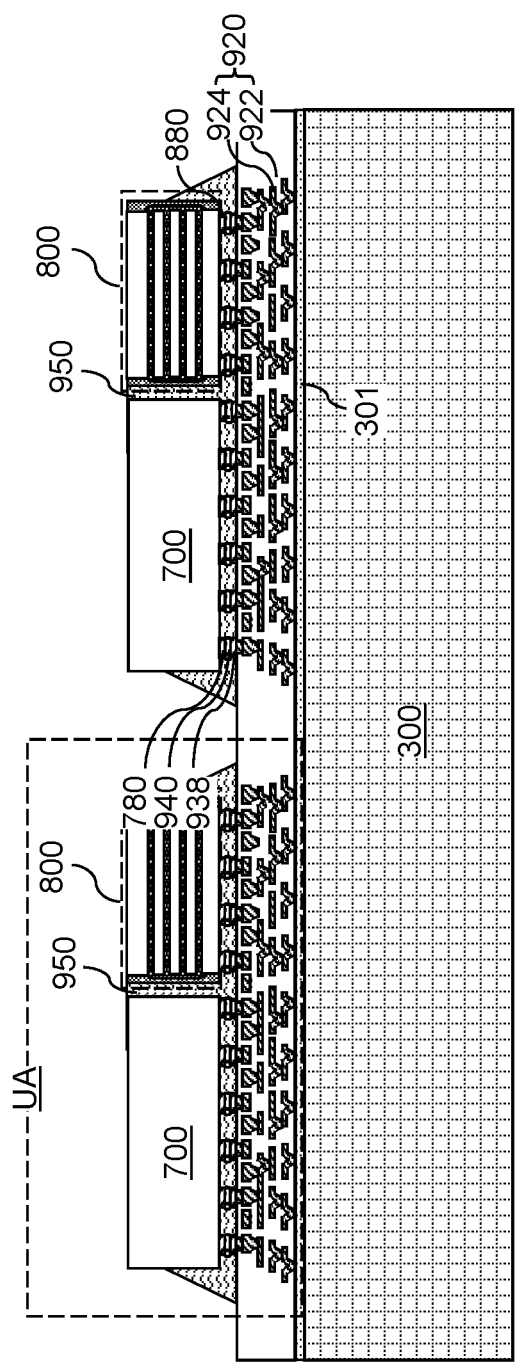
FIG. 4 is a vertical cross-sectional view of a region of the first exemplary structure after formation of die-side underfill material portions.

Referring to FIG. 4, a die-side underfill material may be applied into each gap between the interposers 920 and sets of at least one semiconductor die (700, 800) that are bonded to the interposers 920. The die-side underfill material may comprise any underfill material known in the art. A die-side underfill material portion 950 may be formed within each unit area UA between an interposer 920 and an overlying set of at least one semiconductor die (700, 800). The die-side underfill material portions 950 may be formed by injecting the die-side underfill material around a respective array of first solder material portions 940 in a respective unit area UA. Any known underfill material application method may be used, which may be, for example, the capillary underfill method, the molded underfill method, or the printed underfill method.

Within each unit area UA, a die-side underfill material portion 950 may laterally surround, and contact, each of the first solder material portions 940 within the unit area UA. The die-side underfill material portion 950 may be formed around, and contact, the first solder material portions 940, the redistribution-side bonding structures 938, and the die-side bonding structures (780, 880) in the unit area UA.

Each interposer 920 in a unit area UA comprises redistribution-side bonding structures 938. At least one semiconductor die (700, 800) comprising a respective set of die-side bonding structures (780, 880) is attached to the redistribution-side bonding structures 938 through a respective set of first solder material portions 940 within each unit area UA. Within each unit area UA, a die-side underfill material portion 950 laterally surrounds the redistribution-side bonding structures 938 and the die-side bonding structures (780, 880) of the at least one semiconductor die (700, 800).

Figure 5A:
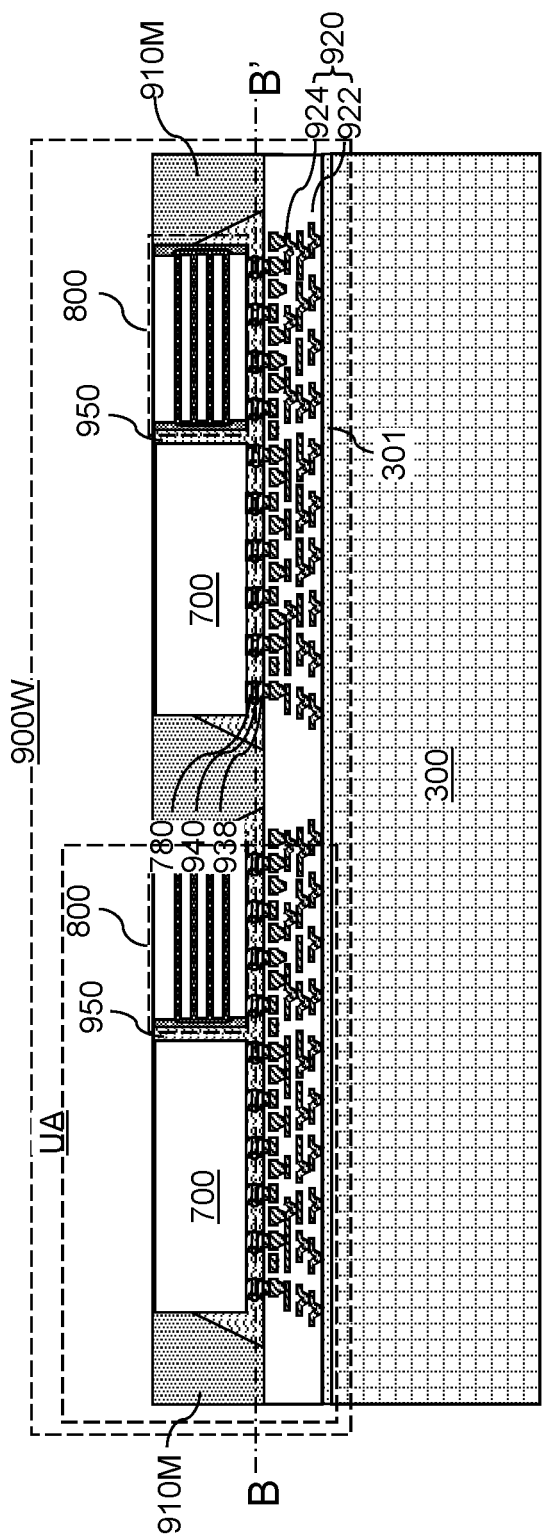
FIG. 5A is a vertical cross-sectional view of a region of the first exemplary structure after formation of an epoxy molding compound (EMC) matrix according to the first embodiment of the present disclosure.
Figure 5B:
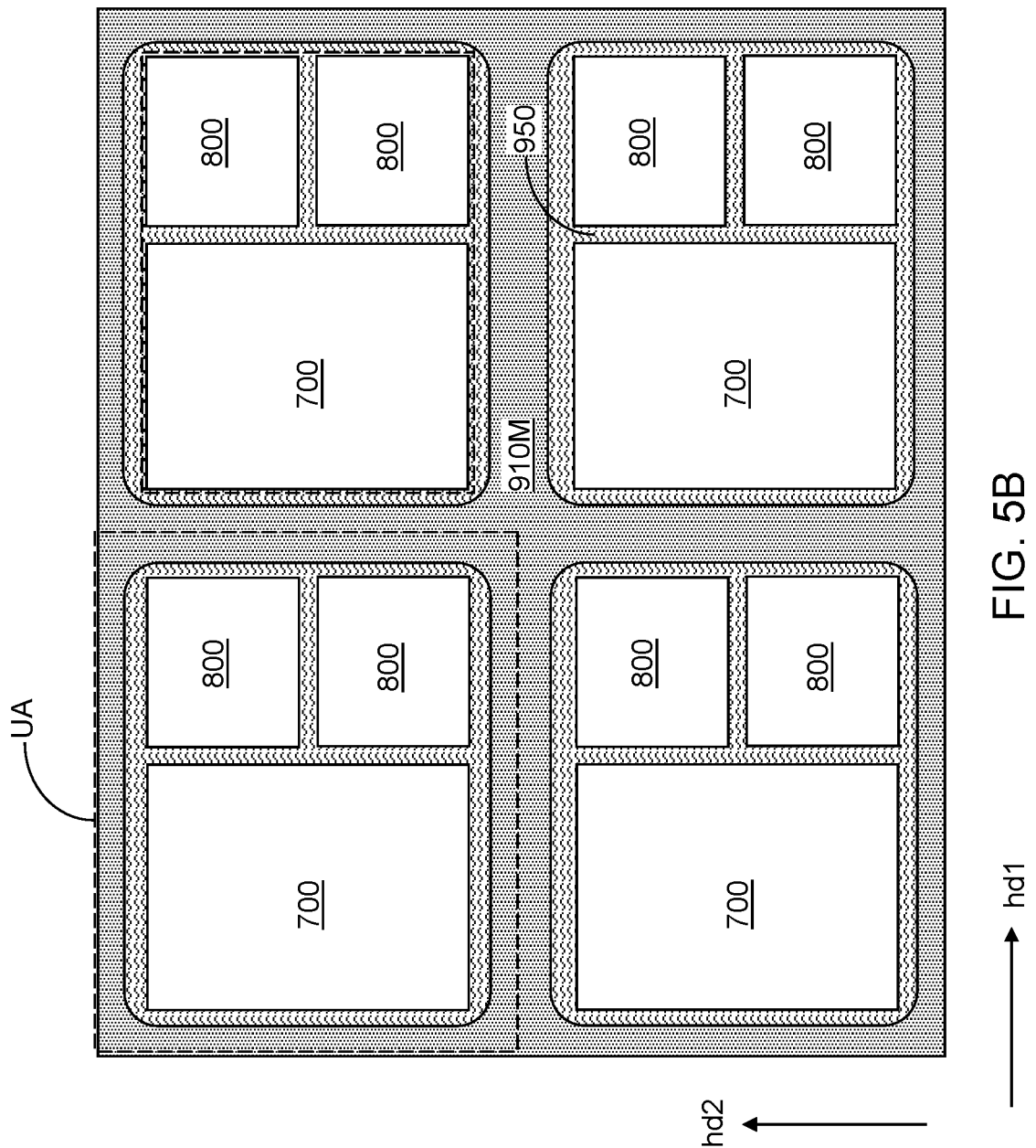
FIG. 5B is a top-down view of the region of the first exemplary structure of FIG. 5A.

Referring to FIGS. 5A and 5B, an epoxy molding compound (EMC) may be applied to the gaps between contiguous assemblies of a respective set of semiconductor dies (700, 800) and a die-side underfill material portion 950.

The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the first adhesive layer 301 in embodiments in which the adhesive layer includes a thermally debonding material. For example, the curing temperature of the EMC may be in a range from 125° C. to 150° C.

The EMC may be cured at a curing temperature to form an EMC matrix 910M that laterally surrounds and embeds each assembly of a set of semiconductor dies (700, 800) and a die-side underfill material portion 950. The EMC matrix 910M includes a plurality of epoxy molding compound (EMC) die frames that may be laterally adjoined to one another. Each EMC die frame is a portion of the EMC matrix 910M that is located within a respective unit area UA. Thus, each EMC die frame laterally surrounds and embeds a respective a set of semiconductor dies (700, 800) and a respective die-side underfill material portion 950. Young's modulus of pure epoxy is about 3.35 GPa, and Young's modulus of the EMC may be higher than Young's modulus of pure epoxy by adding additives. Young's modulus of EMC may be greater than 3.5 GPa.

Portions of the EMC matrix 910M that overlies the horizontal plane including the top surfaces of the semiconductor dies (700, 800) may be removed by a planarization process. For example, the portions of the EMC matrix 910M that overlies the horizontal plane may be removed using a chemical mechanical planarization (CMP). The combination of the remaining portion of the EMC matrix 910M, the semiconductor dies (700, 800), the die-side underfill material portions 950, and the two-dimensional array of interposers 920 comprises a reconstituted wafer 900W. Each portion of the EMC matrix 910M located within a unit area UA constitutes an EMC die frame.

Figure 6:
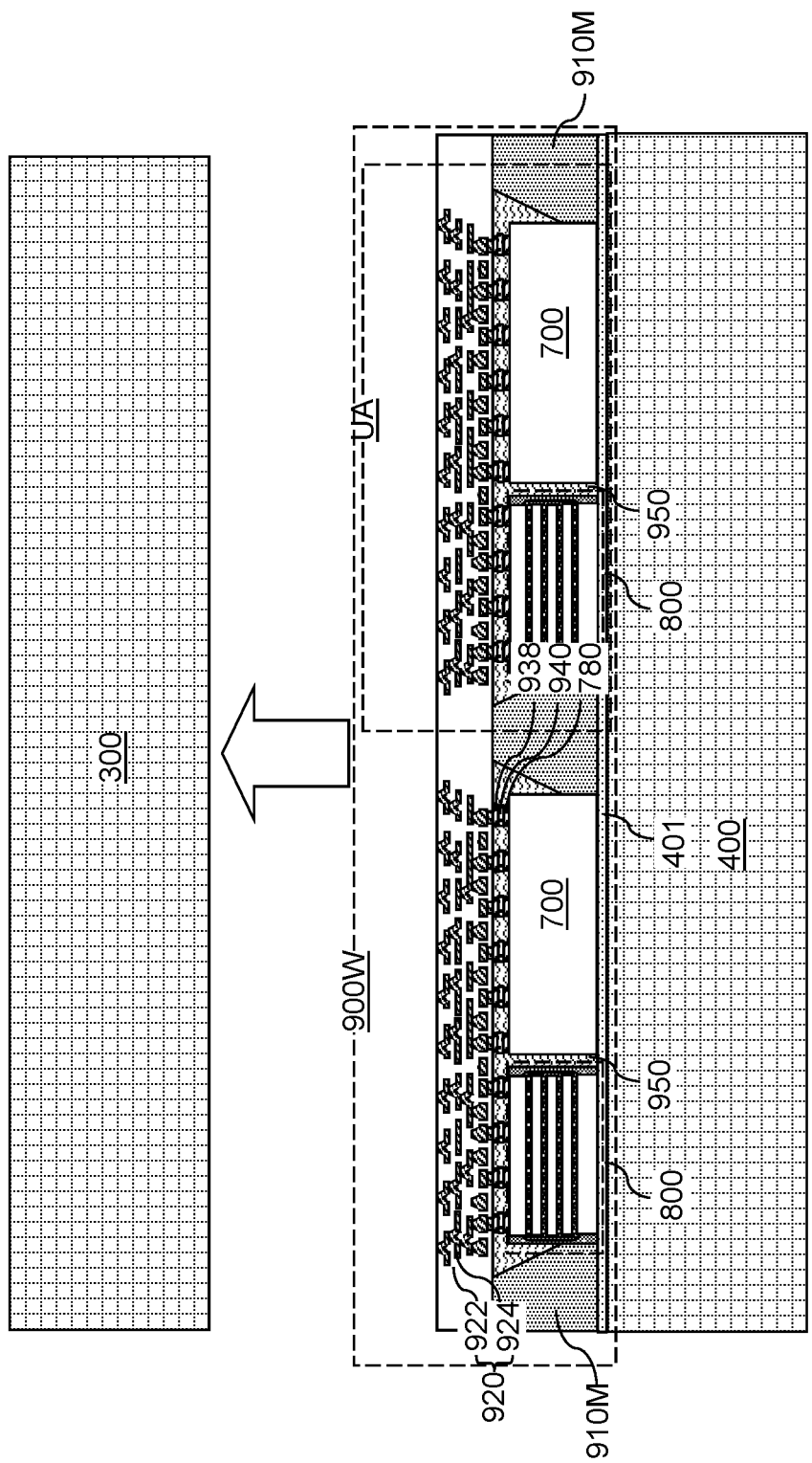
FIG. 6 is a vertical cross-sectional view of a region of the first exemplary structure after attaching a second carrier substrate and detaching the first carrier substrate according to the first embodiment of the present disclosure.

Referring to FIG. 6, a second adhesive layer 401 may be applied to the physically exposed planar surface of the reconstituted wafer 900W, i.e., the physically exposed surfaces of the EMC matrix 910M, the semiconductor dies (700, 800), and the die-side underfill material portions 950. In one embodiment, the second adhesive layer 401 may comprise a same material as, or may comprise a different material from, the material of the first adhesive layer 301. In embodiments in which the first adhesive layer 301 comprises a thermally decomposing adhesive material, the second adhesive layer 401 may comprise another thermally decomposing adhesive material that decomposes at a higher temperature, or may comprise a light-to-heat conversion material.

A second carrier substrate 400 may be attached to the second adhesive layer 401. The second carrier substrate 400 may be attached to the opposite side of the reconstituted wafer 900W relative to the first carrier substrate 300. Generally, the second carrier substrate 400 may comprise any material that may be used for the first carrier substrate 300. The thickness of the second carrier substrate 400 may be in a range from 500 microns to 2,000 microns, although lesser and greater thicknesses may also be used.

The first adhesive layer 301 may be decomposed by ultraviolet radiation or by a thermal anneal at a debonding temperature. In embodiments in which the first carrier substrate 300 includes an optically transparent material and the first adhesive layer 301 includes an LTHC layer, the first adhesive layer 301 may be decomposed by irradiating ultraviolet light through the transparent carrier substrate. The LTHC layer may be absorb the ultraviolet radiation and generate heat, which decomposes the material of the LTHC layer and cause the transparent first carrier substrate 300 to be detached from the reconstituted wafer 900W. In embodiments in which the first adhesive layer 301 includes a thermally decomposing adhesive material, a thermal anneal process at a debonding temperature may be performed to detach the first carrier substrate 300 from the reconstituted wafer 900W.

Figure 7:
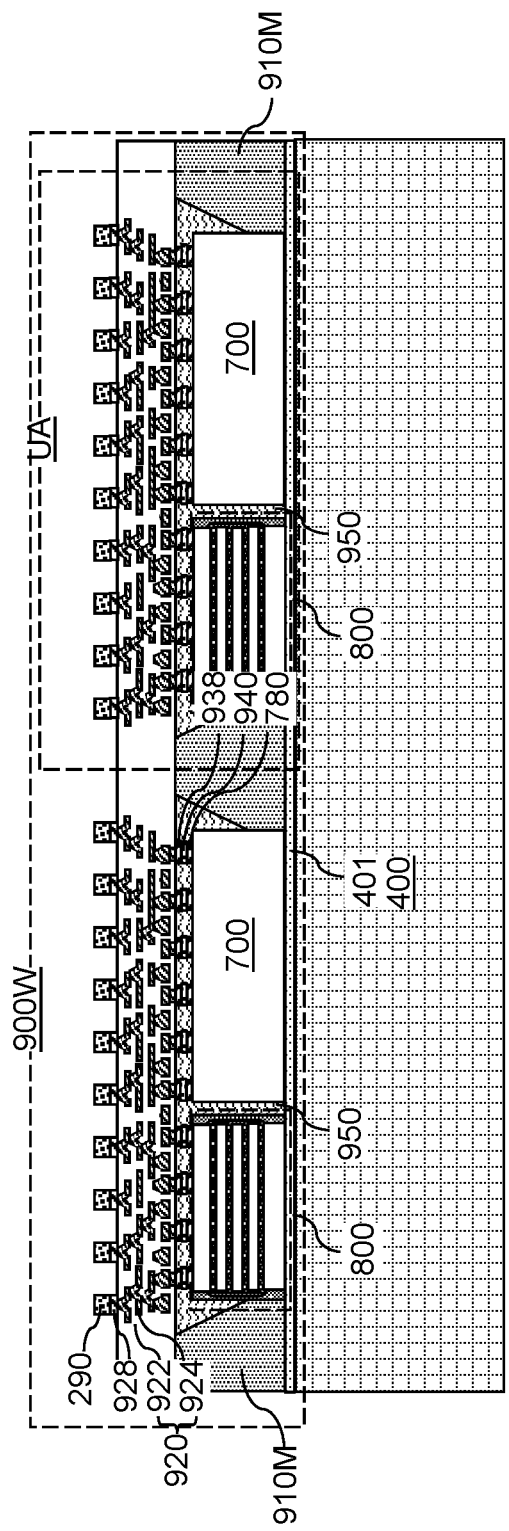
FIG. 7 is a vertical cross-sectional view of a region of the first exemplary structure after formation of interposer bonding pads according to the first embodiment of the present disclosure.

Referring to FIG. 7, interposer bonding pads 928 and second solder material portions 290 may be formed by depositing and patterning a stack of at least one metallic material that may function as metallic bumps and a solder material layer. The metallic fill material for the interposer bonding pads 928 may include copper. Other suitable materials are within the contemplated scope of disclosure. The thickness of the interposer bonding pads 928 may be in a range from 5 microns to 100 microns, although lesser or greater thicknesses may also be used. The interposer bonding pads 928 and the second solder material portions 290 may have horizontal cross-sectional shapes of rectangles, rounded rectangles, or circles. Other suitable shapes are within the contemplated scope of disclosure. In embodiments in which the interposer bonding pads 928 are formed as C4 (controlled collapse chip connection) pads, the thickness of the interposer bonding pads 928 may be in a range from 5 microns to 50 microns, although lesser or greater thicknesses may also be used. In some embodiments, the interposer bonding pads 928 may be, or include, underbump metallization (UBM) structures. The configurations of the interposer bonding pads 928 are not limited to be fan-out structures. Alternatively, the interposer bonding pads 928 may be configured for microbump bonding (i.e., C2 bonding), and may have a thickness in a range from 30 microns to 100 microns, although lesser or greater thicknesses may also be used. In such an embodiment, the interposer bonding pads 928 may be formed as an array of microbumps (such as copper pillars) having a lateral dimension in a range from 10 microns to 25 microns, and having a pitch in a range from 20 microns to 50 microns.

The interposer bonding pads 928 and the second solder material portions 290 may be formed on the opposite side of the EMC matrix 910M and the two-dimensional array of sets of semiconductor dies (700, 800) relative to the interposer layer. The interposer layer includes a three-dimensional array of interposers 920. Each interposer 920 may be located within a respective unit area UA. Each interposer 920 may include redistribution dielectric layers 922, redistribution wiring interconnects 924 embedded in the redistribution dielectric layers 922, and interposer bonding pads 928. The interposer bonding pads 928 may be located on an opposite side of the redistribution-side bonding structures 938 relative to the redistribution dielectric layers 922, and may be electrically connected to a respective one of the redistribution-side bonding structures 938.

Figure 8:
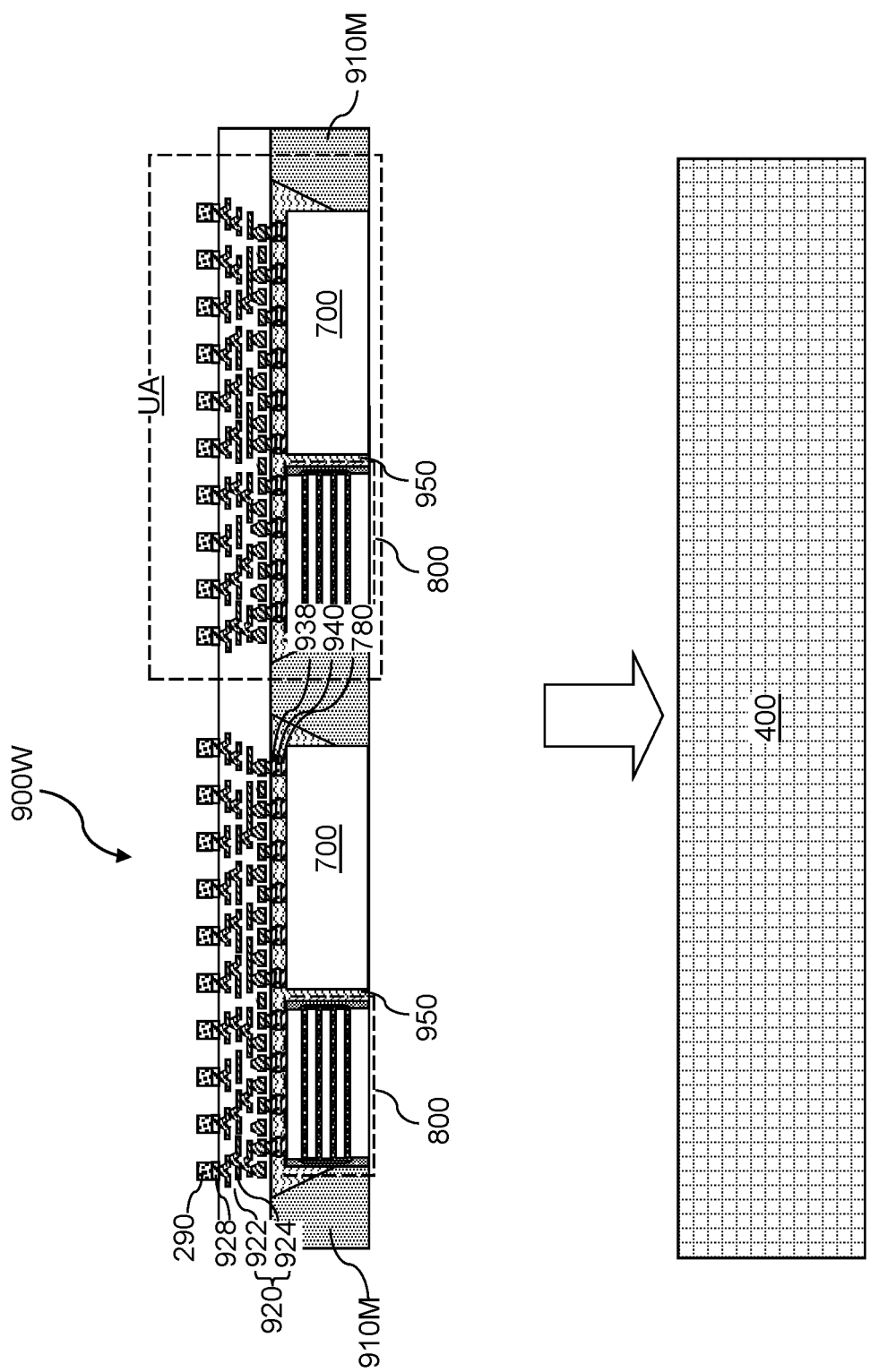
FIG. 8 is a vertical cross-sectional view of a region of the first exemplary structure after detaching the second carrier substrate according to the first embodiment of the present disclosure.

Referring to FIG. 8, the second adhesive layer 401 may be decomposed by ultraviolet radiation or by a thermal anneal at a debonding temperature. In embodiments in which the second carrier substrate 400 includes an optically transparent material and the second adhesive layer 401 includes an LTHC layer, the second adhesive layer 401 may be decomposed by irradiating ultraviolet light through the transparent carrier substrate. In embodiments in which the second adhesive layer 401 includes a thermally decomposing adhesive material, a thermal anneal process at a debonding temperature may be performed to detach the second carrier substrate 400 from the reconstituted wafer 900W.

Figure 9:
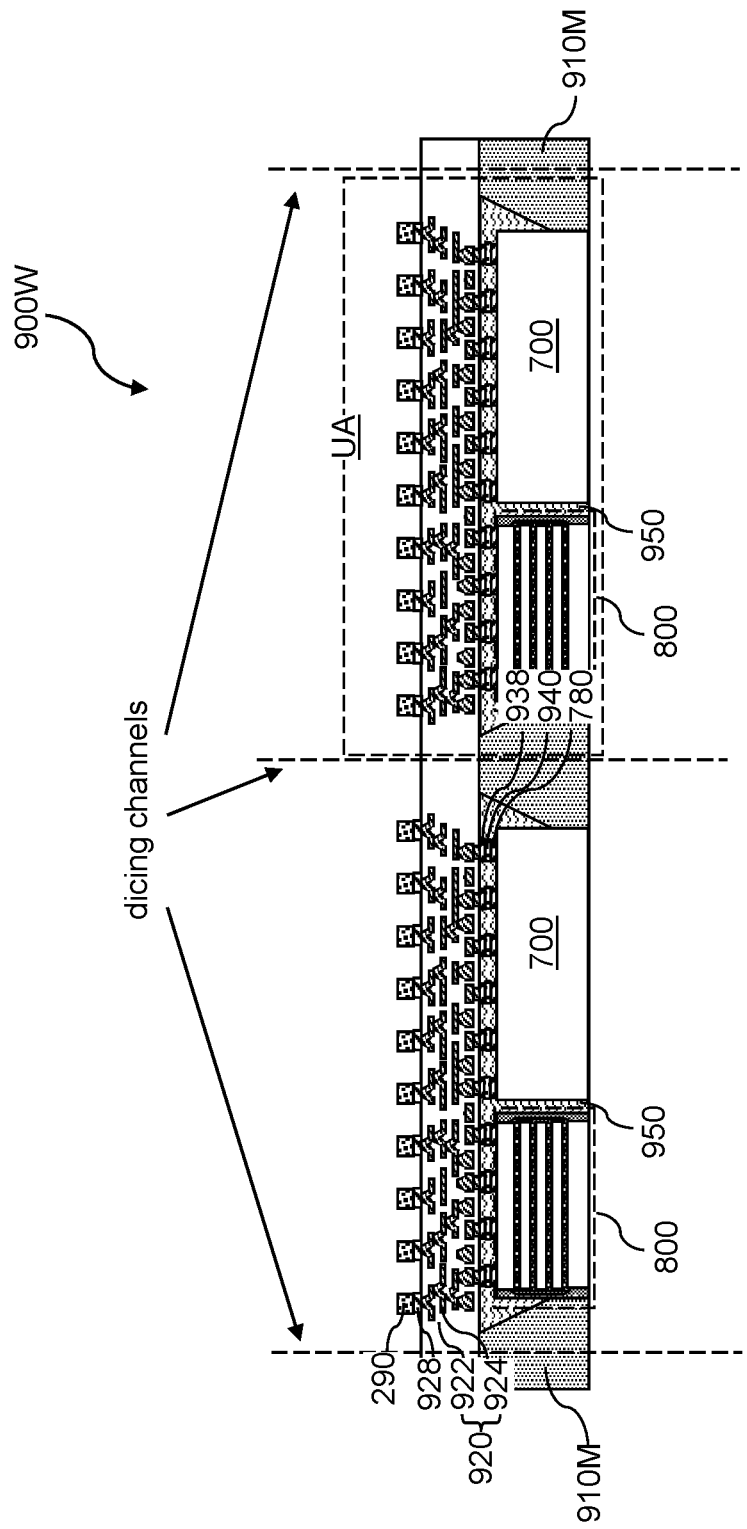
FIG. 9 is a vertical cross-sectional view of a region of the first exemplary structure during dicing of a redistribution substrate and the EMC matrix according to the first embodiment of the present disclosure.

Referring to FIG. 9, the reconstituted wafer 900W including the interposer bonding pads 928 may be subsequently diced along dicing channels by performing a dicing process. The dicing channels correspond to the boundaries between neighboring pairs of die areas DA. Each diced unit from the reconstituted wafer 900W may include a fan-out package 900. In other words, each diced portion of the assembly of the two-dimensional array of sets of semiconductor dies (700, 800), the two-dimensional array of die-side underfill material portions 950, the EMC matrix 910M, and the two-dimensional array of interposers 920 constitutes a fan-out package 900. Each diced portion of the EMC matrix 910M constitutes a molding compound die frame 910. Each diced portion of the interposer layer (which includes the two-dimensional array of interposers 920) constitutes an interposer 920.

Figure 10A:
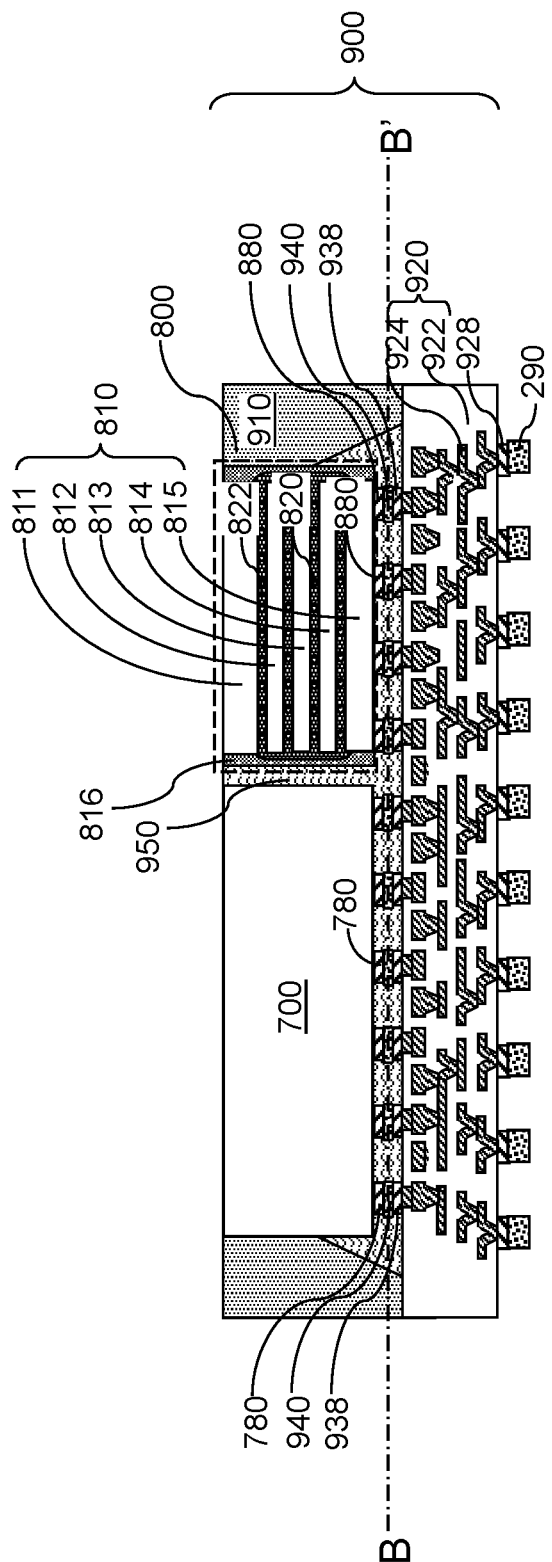
FIG. 10A is a vertical cross-sectional view of a fan-out package according to the first embodiment of the present disclosure.
Figure 10B:
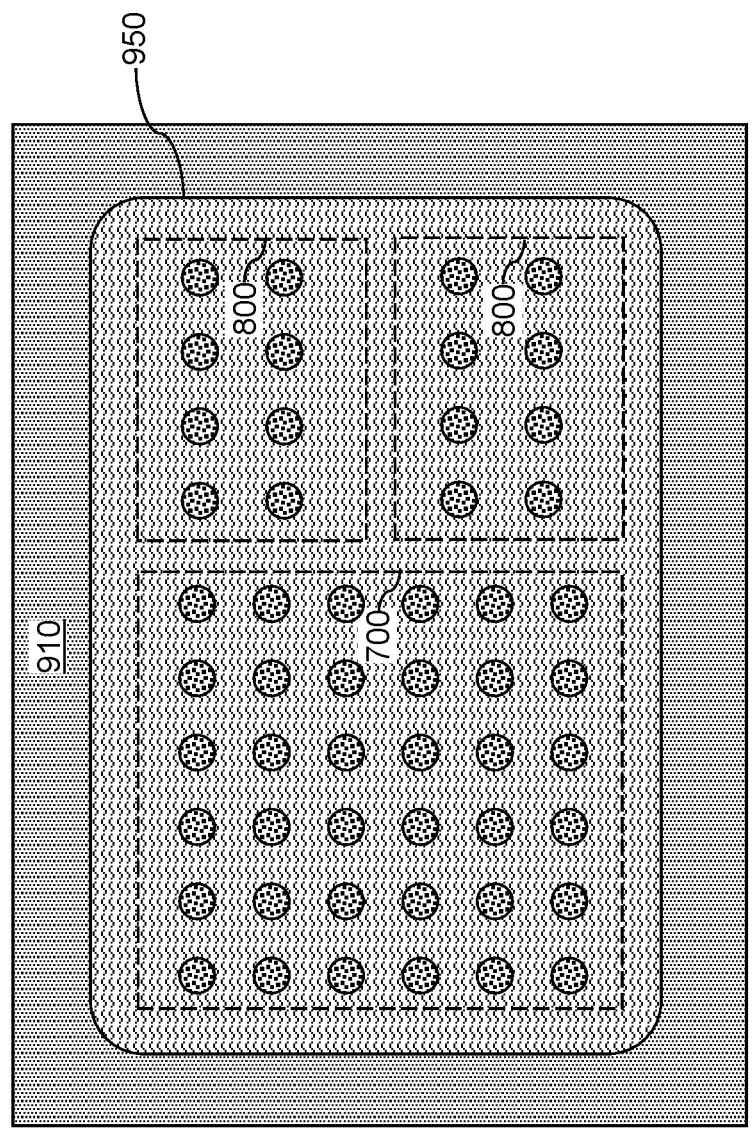
FIG. 10B is a horizontal cross-sectional view of the fan-out package along the horizontal plane B-B' of FIG. 10A.

Referring to FIGS. 10A and 10B, a fan-out package 900 obtained by dicing the first exemplary structure at the processing steps of FIG. 10 is illustrated. The fan-out package 900 comprises an interposer 920 including redistribution-side bonding structures 938, at least one semiconductor die (700, 800) comprising a respective set of die-side bonding structures (780, 880) that is attached to the redistribution-side bonding structures 938 through a respective set of first solder material portions 940, a die-side underfill material portion 950 laterally surrounding the redistribution-side bonding structures 938 and the die-side bonding structures (780, 880) of the at least one semiconductor die (700, 800).

The fan-out package 900 may comprise a molding compound die frame 910 laterally surrounding the at least one semiconductor die (700, 800) and comprising a molding compound material. In one embodiment, the molding compound die frame 910 may include sidewalls that are vertically coincident with sidewalls of the interposer 920, i.e., located within same vertical planes as the sidewalls of the interposer 920. Generally, the molding compound die frame 910 may be formed around the at least one semiconductor die (700, 800) after formation of the die-side underfill material portion 950 within each fan-out package 900. The molding compound material contacts a peripheral portion of a planar surface of the interposer 920.

Generally an assembly including at least one semiconductor die (700, 800) and an interposer 920 is provided. The assembly may be in a form of a package, i.e., a semiconductor package. In one embodiment, the assembly may comprise a fin-out package including at least one semiconductor die (700, 800), an interposer 920 attached to the at least one semiconductor die (700, 800), and a die-side underfill material portion 950 located between the at least one semiconductor die (700, 800) and the interposer 920.

Figure 11A:
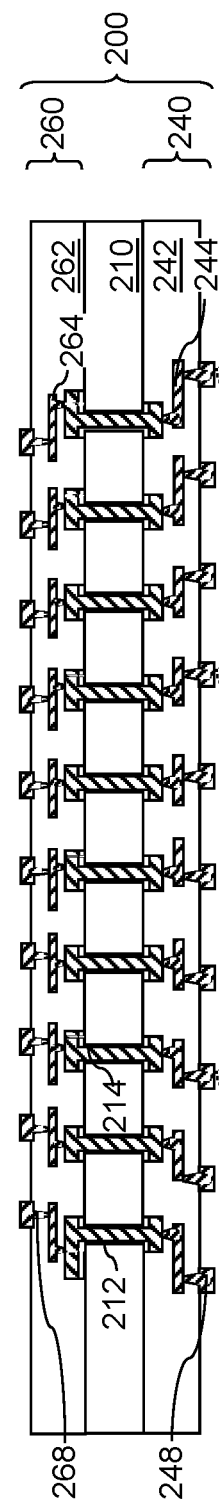
FIG. 11A is a vertical cross-sectional view of a packaging substrate according to the first embodiment of the present disclosure.
Figure 11B:
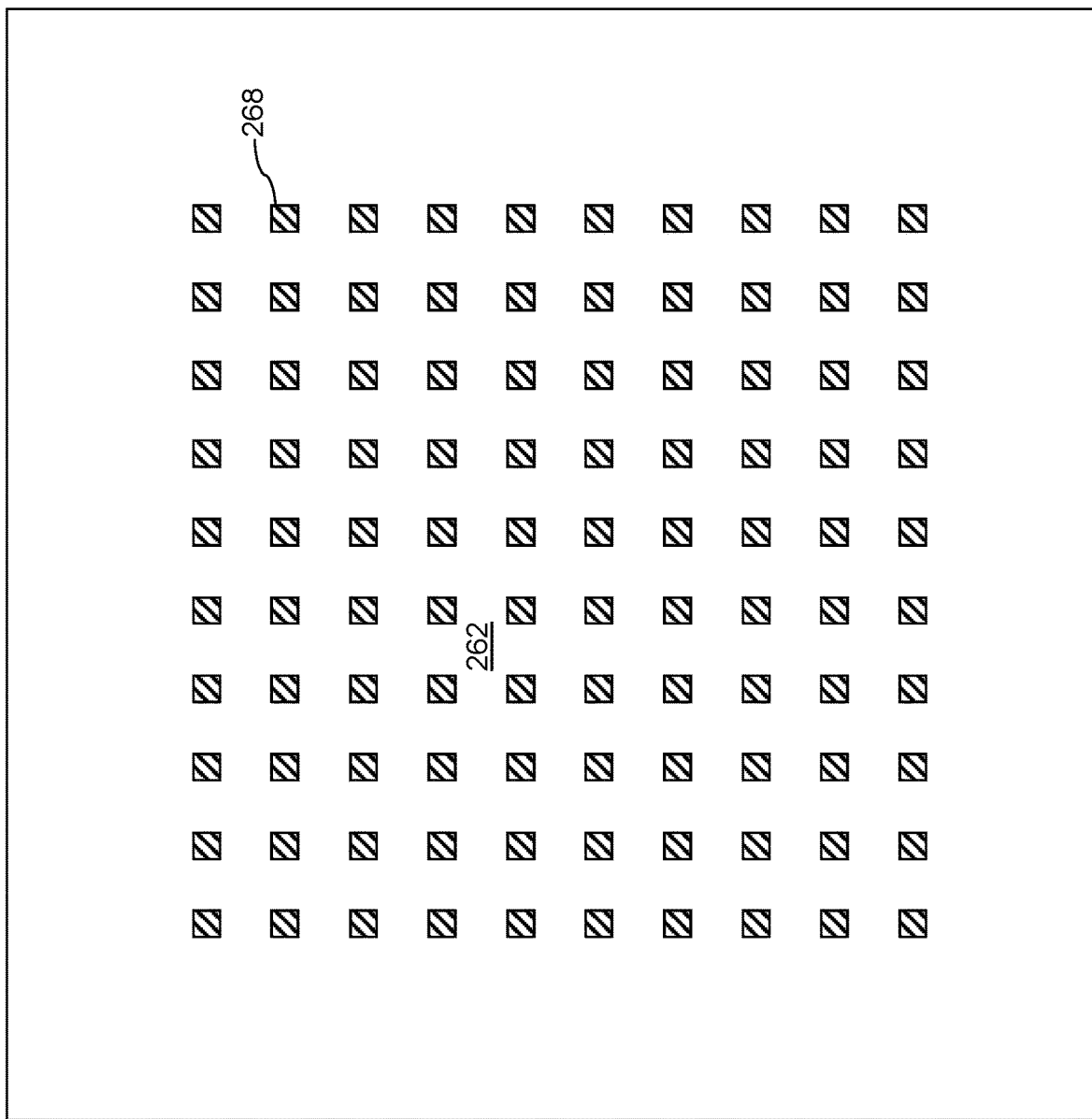
FIG. 11B is a top-down view of the packaging substrate of FIG. 11A.

Referring to FIGS. 11A and 11B, a packaging substrate 200 is provided. The packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layers and/or dielectric interlayers, at least one embedded interposer (such as a silicon interposer). Such a system-integrated packaging substrate may include layer-to-layer interconnections using solder material portions, microbumps, underfill material portions (such as molded underfill material portions), and/or an adhesion film. While the present disclosure is described using an exemplary substrate package, it is understood that the scope of the present disclosure is not limited by any particular type of substrate package and may include an SoIS. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the packaging substrate 200 includes a chip-side surface laminar circuit 260 comprising chip-side wiring interconnects 264 connected to an array of substrate bonding pads 268 that may be bonded to the array of second solder material portions 290, and a board-side surface laminar circuit 240 including board-side wiring interconnects 244 connected to an array of board-side bonding pads 248. The array of board-side bonding pads 248 is configured to allow bonding through solder balls. The array of substrate bonding pads 268 may be configured to allow bonding through C4 solder balls. Generally, any type of packaging substrate 200 may be used. While the present disclosure is described using an embodiment in which the packaging substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

Figure 12:
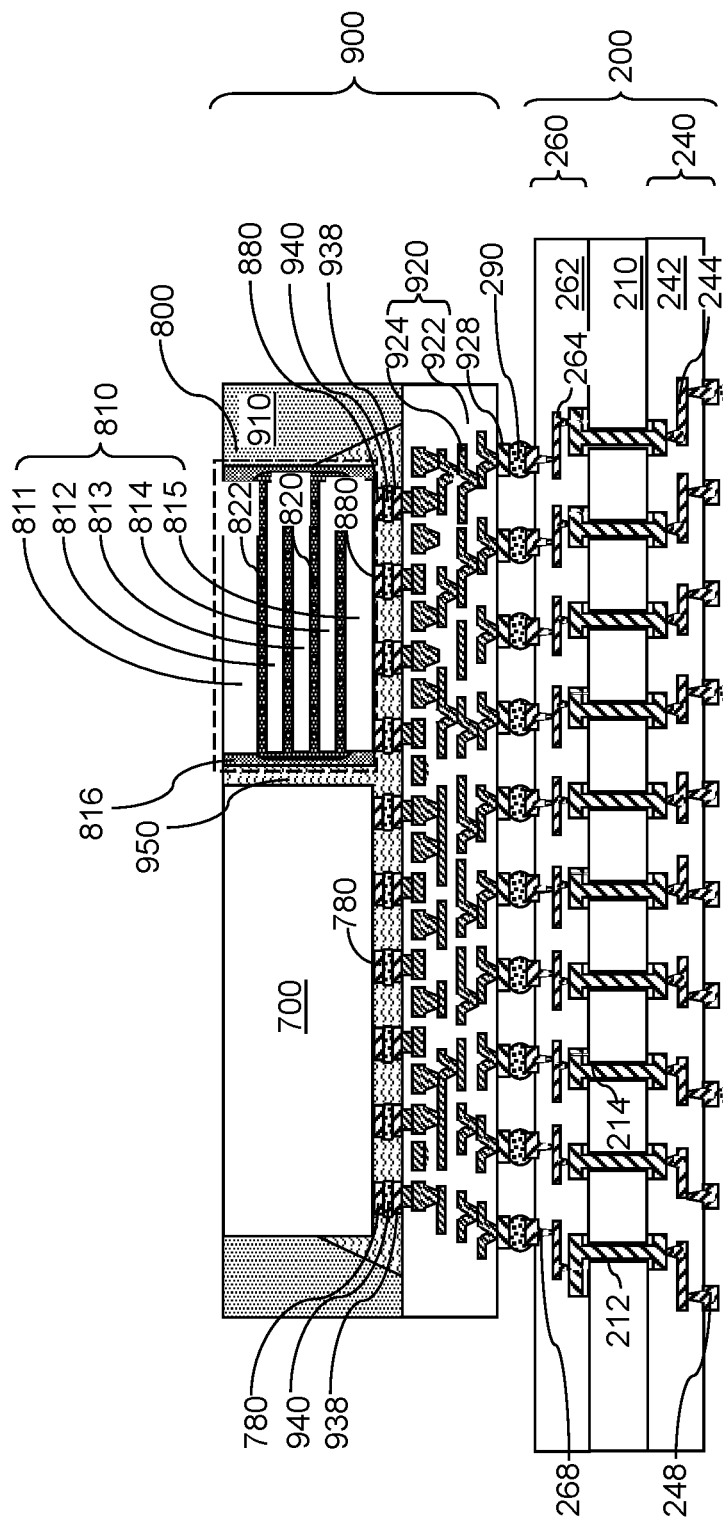
FIG. 12 is a vertical cross-sectional view of a first exemplary structure after attaching the fan-out package to the packaging substrate according to the first embodiment of the present disclosure.

Referring to FIG. 12, the fan-out package 900 may be disposed over the packaging substrate 200 with an array of the second solder material portions 290 therebetween. In embodiments in which the second solder material portions 290 are formed on the interposer bonding pads 928 of the fan-out package 900, the second solder material portions 290 may be disposed on the substrate bonding pads 268 of the packaging substrate 200. A reflow process may be performed to reflow the second solder material portions 290, thereby inducing bonding between the fan-out package 900 and the packaging substrate 200. Each second solder material portion 290 may be bonded to a respective one of the interposer bonding pads 928 and to a respective one of the substrate bonding pads 268. In one embodiment, the second solder material portions 290 may include C4 solder balls, and the fan-out package 900 may be attached to the packaging substrate 200 through an array of C4 solder balls. Generally, the fan-out package 900 may be bonded to the packaging substrate 200 such that the interposer 920 is bonded to the packaging substrate 200 by an array of solder material portions (such as the second solder material portions 290).

Figure 13A:
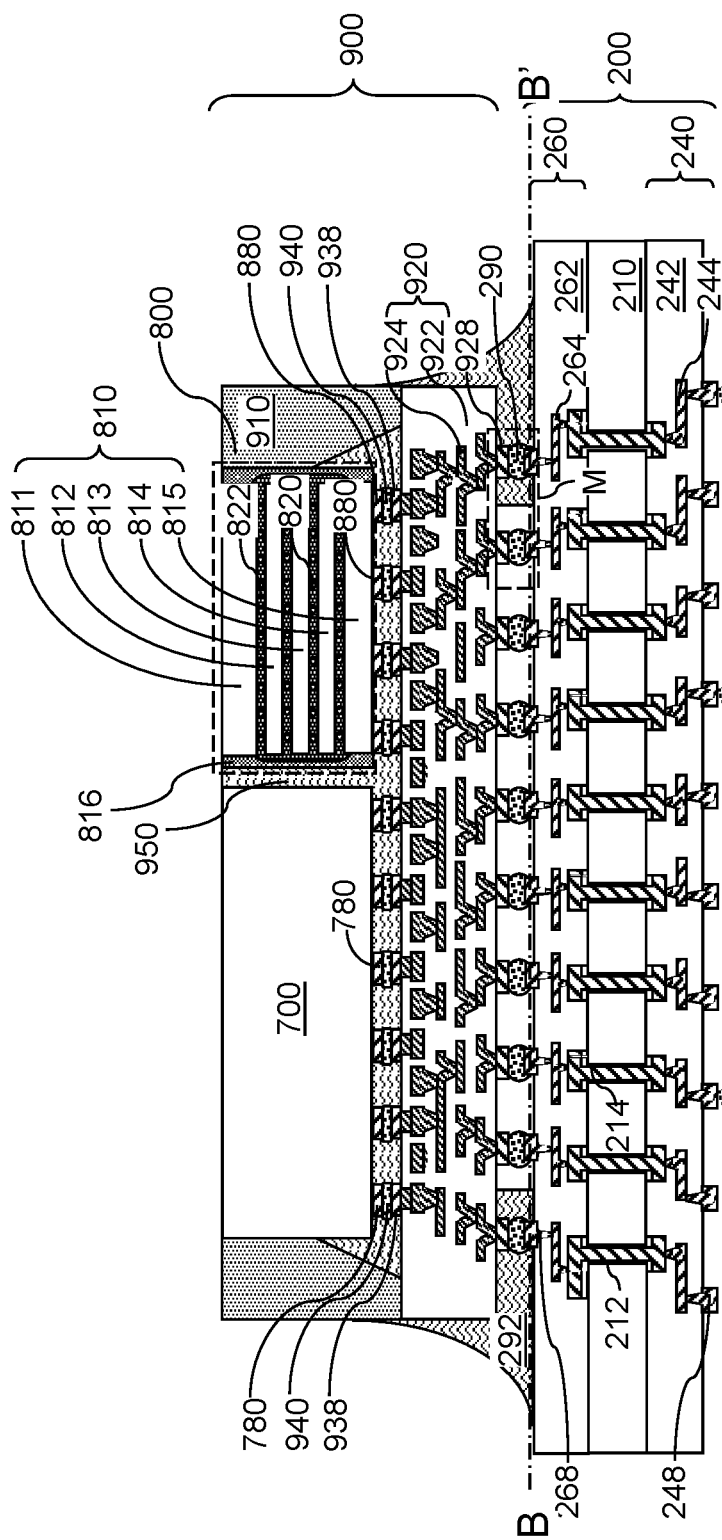
FIG. 13A is a vertical cross-sectional view of the first exemplary structure after formation of peripheral underfill material portions according to the first embodiment of the present disclosure.
Figure 13B:
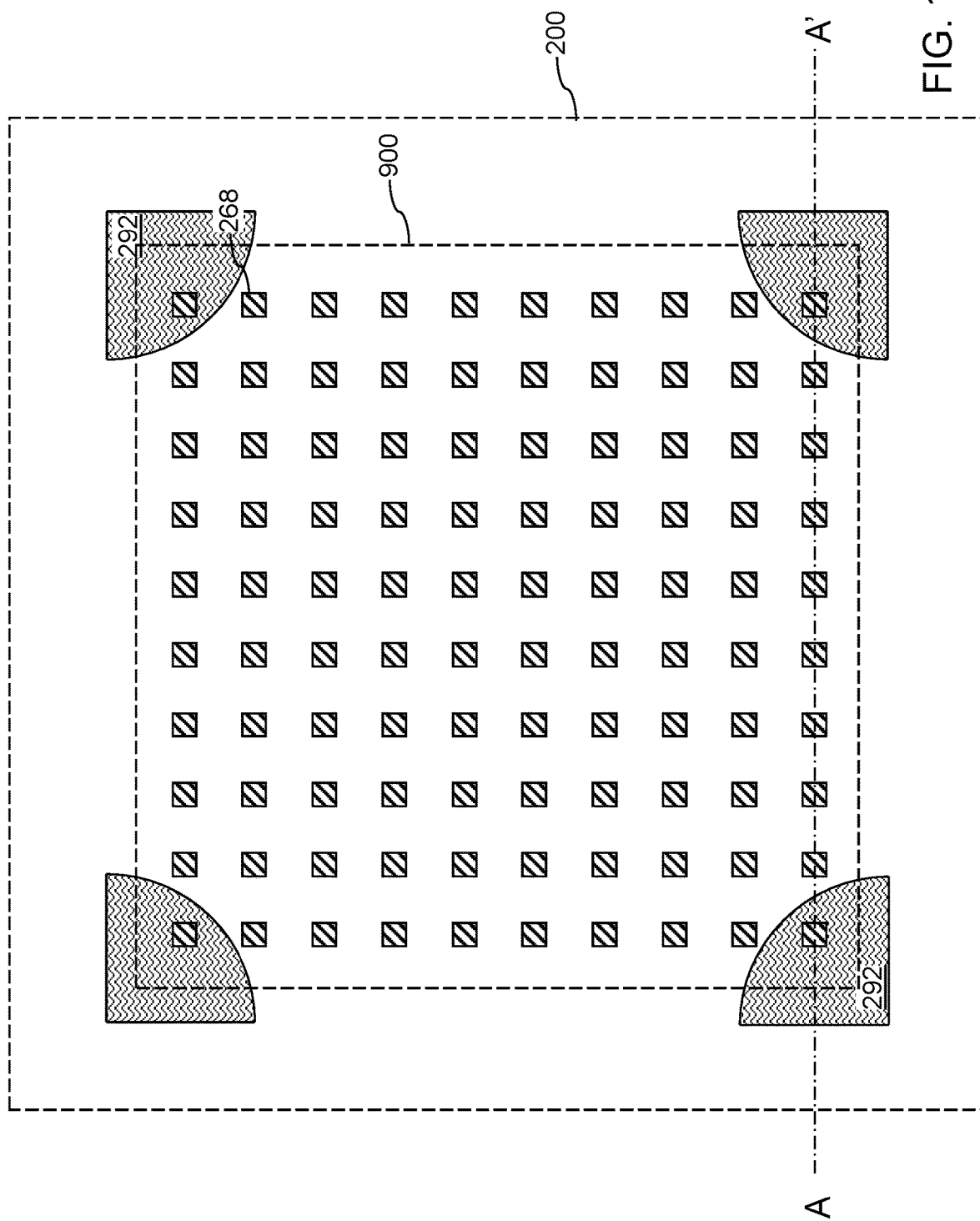
FIG. 13B is a horizontal cross-sectional view of the first exemplary structure along the horizontal plane B-B' of FIG. 13A.

Referring to FIGS. 13A and 13B, an underfill material is applied to corners regions of the gap between the fan-out package 900 and the packaging substrate 200, i.e., to corner regions of the gap between the interposer 920 and the packaging substrate 200. The underfill material is herein referred to as a peripheral underfill material (and alternatively, as a second underfill material). The applied and deposited portions of the peripheral underfill material are herein referred to as peripheral underfill material portions 292 (or alternatively, as second underfill material portions). Generally, at least one peripheral underfill material portion 292 may be formed at corner regions of the interposer 920. The at least one peripheral underfill material portion 292 may contact corner regions of the interposer 920. A first surface segment of a horizontal surface of the interposer 920 facing the gap is physically exposed. The first surface segment may include a predominant portion of the horizontal surface of the interposer 920 that faces the packaging substrate 200. In one embodiment, the first surface segment includes a center region of the horizontal surface of the interposer 920 that faces the packaging substrate 200, and may extend to center portions of four sides of a rectangular periphery of the horizontal surface. The fraction of the area of the first surface segment relative to the total area of the horizontal surface of the interposer 920 that faces the packaging substrate 200 may be in a range from 50% to 99%, such as from 70% to 95%.

The peripheral underfill material may include a filler material (which is herein referred to as a peripheral filler material or as a second filler material), or may be free of a filler material. Generally, the volume fraction of the filler material in the peripheral underfill material is selected such that peripheral underfill material has a lower Young's modules than a central underfill material to be subsequently used. In one embodiment, the peripheral underfill material may comprise a peripheral filler material at a volume fraction in a range from 0.01% to 80% and a resin (which is herein referred to as a peripheral resin or a second resin) at a volume fraction in a range from 20% to 99.9%. Alternatively, the peripheral underfill material portion may be free of any filler material.

In one embodiment, each of the at least one peripheral underfill material portion 292 may contact a respective set of at least one solder material portion within a subset of the second solder material portions 290. The subset of the solder material portions is herein referred to as a second subset of the second solder material portions 290. The second subset of the second solder material portions 290 may comprise four second solder material portions 290 located at the four corners of the array of second solder material portions 290, and may comprise additional second solder material portions 290 that are proximal to the four corners of the array of second solder material portions 290.

In one embodiment, each of the at least one peripheral underfill material portion 292 may be formed directly on a respective horizontal surface segment of the packaging substrate 200 and directly on at least one corner segment of a horizontal surface of the interposer 920. The at least one peripheral underfill material portion 292 contacts a subset of the interposer bonding pads 928 and a subset of the substrate bonding pads 268. In the configuration illustrated in FIGS. 13A and 13B, the at least one peripheral underfill material portion 292 comprises four discrete peripheral underfill material portions 292 located at four corners of the interposer 920 and spaced from one another.

Figure 13C:
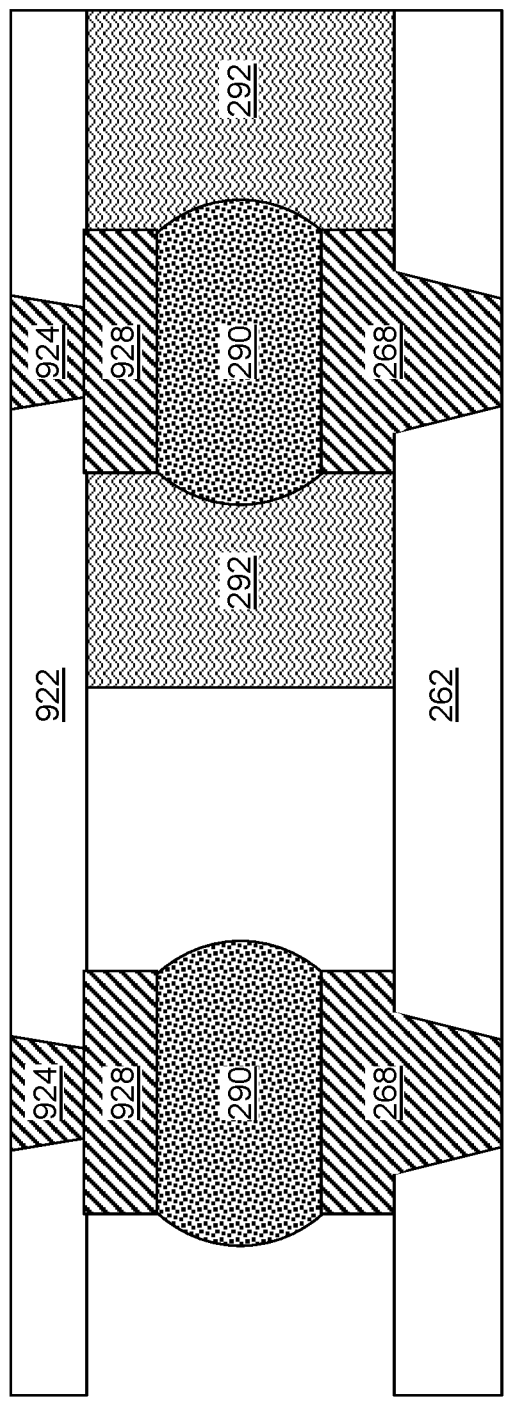
FIGS. 13C, 13D, and 13E are vertical cross-sectional views of various configurations of a region M of the exemplary structure of FIG. 13A.
Figure 13D:
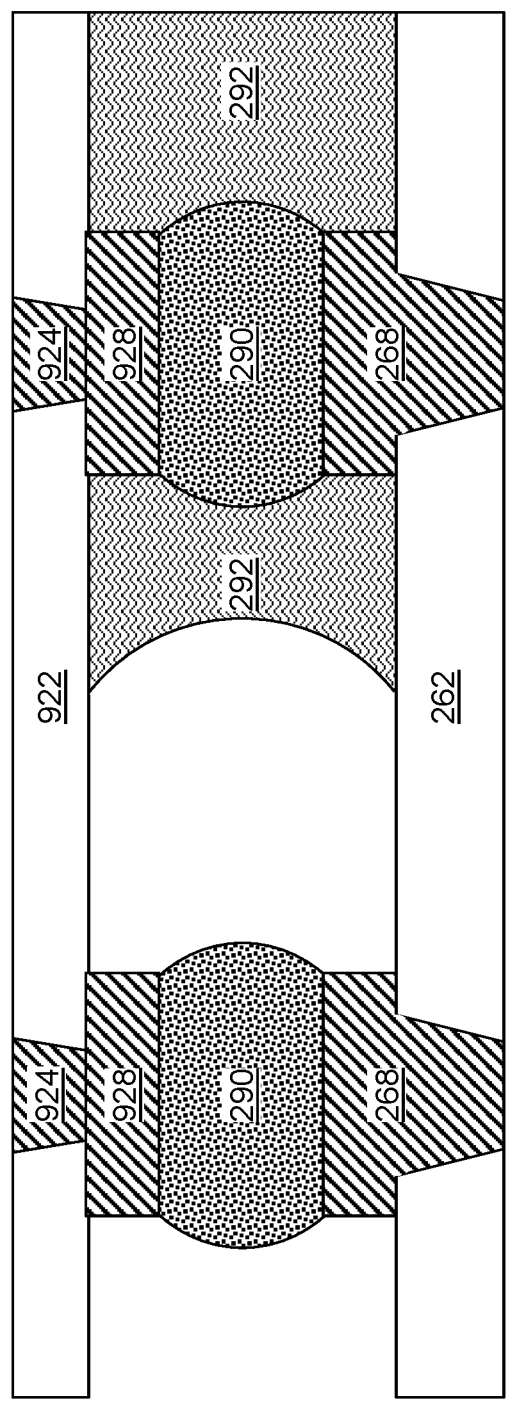
Figure 13E:
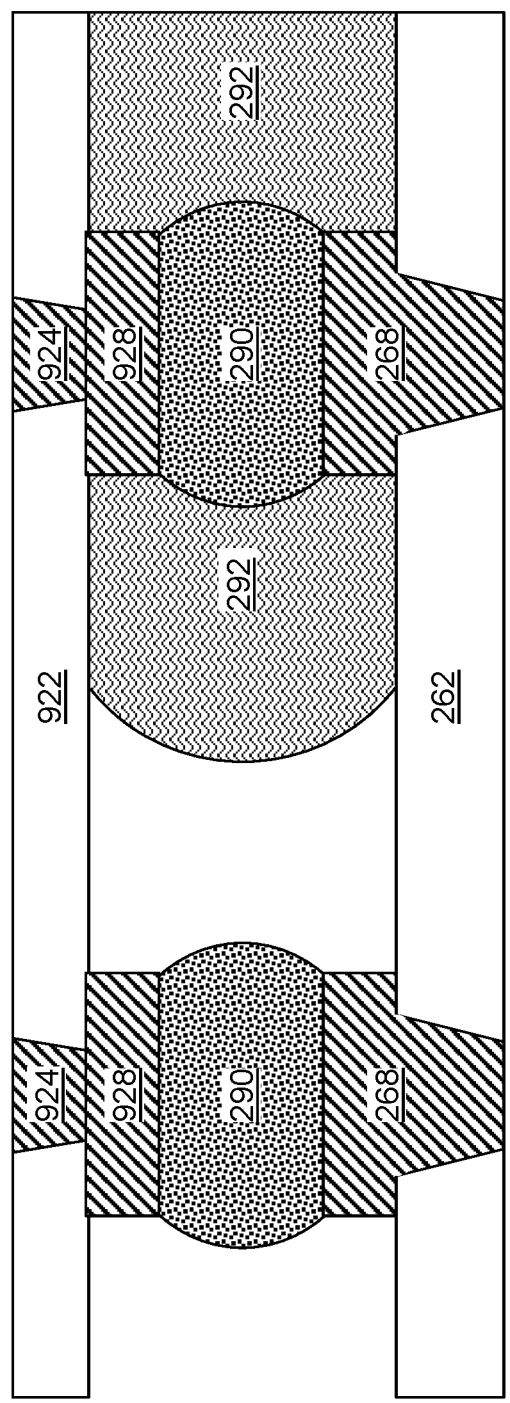

FIGS. 13C, 13D, and 13E are vertical cross-sectional views of various configurations of a region M of the exemplary structure of FIG. 13A. The vertical cross-sectional profile of physically exposed surfaces of the peripheral underfill material portions 292 underlying the fan-out package 900 may be vertical, convex, or concave depending on the viscosity of the material of the peripheral underfill material portions 292 and depending on the degree to which the peripheral underfill material portions 292 are cured.

Figure 14A:
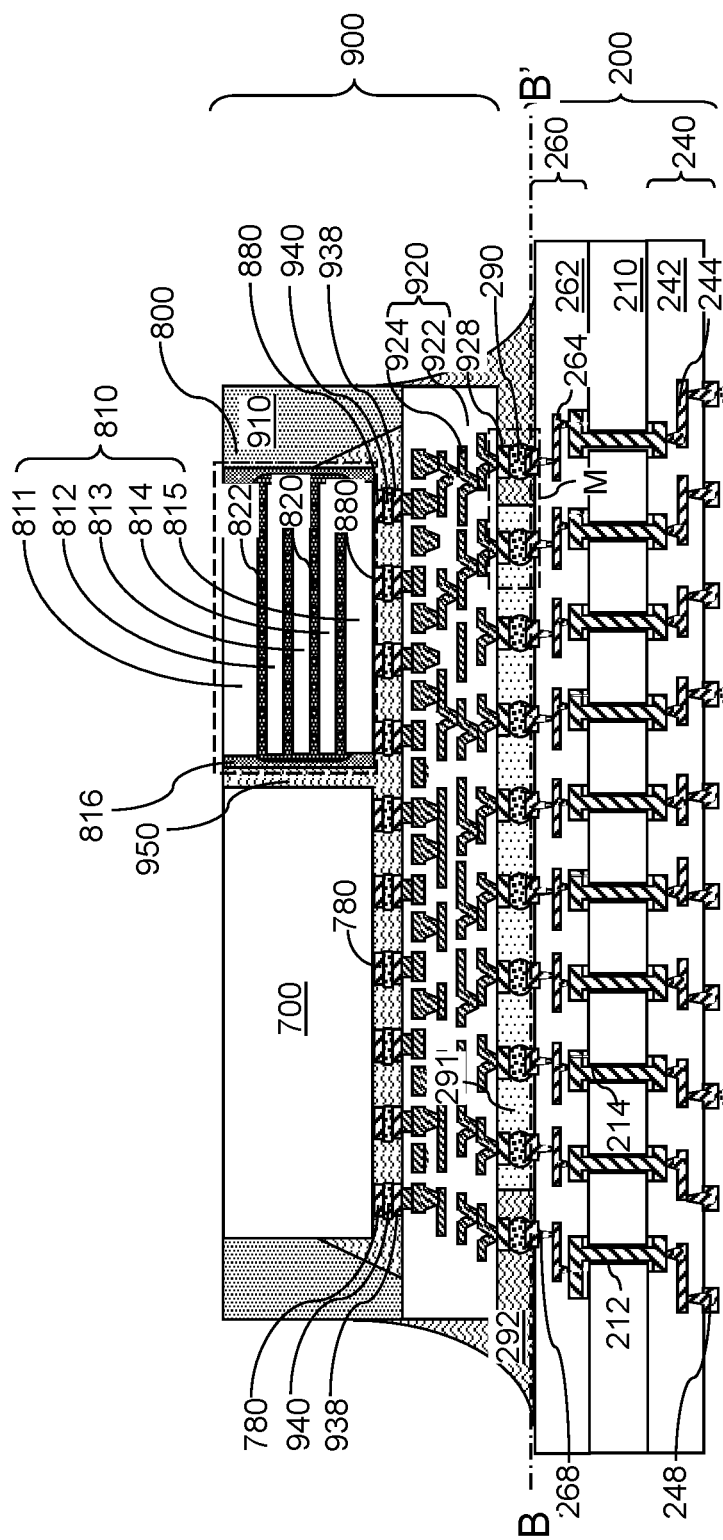
FIG. 14A is a vertical cross-sectional view of the first exemplary structure after formation of a central underfill material portion according to the first embodiment of the present disclosure.
Figure 14B:
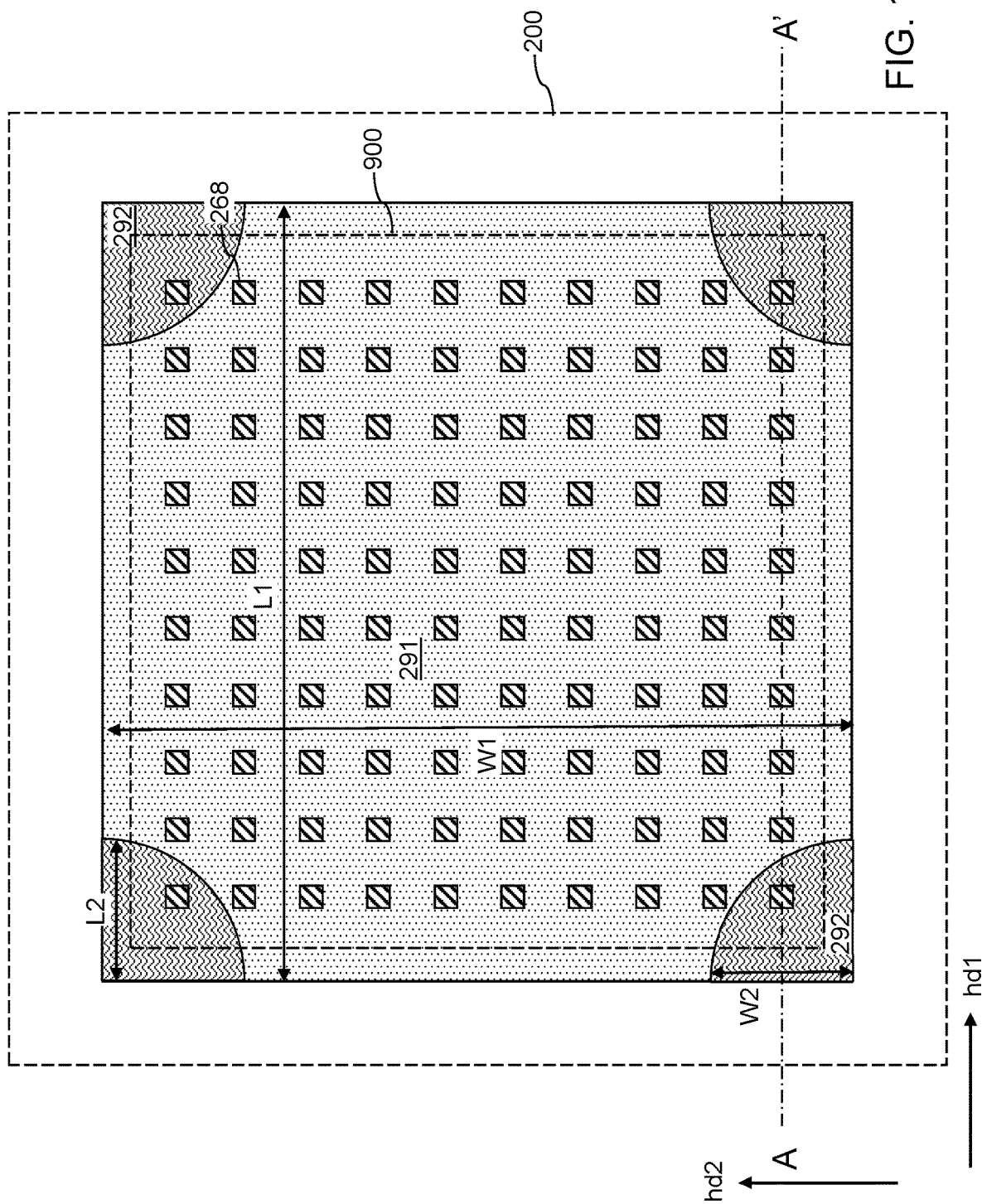
FIG. 14B is a horizontal cross-sectional view of the first exemplary structure along the horizontal plane B-B' of FIG. 14A.

Referring to FIGS. 14A and 14B, another underfill material may be applied to the center region of the gap between the fan-out package 900 and the packaging substrate 200, i.e., to the center region of the gap between the interposer 920 and the packaging substrate 200. This underfill material is herein referred to as a central underfill material (or alternatively, as a first underfill material). The applied and deposited portions of the central underfill material is herein referred to as a central underfill material portion 291 (or alternatively, as a first underfill material portion). Generally, a central underfill material portion 291 may be formed at, and around, the center region of the interposer 920. The central underfill material portion 291 may contact a first surface segment of a horizontal surface of the interposer 920 that faces the packaging substrate 200 and is not contacted by the at least one peripheral underfill material portion 292. The first surface segment may include a predominant portion of the horizontal surface of the interposer 920 that faces the packaging substrate 200. As discussed above, the fraction of the area of the first surface segment relative to the total area of the horizontal surface of the interposer 920 that faces the packaging substrate 200 may be in a range from 50% to 99%, such as from 70% to 95%.

The central underfill material portion 291 laterally surrounds, and contacts, a first subset of the second solder material portions 290, and contacts at least one peripheral underfill material portion 292 located at corner regions of the interposer 920. In one embodiment, the central underfill material portion 291 contacts a first horizontal surface segment and first sidewall surface segments of the interposer 920. The at least one peripheral underfill material portion 292 may contact corner regions of the interposer 920 and a respective surface segment of the central underfill material portion 291, and may contact second horizontal surface segments and second sidewall surface segments of the interposer 920.

The central underfill material may have a different material composition than the peripheral underfill material. In one embodiment, the central underfill material may have a greater Young's modulus than the peripheral underfill material. In one embodiment, the central underfill material comprises a filler material (which is also referred to as a central filler material or as a first filler material) at a volume fraction in a range from 70% to 99% and a resin (which is also referred to as a central resin or as a first resin) at a volume fraction in a range from 1% to 30%. In one embodiment, the volume fraction of a central filler material within the central underfill material may be higher than the volume fraction of a peripheral filler material within the peripheral underfill material.

In one embodiment, all surfaces of a second solder material portion 290, a plurality of second solder material portions 290, or all of the second solder material portions 290, within a second subset of the second solder material portions 290 are in contact with a respective one of the interposer bonding pads 928, a respective one of the substrate bonding pads 268, or the at least one peripheral underfill material portion 292, and do not contact the central underfill material portion 291. In one embodiment, the central underfill material portion 291 comprises a peripheral region that protrudes out of an area of the interposer 920 in a plan view. In one embodiment, each of the at least one peripheral underfill material portion 292 comprises a first region located within the area of the interposer 920 in the plan view and a second region located outside the area of the interposer 920 in the plan view.

In one embodiment, the combination of the central underfill material portion 291 and the at least one peripheral underfill material portion 292 may have a first length L1 along a first horizontal direction hd1, and a first width W1 along a second horizontal direction hd2. In one embodiment, the first horizontal direction hd1 may be parallel to a side of the fan-out package 900, and the second horizontal direction hd2 may be parallel to another side of the fan-out package 900. Each peripheral underfill material portion 292 may have a second length L2 as a maximum lateral dimension along the first horizontal direction hd1, and may have a second width W2 as a maximum lateral dimension along the second horizontal direction hd2. The ratio of the second length L2 to the first length L1 may be in a range from 1.0% to 49.9%, such as from 3.0% to 20%. The ratio of the second width W2 to the first width W1 may be in a range from 1.0% to 49.9%, such as from 3.0% to 20%.

The fraction of the area of the central underfill material portion 291 relative to the total area of the combination of the central underfill material portion 291 and the at least one peripheral underfill material portion 292 may be in a range from 50% to 99%, such as from 70% to 95%. The total area of the at least one peripheral underfill material portion 292 to the total area of the combination of the central underfill material portion 291 and the at least one peripheral underfill material portion 292 may be in a range from 1% to 50%, such as from 5% to 30%.

Figure 14C:
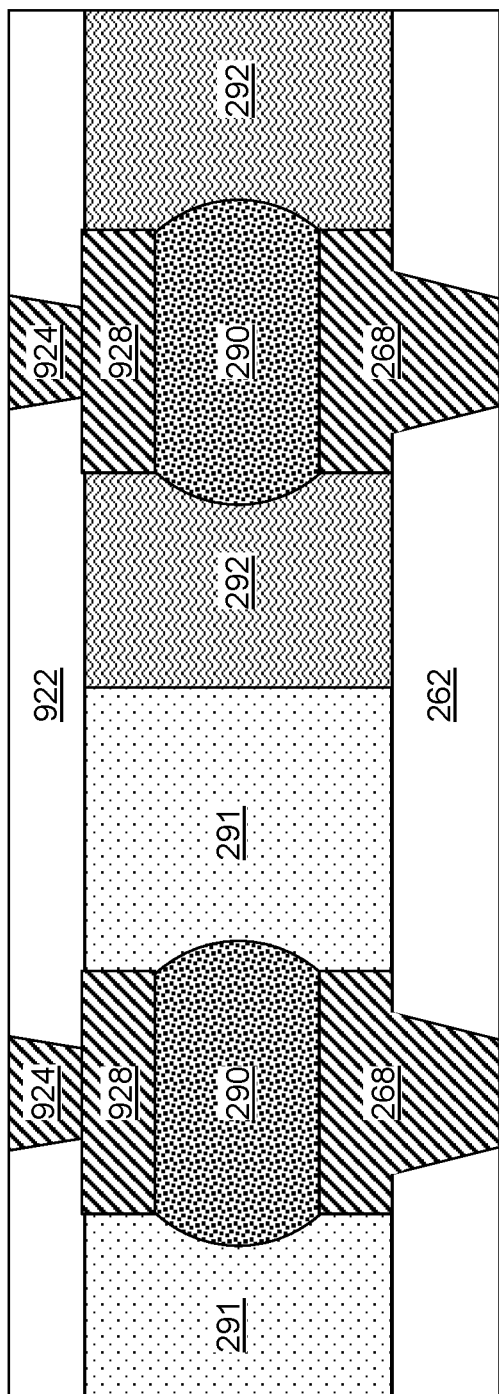
FIGS. 14C, 14D, and 14E are vertical cross-sectional views of various configurations of a region M of the exemplary structure of FIG. 14A.
Figure 14D:
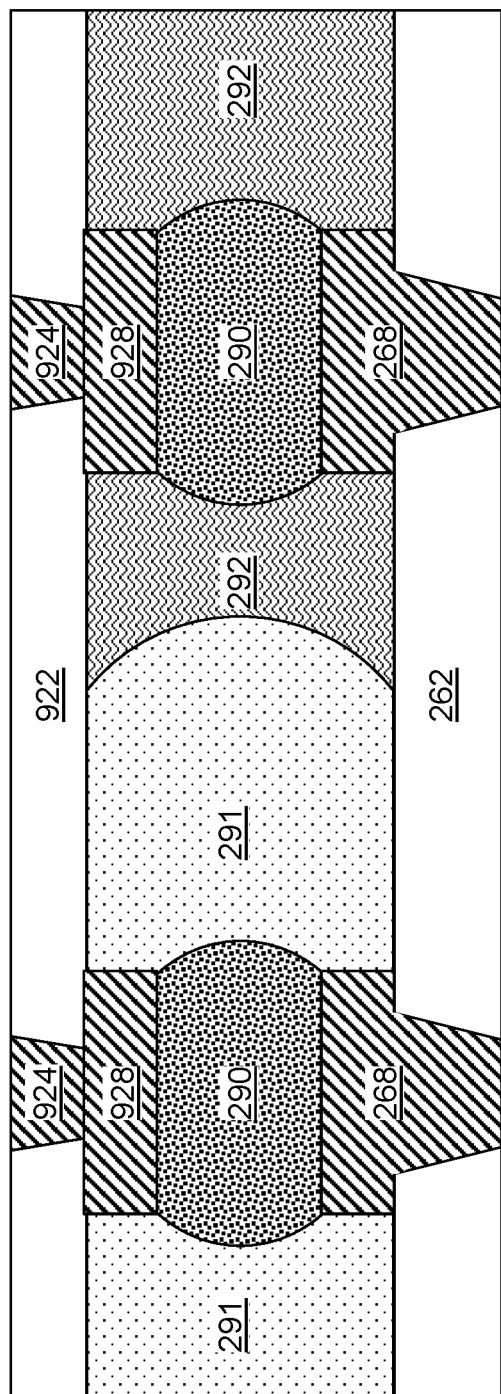
Figure 14E:
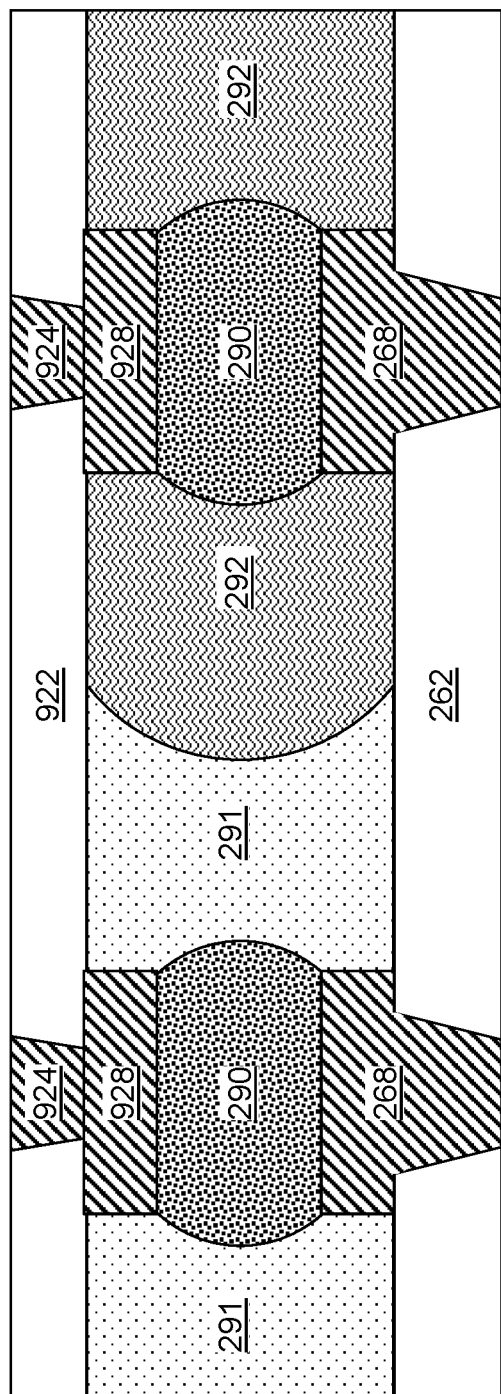

FIGS. 14C, 14D, and 14E are vertical cross-sectional views of various configurations of a region M of the exemplary structure of FIG. 14A. Generally, the central underfill material portion 291 and the peripheral underfill material portions 292 are cured at one point after application between the fan-out package 900 and the packaging substrate 200. In one embodiment, the peripheral underfill material portions 292 are partially or fully cured prior to application of the central underfill material portion 291. In another embodiment, the peripheral underfill material portions 292 and the central underfill material portion 291 are cured at a same processing step after application of the central underfill material portion 291. The vertical cross-sectional profile of the interfaces between the peripheral underfill material portions 292 and the packaging substrate 200 may be vertical, convex, or concave depending on the viscosity of the peripheral underfill material portion 292 and depending on the order of the at least one curing step and the processing step employed to apply the central underfill material portion 291. In one embodiment, a straight vertical surface of a peripheral underfill material portion 292 may contact a straight vertical surface of the central underfill material portion 291. In another embodiment, a convex surface of a peripheral underfill material portion 292 may contact a concave surface of the central underfill material portion 291. In yet another embodiment, a concave surface of a peripheral underfill material portion 292 may contact a convex surface of the central underfill material portion 291.

Figure 15:
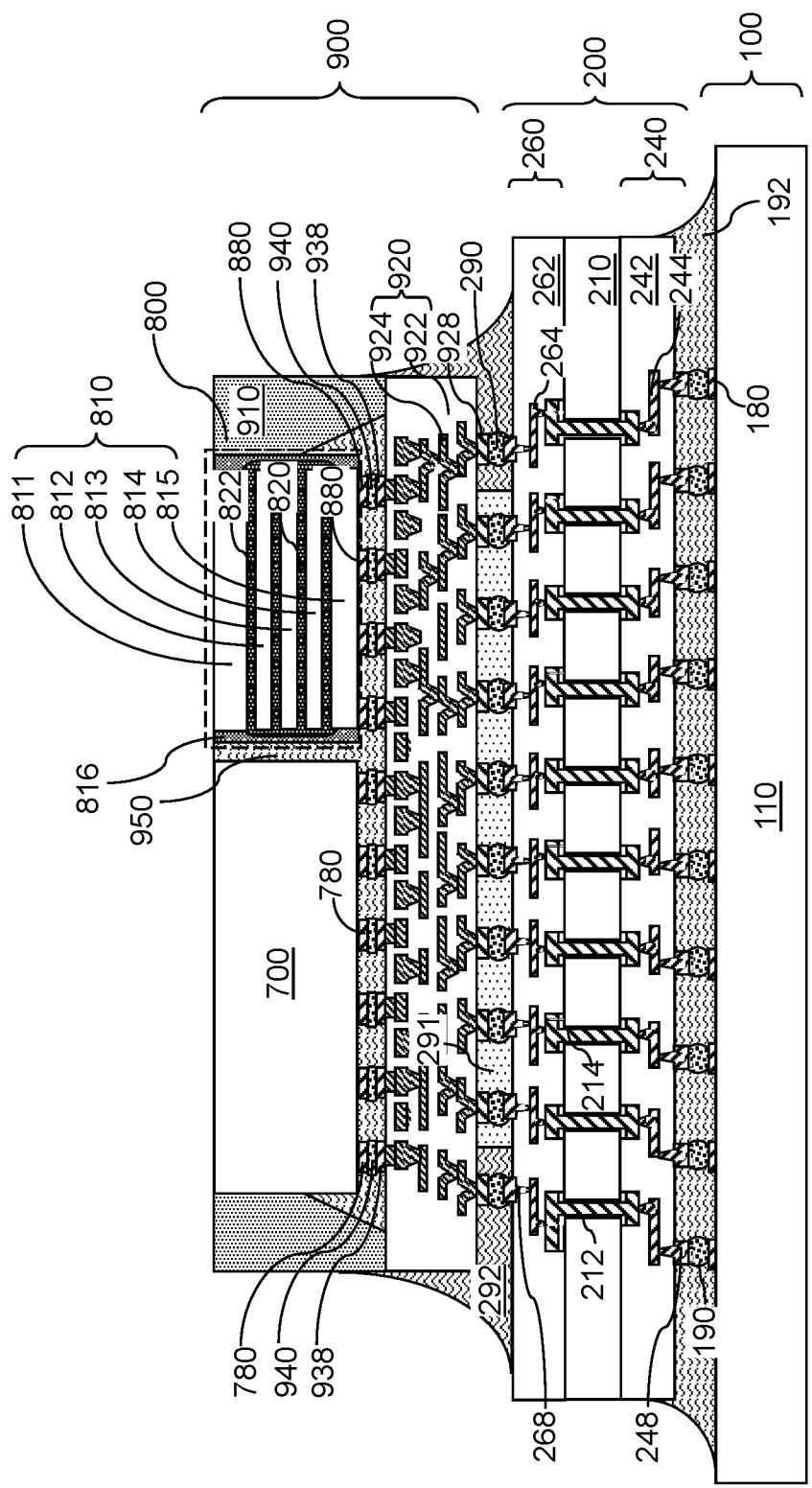
FIG. 15 is a vertical cross-sectional view of the first exemplary structure after the packaging substrate is attached to a printed circuit board (PCB) according to the first embodiment of the present disclosure.

Referring to FIG. 15, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The packaging substrate 200 is attached to the PCB 100 through the array of solder joints 190.

Figure 16A:
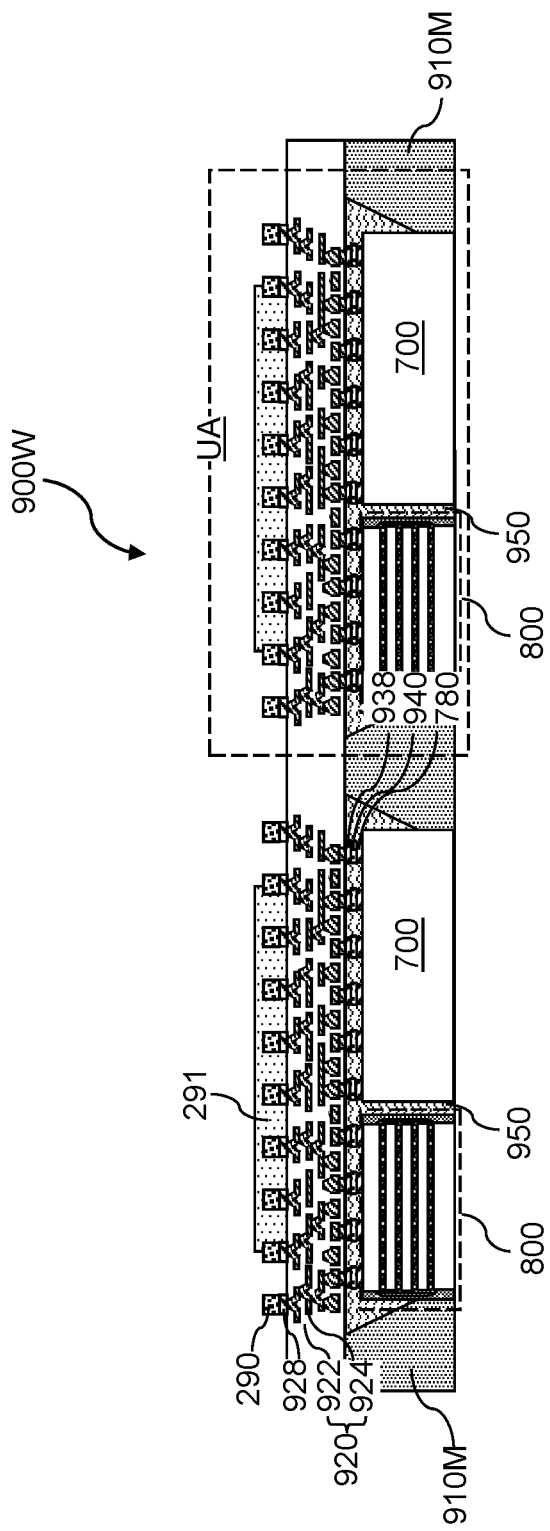
FIG. 16A is a vertical cross-sectional view of a region of a second exemplary structure after formation of central underfill material portions according to a second embodiment of the present disclosure.
Figure 16B:
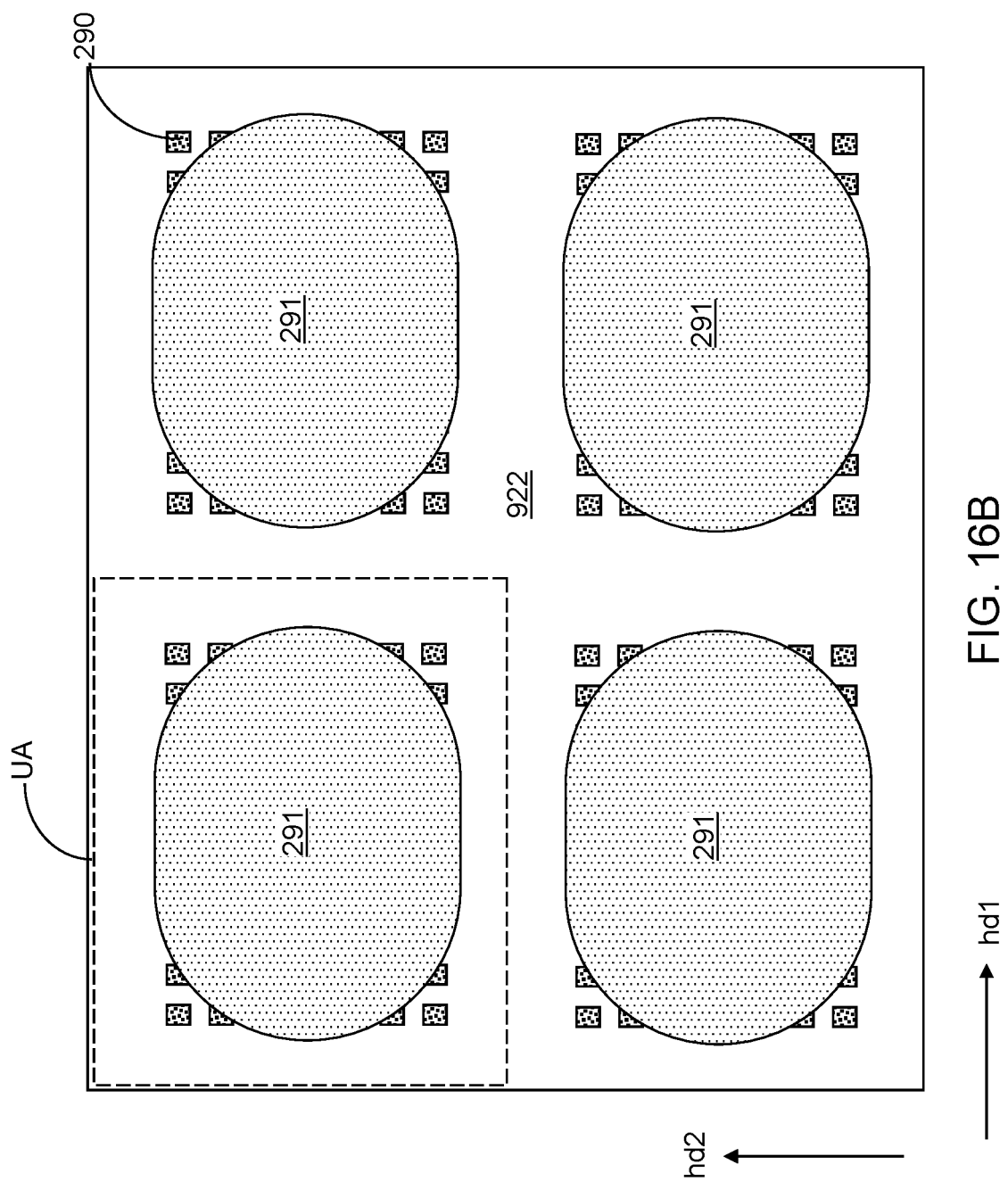
FIG. 16B is a top-down view of the region of the second exemplary structure of FIG. 16A.

Referring to FIGS. 16A and 16B, a second exemplary structure according to a second embodiment of the present disclosure may be derived from the first exemplary structure illustrated in FIG. 8 by applying a central underfill material to a center region of each of the interposers 920. The applied and deposited portions of the central underfill material are herein referred to as central underfill material portions 291 (or alternatively, as first underfill material portions). Generally, each central underfill material portion 291 may be formed at, and around, the center region of a respective interposer 920. Each central underfill material portion 291 may have a top surface located above the top surfaces of the second solder material portions 290. Generally, the volume of each central underfill material portion 291 may be sufficient to fill a center portion of a gap between a respective interposer 920 and a respective packaging substrate 200 to be subsequently bonded thereto. The fraction of the area of the area of each central underfill material portion 291 relative to the total area of the interposer 920 to which a respective central underfill material portion 291 is applied may be in a range from 50% to 99%, such as from 70% to 95%.

The central underfill material portion 291 laterally surrounds, and contacts, a first subset of the second solder material portions 290. The central underfill material portion 291 laterally surrounds, and contacts, a first subset of the second solder material portions 290. In one embodiment, the central underfill material comprises a filler material (which is also referred to as a central filler material or as a first filler material) at a volume fraction in a range from 70% to 99% and a resin (which is also referred to as a central resin or as a first resin) at a volume fraction in a range from 1% to 30%.

The vertical cross-sectional profile of physically exposed surfaces of the central underfill material portions 291 overlying a respective fan-out package 900 may be vertical, convex, or concave depending on the viscosity of the material of the central underfill material portions 291 and depending on the degree to which the central underfill material portions 291 are cured.

Figure 17:
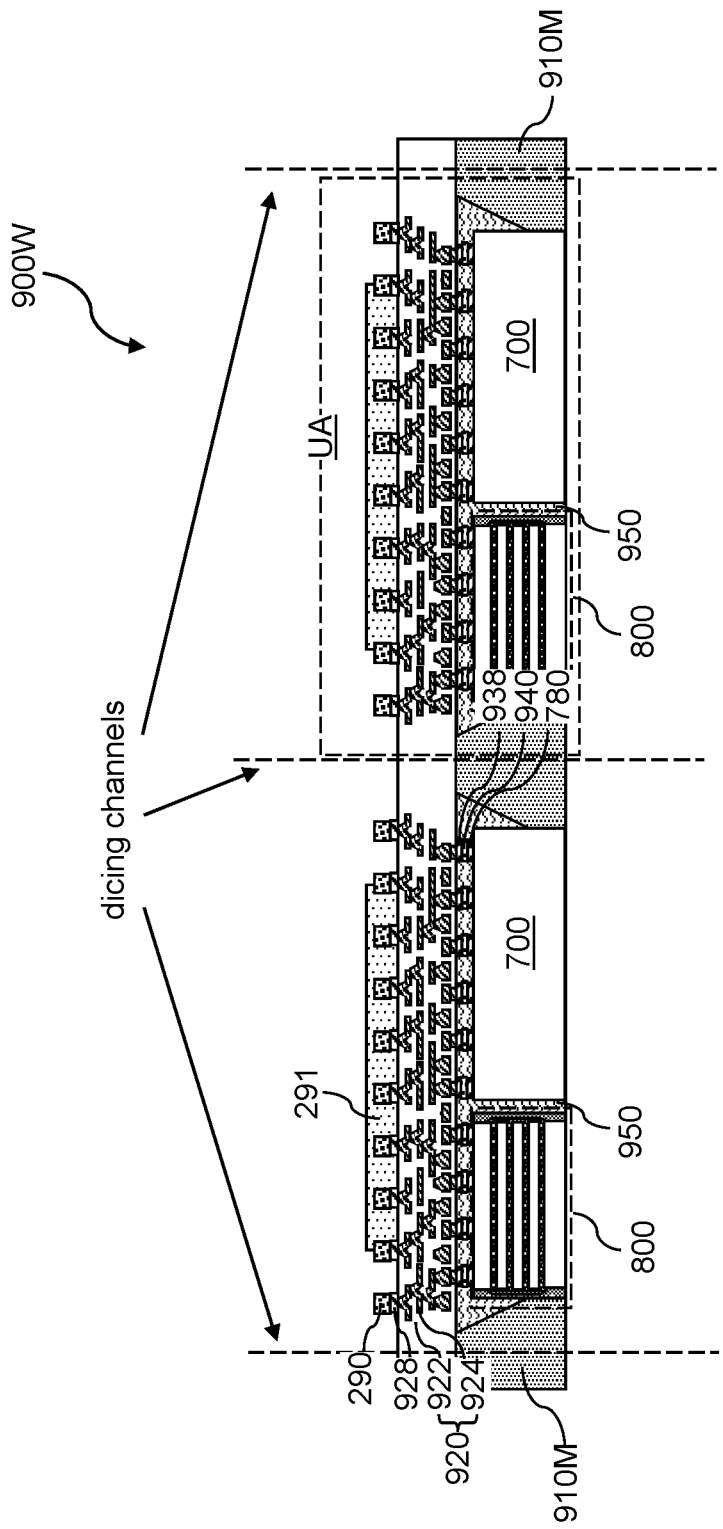
FIG. 17 is a vertical cross-sectional view of a region of the second exemplary structure during dicing of a redistribution substrate and the EMC matrix according to the second embodiment of the present disclosure.

Referring to FIG. 17, the reconstituted wafer 900W including the interposer bonding pads 928 may be subsequently diced along dicing channels by performing a dicing process. The dicing channels correspond to the boundaries between neighboring pairs of die areas DA. Each diced unit from the reconstituted wafer 900W may include a fan-out package 900. In other words, each diced portion of the assembly of the two-dimensional array of sets of semiconductor dies (700, 800), the two-dimensional array of die-side underfill material portions 950, the EMC matrix 910M, and the two-dimensional array of interposers 920 constitutes a fan-out package 900. Each diced portion of the EMC matrix 910M constitutes a molding compound die frame 910. Each diced portion of the interposer layer (which includes the two-dimensional array of interposers 920) constitutes an interposer 920.

Figure 18:
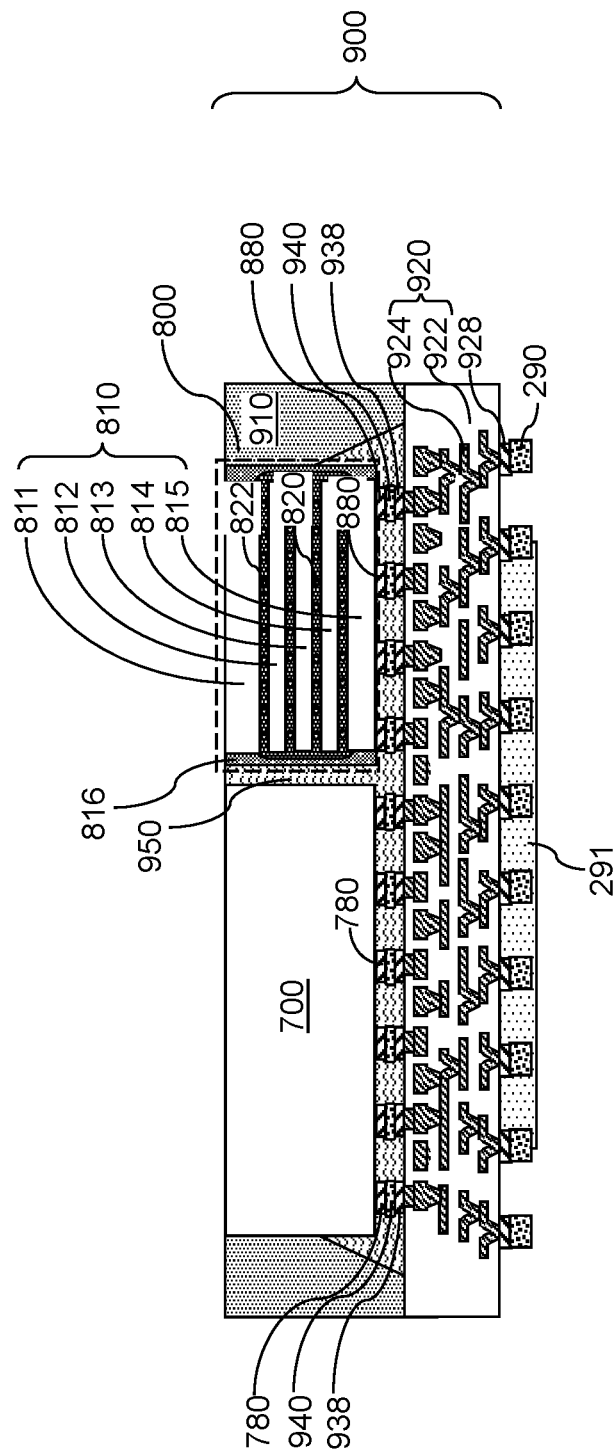
FIG. 18 is a vertical cross-sectional view of a fan-out package according to the second embodiment of the present disclosure.

Referring to FIG. 18, a fan-out package 900 obtained by dicing the first exemplary structure at the processing steps of FIG. 17 is illustrated. The fan-out package 900 comprises an interposer 920 including redistribution-side bonding structures 938, at least one semiconductor die (700, 800) comprising a respective set of die-side bonding structures (780, 880) that is attached to the redistribution-side bonding structures 938 through a respective set of first solder material portions 940, a die-side underfill material portion 950 laterally surrounding the redistribution-side bonding structures 938 and the die-side bonding structures (780, 880) of the at least one semiconductor die (700, 800).

The fan-out package 900 may comprise a molding compound die frame 910 laterally surrounding the at least one semiconductor die (700, 800) and comprising a molding compound material. In one embodiment, the molding compound die frame 910 may include sidewalls that are vertically coincident with sidewalls of the interposer 920, i.e., located within same vertical planes as the sidewalls of the interposer 920. Generally, the molding compound die frame 910 may be formed around the at least one semiconductor die (700, 800) after formation of the die-side underfill material portion 950 within each fan-out package 900. The molding compound material contacts a peripheral portion of a planar surface of the interposer 920.

Generally an assembly including at least one semiconductor die (700, 800) and an interposer 920 is provided. The assembly may be in a form of a package, i.e., a semiconductor package. In one embodiment, the assembly may comprise a fin-out package including at least one semiconductor die (700, 800), an interposer 920 attached to the at least one semiconductor die (700, 800), and a die-side underfill material portion 950 located between the at least one semiconductor die (700, 800) and the interposer 920. A central underfill material portion 291 may be attached to the interposer 920, and may laterally surround, and cover, a first subset of the second solder material portions 290.

Figure 19A:
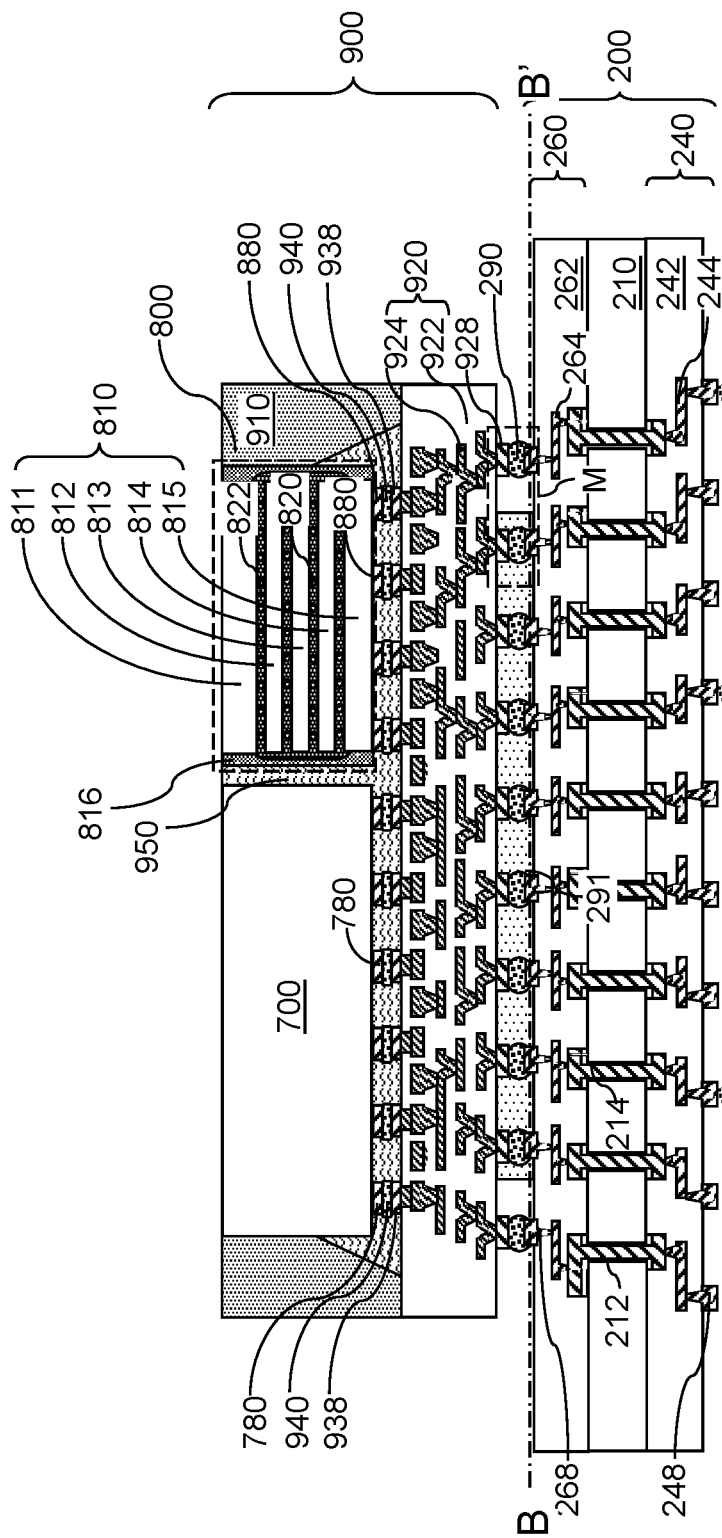
FIG. 19A is a vertical cross-sectional view of a second exemplary structure after attaching the fan-out package to the packaging substrate according to the second embodiment of the present disclosure.
Figure 19B:
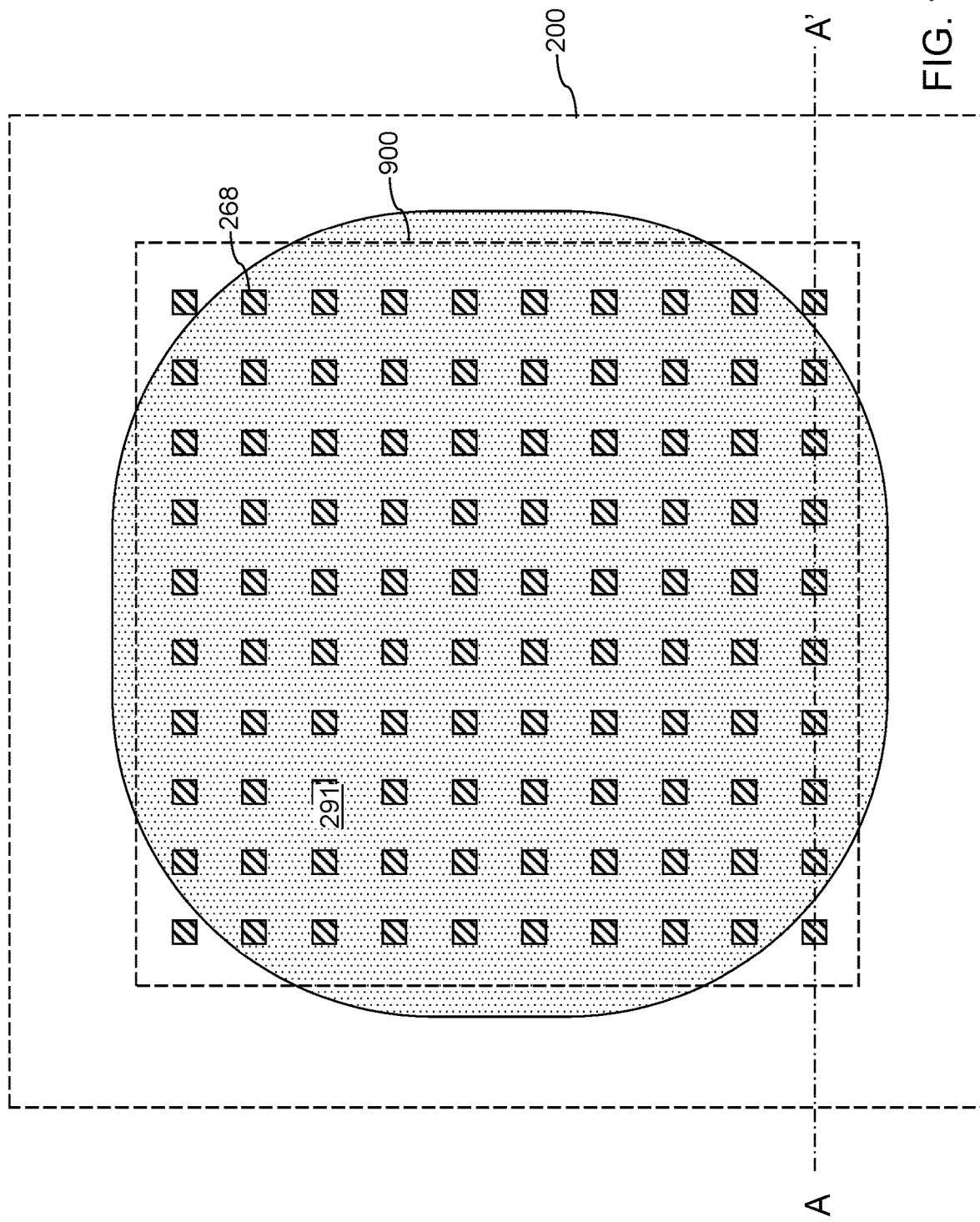
FIG. 19B is a horizontal cross-sectional view of the second exemplary structure along the horizontal plane B-B' of FIG. 19A. The vertical plane A-A' corresponds to the cut plane of the vertical cross-sectional view of FIG. 19A.

Referring to FIGS. 19A and 19B, the fan-out package 900 may be disposed over the packaging substrate 200 with an array of the second solder material portions 290 and the central underfill material portion 291 therebetween. In embodiments in which the second solder material portions 290 are formed on the interposer bonding pads 928 of the fan-out package 900, the second solder material portions 290 may be disposed on the substrate bonding pads 268 of the packaging substrate 200. A suitable compression process may be performed to squeeze the central underfill material portion 291 and to induce direct contact between the second solder material portions 290 and the interposer bonding pads 928 (or to induce direct contact between the second solder material portions 290 and the substrate bonding pads 268).

A reflow process may be performed to reflow the second solder material portions 290, thereby inducing bonding between the fan-out package 900 and the packaging substrate 200. In this embodiment, the first subset of the second solder material portions 290 may reflow within a volume defined by a respective cavity in the central underfill material portion 291. A second subset of the second solder material portions 290 located outside the central underfill material portion 291 may reflow without limitations on a shape change. Each second solder material portion 290 may be bonded to a respective one of the interposer bonding pads 928 and to a respective one of the substrate bonding pads 268. In one embodiment, the second solder material portions 290 may include C4 solder balls, and the fan-out package 900 may be attached to the packaging substrate 200 through an array of C4 solder balls. Generally, the fan-out package 900 may be bonded to the packaging substrate 200 such that the interposer 920 is bonded to the packaging substrate 200 by an array of solder material portions (such as the second solder material portions 290).

Figure 19C:
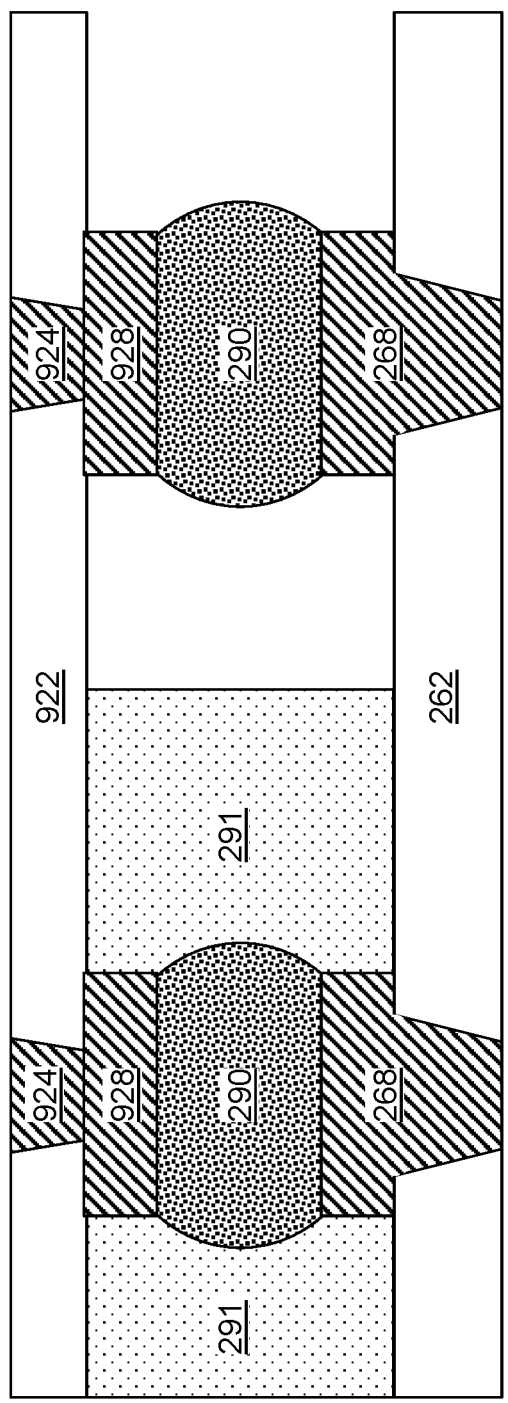
Figure 19D:
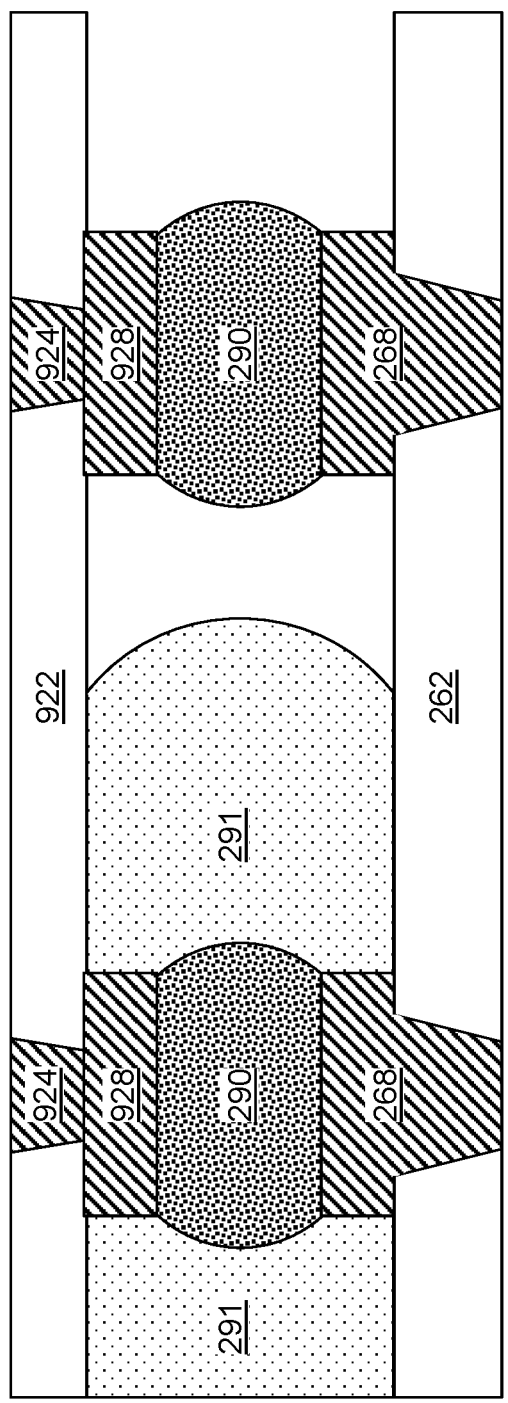

FIGS. 19C, 19D, and 19E are vertical cross-sectional views of various configurations of a region M of the exemplary structure of FIG. 19A. FIGS. 19C, 19D, and 19E are vertical cross-sectional views of various configurations of a region M of the exemplary structure of FIG. 19A. The vertical cross-sectional profile of physically exposed surfaces of the central underfill material portions 291 located between a respective fan-out package 900 and a respective packaging substrate 200 may be vertical, convex, or concave depending on the viscosity of the material of the central underfill material portions 291 and depending on the degree to which the central underfill material portions 291 are cured.

Figure 20A:
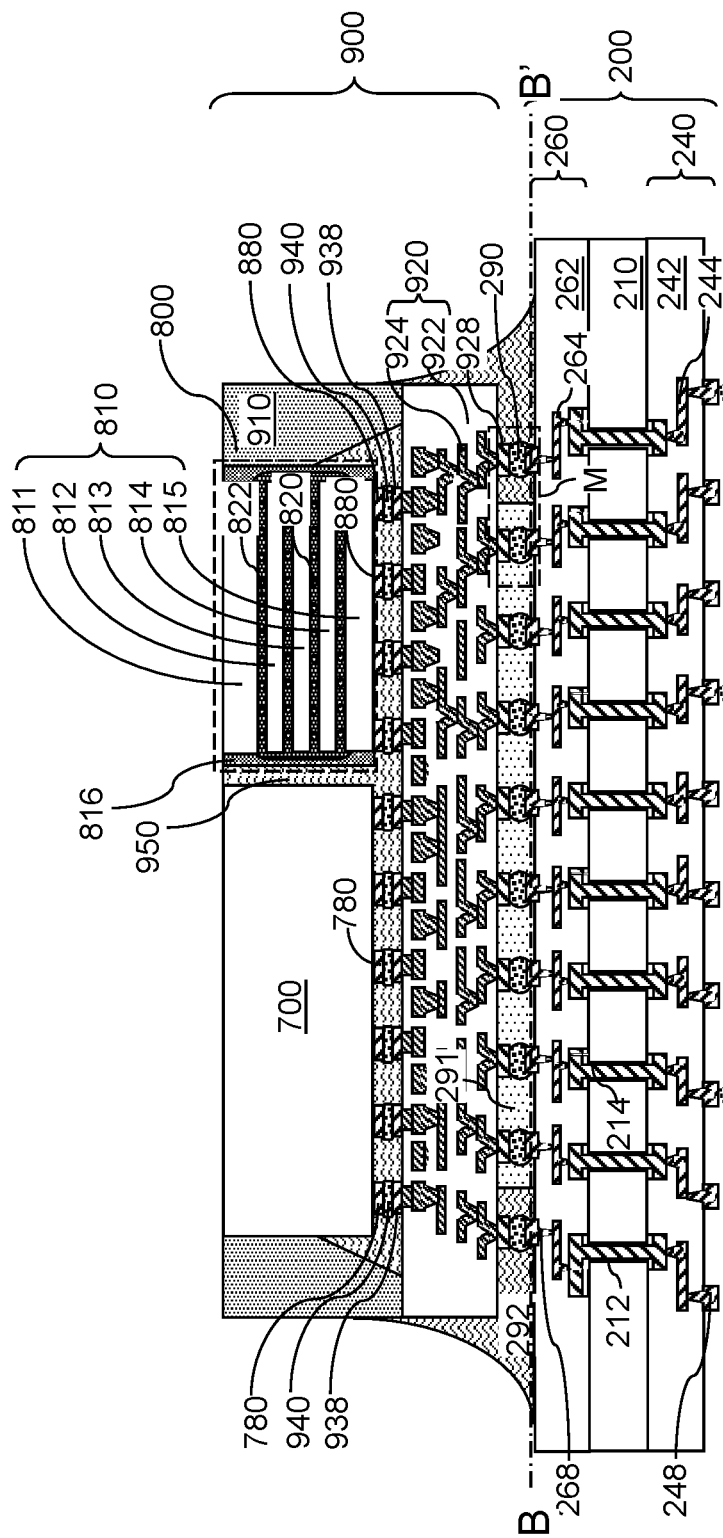
FIG. 20A is a vertical cross-sectional view of the second exemplary structure after formation of peripheral underfill material portions according to the second embodiment of the present disclosure.
Figure 20B:
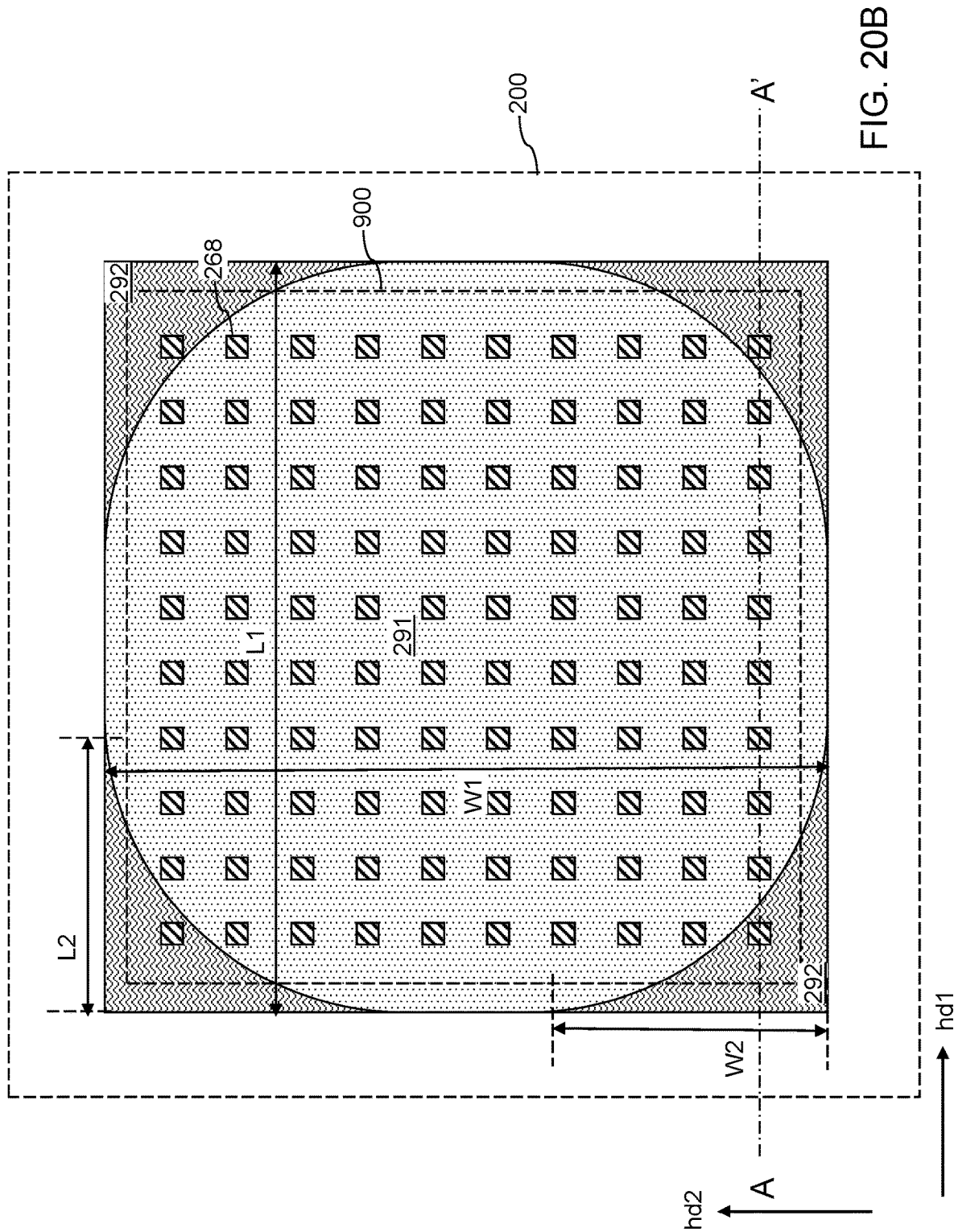
FIG. 20B is a horizontal cross-sectional view of the second exemplary structure along the horizontal plane B-B' of FIG. 20A.

Referring to FIGS. 20A and 20B, an additional underfill material is applied to unfilled corners regions of the gap between the fan-out package 900 and the packaging substrate 200, i.e., to the unfilled corner regions of the gap between the interposer 920 and the packaging substrate 200. This underfill material is herein referred to as a peripheral underfill material (and alternatively, as a second underfill material). The applied and deposited portions of the peripheral underfill material are herein referred to as peripheral underfill material portions 292 (or alternatively, as second underfill material portions). Generally, at least one peripheral underfill material portion 292 may be formed at corner regions of the interposer 920.

The central underfill material portion 291 laterally surrounds, and contacts, the first subset of the second solder material portions 290, and contacts at least one peripheral underfill material portion 292 located at corner regions of the interposer 920. In one embodiment, the central underfill material portion 291 contacts a first horizontal surface segment and first sidewall surface segments of the interposer 920. The at least one peripheral underfill material portion 292 may contact corner regions of the interposer 920 and a respective surface segment of the central underfill material portion 291, and may contact second horizontal surface segments and second sidewall surface segments of the interposer 920.

The peripheral underfill material has a different material composition than the central underfill material. In one embodiment, the central underfill material may have a greater Young's modulus than the peripheral underfill material. In one embodiment, the volume fraction of a central filler material within the central underfill material may be higher than the volume fraction of a peripheral filler material within the peripheral underfill material.

In one embodiment, all surfaces of a second solder material portion 290, a plurality of second solder material portions 290, or all of the second solder material portions 290, within a second subset of the second solder material portions 290 are in contact with a respective one of the interposer bonding pads 928, a respective one of the substrate bonding pads 268, or the at least one peripheral underfill material portion 292, and do not contact the central underfill material portion 291. In one embodiment, the central underfill material portion 291 comprises a peripheral region that protrudes out of an area of the interposer 920 in a plan view. In one embodiment, each of the at least one peripheral underfill material portion 292 comprises a first region located within the area of the interposer 920 in the plan view and a second region located outside the area of the interposer 920 in the plan view.

In one embodiment, the combination of the central underfill material portion 291 and the at least one peripheral underfill material portion 292 may have a first length L1 along a first horizontal direction hd1, and a first width W1 along a second horizontal direction hd2. In one embodiment, the first horizontal direction hd1 may be parallel to a side of the fan-out package 900, and the second horizontal direction hd2 may be parallel to another side of the fan-out package 900. Each peripheral underfill material portion 292 may have a second length L2 as a maximum lateral dimension along the first horizontal direction hd1, and may have a second width W2 as a maximum lateral dimension along the second horizontal direction hd2. The ratio of the second length L2 to the first length L1 may be in a range from 1.0% to 49.9%, such as from 3.0% to 20%. The ratio of the second width W2 to the first width W1 may be in a range from 1.0% to 49.9%, such as from 3.0% to 20%.

The fraction of the area of the central underfill material portion 291 relative to the total area of the combination of the central underfill material portion 291 and the at least one peripheral underfill material portion 292 may be in a range from 50% to 99%, such as from 70% to 95%. The total area of the at least one peripheral underfill material portion 292 to the total area of the combination of the central underfill material portion 291 and the at least one peripheral underfill material portion 292 may be in a range from 1% to 50%, such as from 5% to 30%.

Figure 20C:
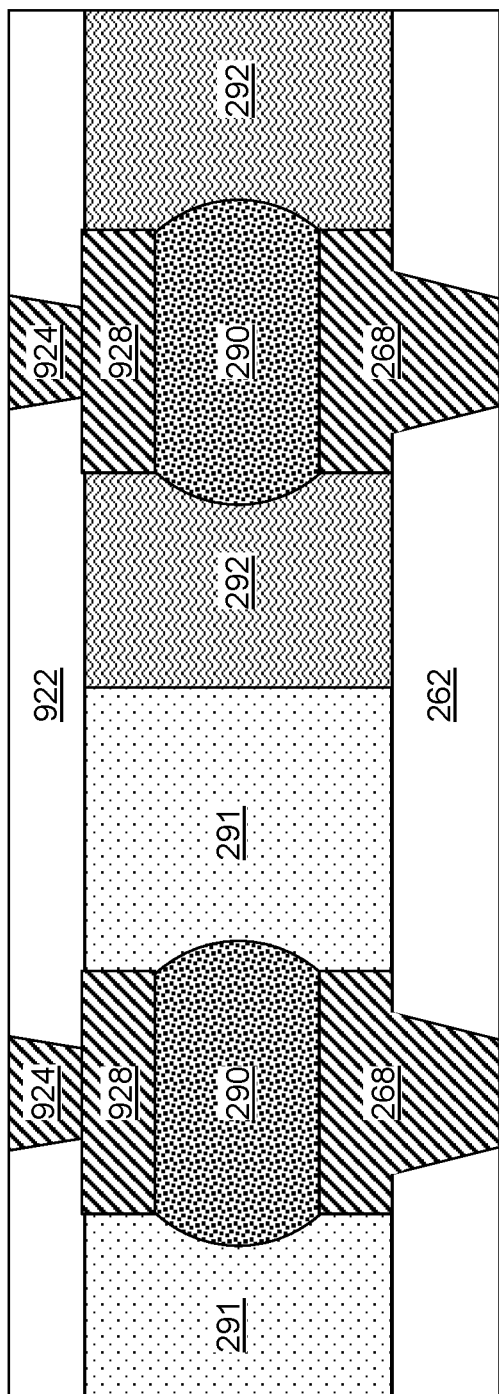
FIGS. 20C, 20D, and 20E are vertical cross-sectional views of various configurations of a region M of the exemplary structure of FIG. 13A.
Figure 20D:
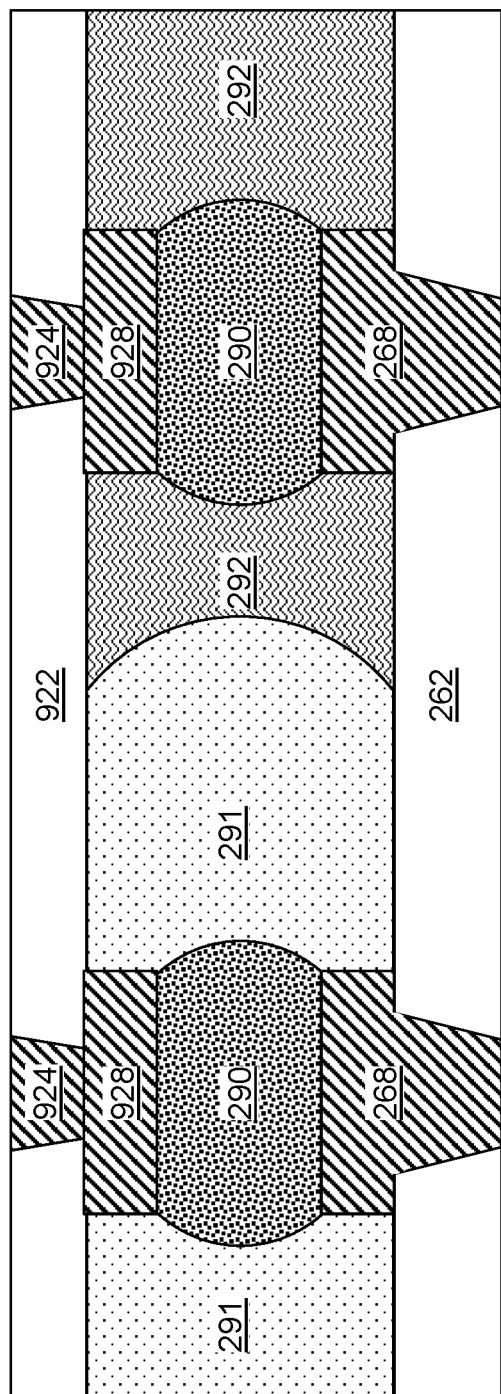
Figure 20E:
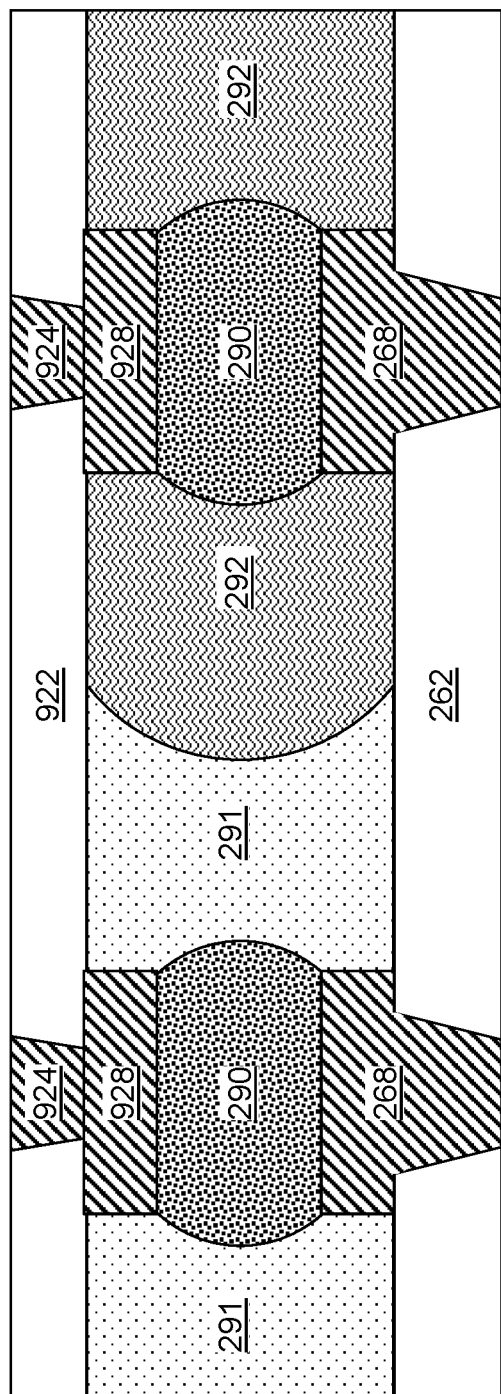

FIGS. 20C, 20D, and 20E are vertical cross-sectional views of various configurations of a region M of the exemplary structure of FIG. 20A. Generally, the central underfill material portion 291 and the peripheral underfill material portions 292 are cured at one point after application on the fan-out package 900. In one embodiment, the central underfill material portion 291 is partially or fully cured prior to application of the peripheral underfill material portions 292. In another embodiment, the peripheral underfill material portions 292 and the central underfill material portion 291 are cured at a same processing step after application of the central underfill material portion 291. The vertical cross-sectional profile of the interfaces between the peripheral underfill material portions 292 and the packaging substrate 200 may be vertical, convex, or concave depending on the viscosity of the peripheral underfill material portion 292 and depending on the order of the at least one curing step and the processing step employed to apply the peripheral underfill material portions 292. In one embodiment, a straight vertical surface of a peripheral underfill material portion 292 may contact a straight vertical surface of the central underfill material portion 291. In another embodiment, a convex surface of a peripheral underfill material portion 292 may contact a concave surface of the central underfill material portion 291. In yet another embodiment, a concave surface of a peripheral underfill material portion 292 may contact a convex surface of the central underfill material portion 291.

Figure 21:
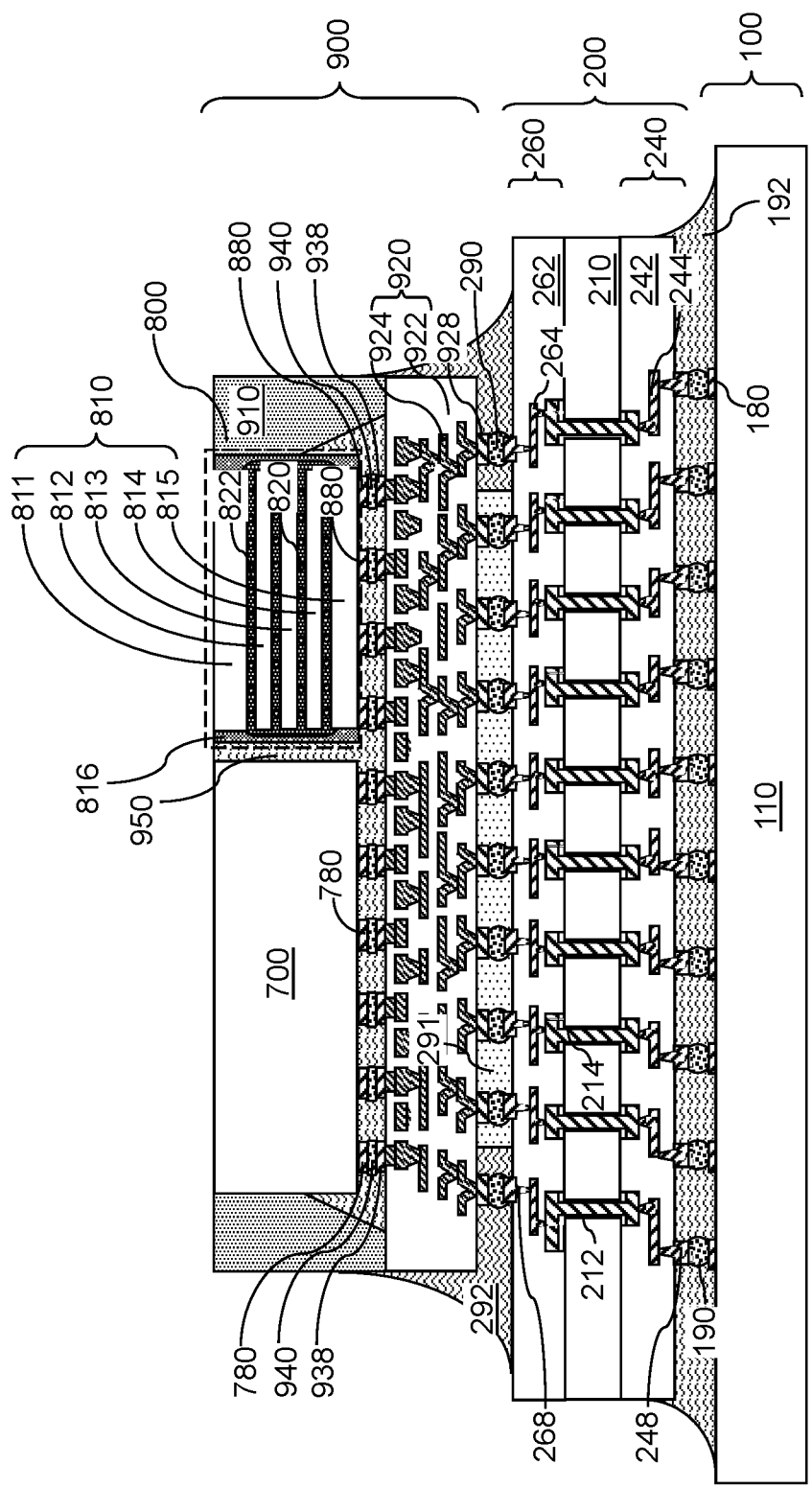
FIG. 21 is a vertical cross-sectional view of the second exemplary structure after the packaging substrate is attached to a printed circuit board (PCB) according to the second embodiment of the present disclosure.

Referring to FIG. 21, the processing steps of FIG. 15 may be performed to attach the packaging substrate through an array of solder joints 190.

Figure 22A:
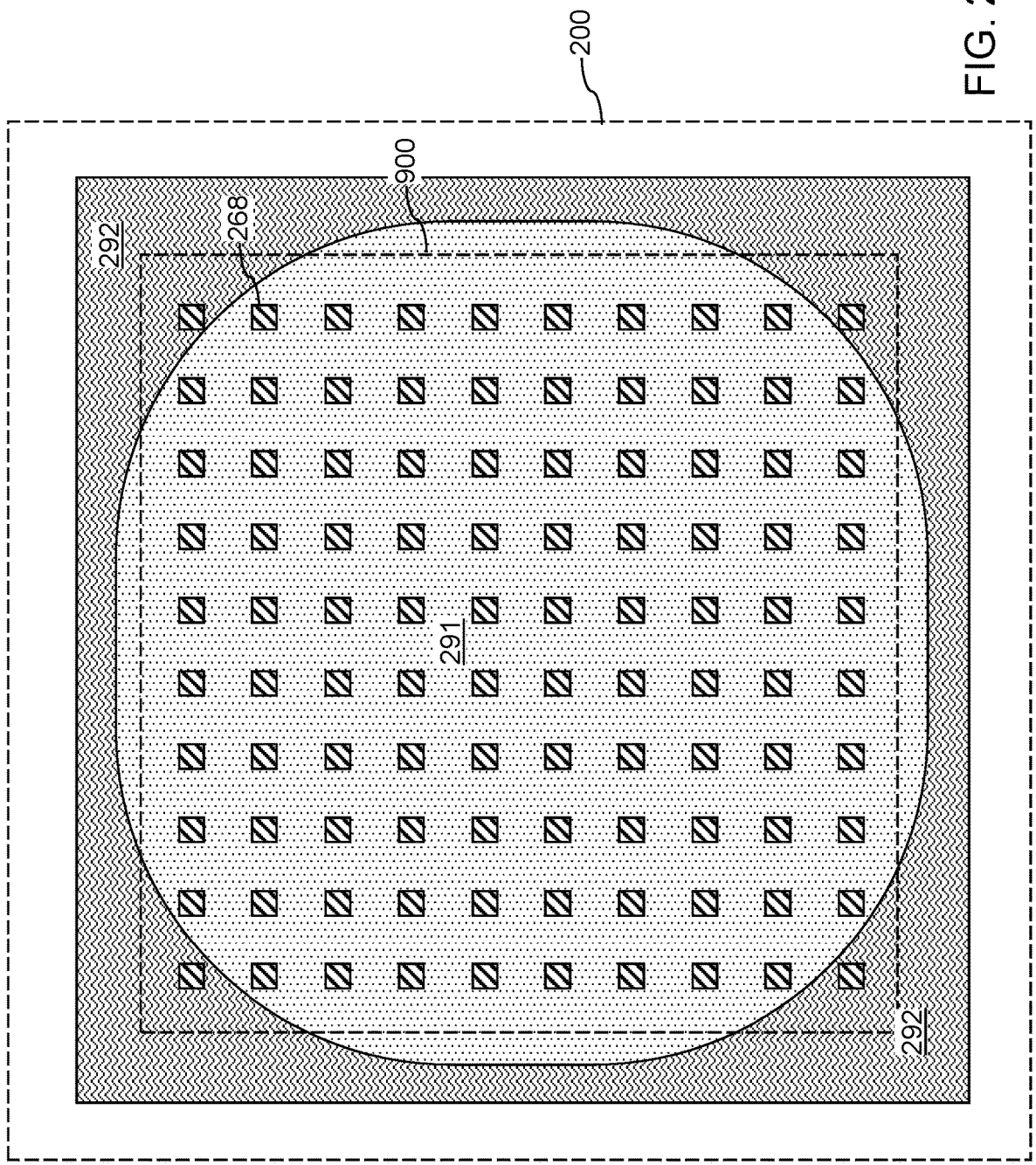
FIGS. 22A-22C are horizontal cross-sectional views of alternative configurations of the first or second exemplary structure within a horizontal plane including a central underfill material portion and at least one peripheral underfill material portion according to the first and second embodiments of the present disclosure.
Figure 22B:
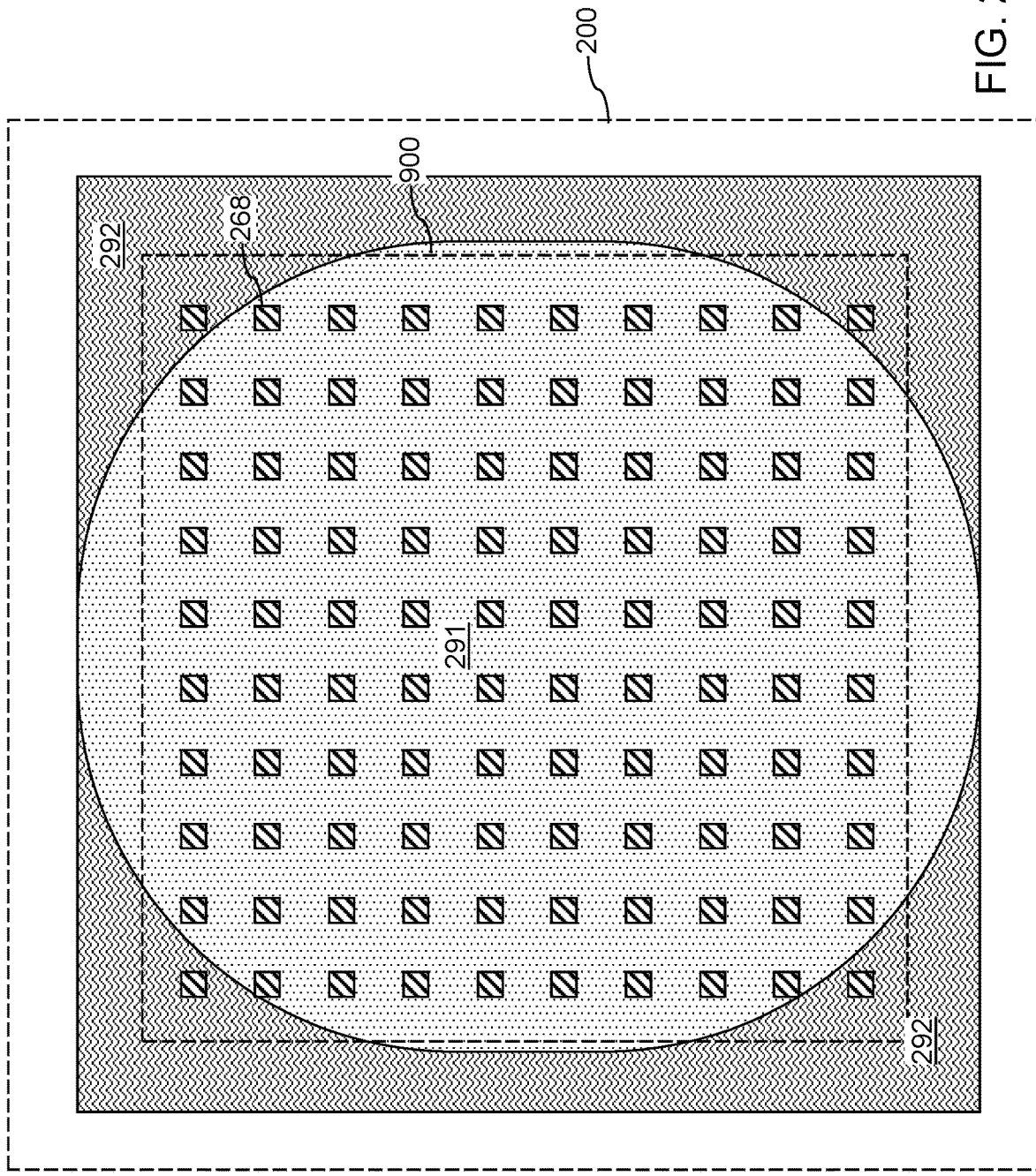
Figure 22C:
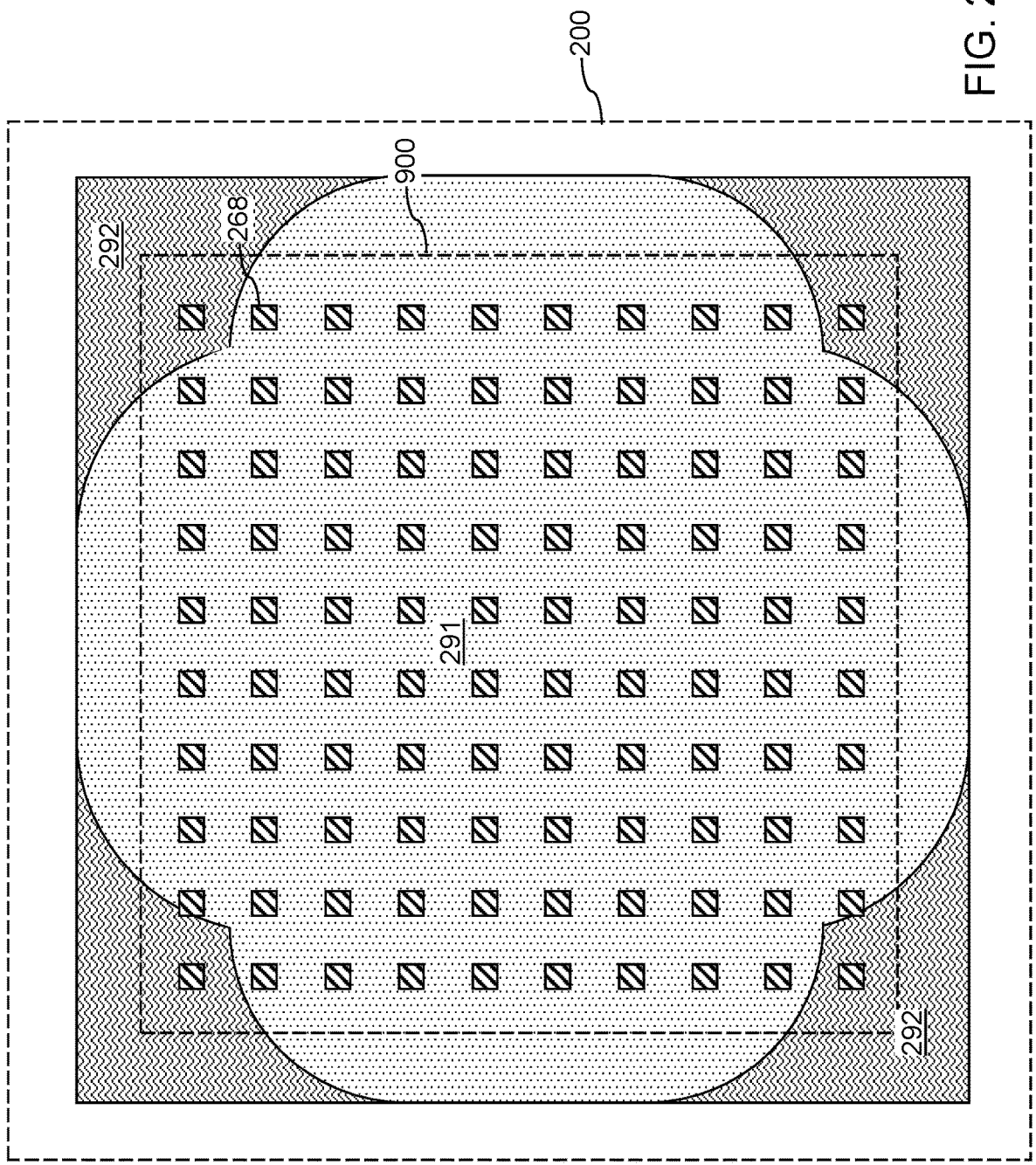

FIGS. 22A-22C illustrate alternative configurations of the first and second exemplary structures. A central underfill material portion 291 and at least one peripheral underfill material portion 292 may be formed within a horizontal plane including the substrate bonding pads 268 in alternative configurations.

Referring to FIG. 22A, the at least one peripheral underfill material portion 292 may be formed as a continuous peripheral underfill material portion 292. The continuous peripheral underfill material portion 292 may laterally surround, and contact, the central underfill material portion 291, and may continuously extend underneath four corners of the interposer 920. The continuous peripheral underfill material portion 292 may have a continuous outer surface and a continuous inner surface. In one embodiment, the peripheral underfill material portion 292 may be topologically homeomorphic to a torus, i.e., may be transformed into a torus without creating a new hole and without eliminating any preexisting hole.

Referring to FIG. 22B, the at least one peripheral underfill material portion 292 may be formed as two discrete peripheral underfill material portions 292 laterally extending continuously between a respective set of two corners of the interposer 920 and spaced from each other by the central underfill material portion 291.

Referring to FIG. 22C, the central underfill material portion 291 may be formed by using multiple application steps, and may comprise at least two convex surfaces that are adjoined to each other at a vertically-extending edge. Alternatively, in embodiments in which the peripheral underfill material portions 292 are formed prior to formation of the central underfill material portion 291, each peripheral underfill material portion may comprise at least one convex surface that contacts a respective concave surface of the central underfill material portion 291.

Figure 23A:
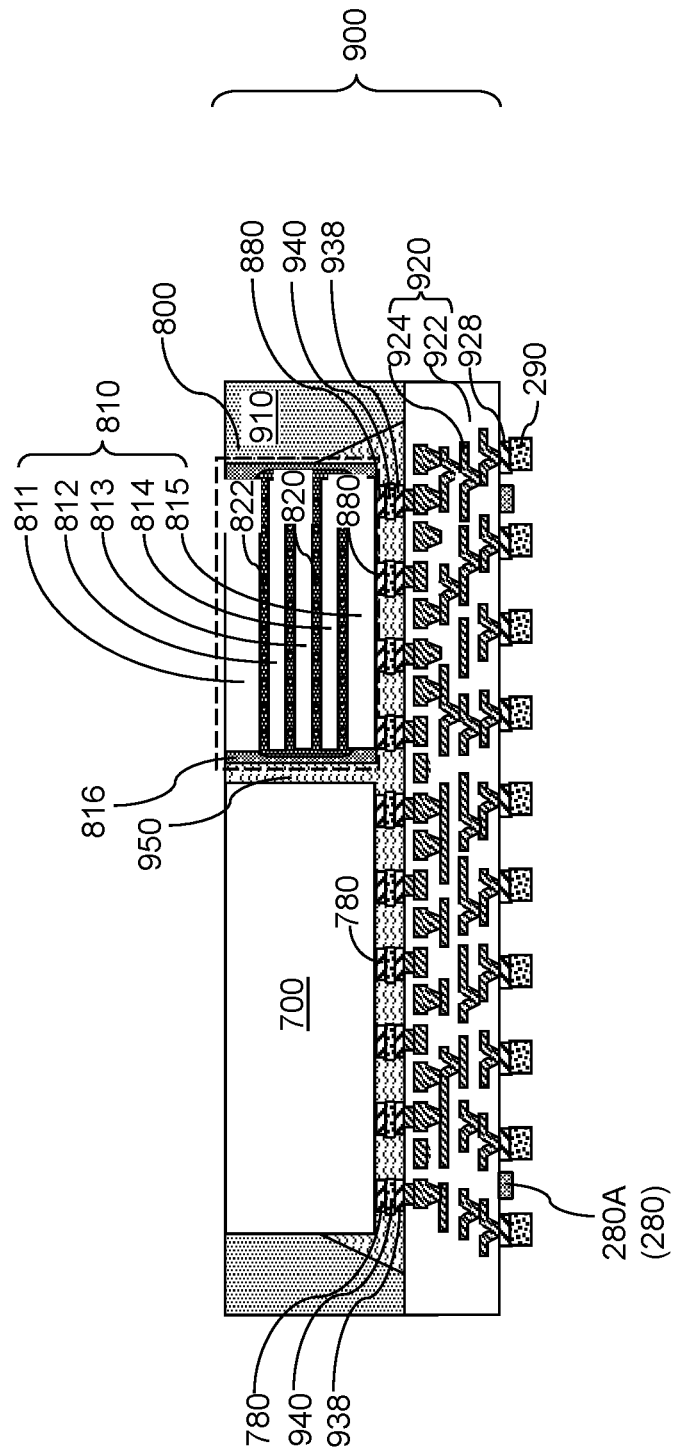
FIG. 23A is a vertical cross-sectional view of a fan-out package after formation of interposer-side flow guide structures according to a third second embodiment of the present disclosure.
Figure 23B:
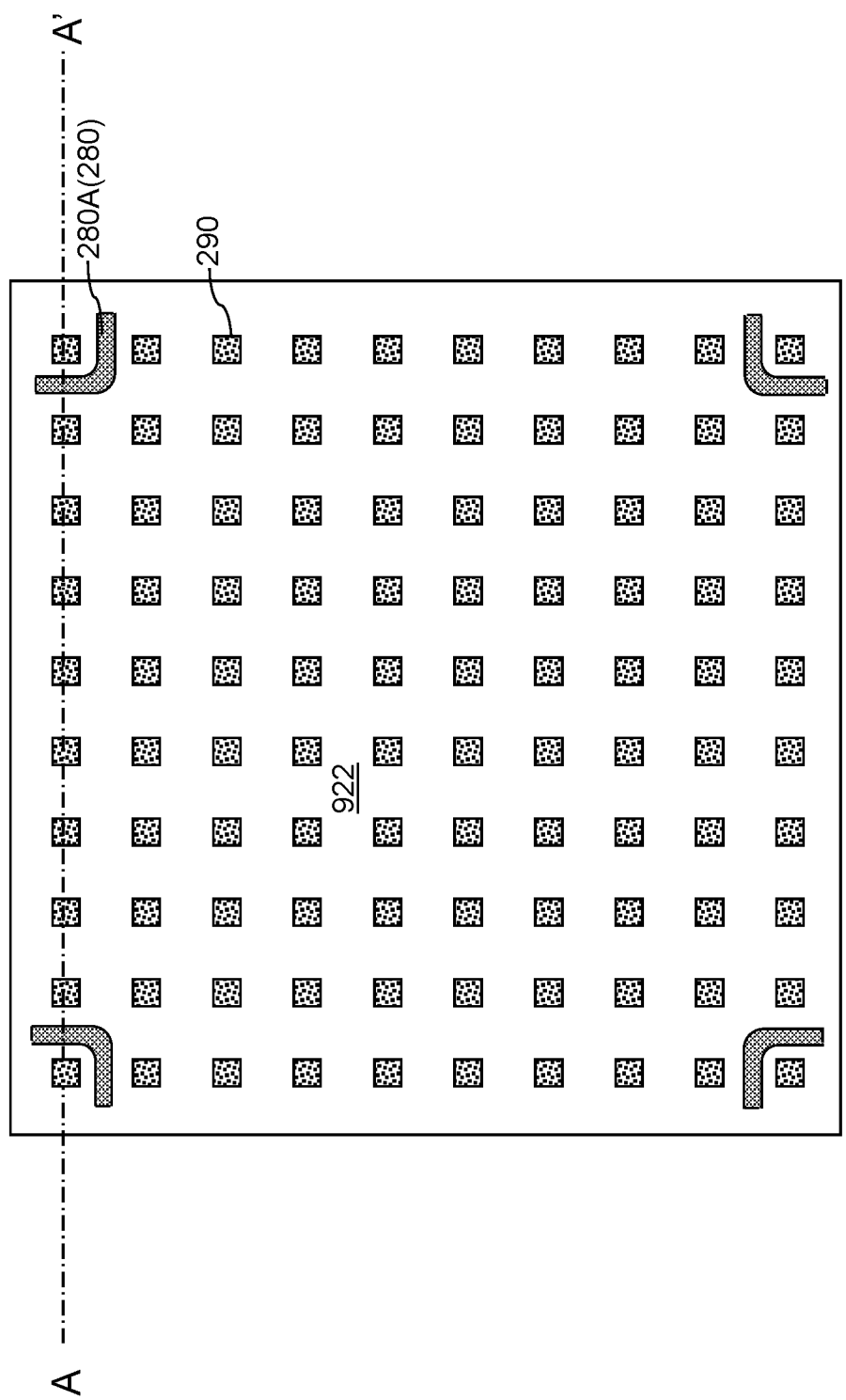
FIG. 23B is a bottom-up view of the fan-out package of FIG. 23A.

Referring to FIGS. 23A and 23B, a third exemplary structure including a fan-out package 900 according to a third second embodiment of the present disclosure is illustrated, which may be derived from the fan-out package 900 illustrated in FIG. 6 by providing interposer-side flow guide structures 280A on the side of the interposer 920 configured to face a packaging substrate 200. The interposer-side flow guide structures 280A are flow guide structures 280 that are formed on an interposer 920. Generally, the interposer-side flow guide structures 280A may be formed on a planar surface of the reconstituted wafer 900W prior to dicing by depositing and patterning a dielectric material. For example, a dielectric material such as a polymer material or a resin may be deposited on a top surface of the reconstituted wafer 900W as provided after the processing steps of FIG. 6. A photoresist layer may be deposited over the deposited dielectric material, and may be lithographically patterned to form discrete photoresist material portions having shapes of the interposer-side flow guide structures 280A to be subsequently formed. An etch process, such as an anisotropic etch process or an isotropic etch process, may be performed to remove unmasked portions of the deposited dielectric material. Remaining portions of the deposited dielectric material comprise the interposer-side flow guide structures 280A. Subsequently, the processing steps of FIGS. 7, 8, and 9 may be performed to provide the third exemplary structure illustrated in FIGS. 23A and 23B. Generally, the interposer-side flow guide structures 280A may be formed at locations at which a boundary between a central underfill material portion 291 and a peripheral underfill material portion 292 is to be subsequently formed. In one embodiment, a first subset of the interposer bonding pads 928 may be located inside a set of at least one interposer-side flow guide structures 280A (which may include a plurality of interposer-side flow guide structures 280A). A second subset of the interposer bonding pads 928 may be located outside the set of at least one interposer-side flow guide structures 280A.

Figure 24A:
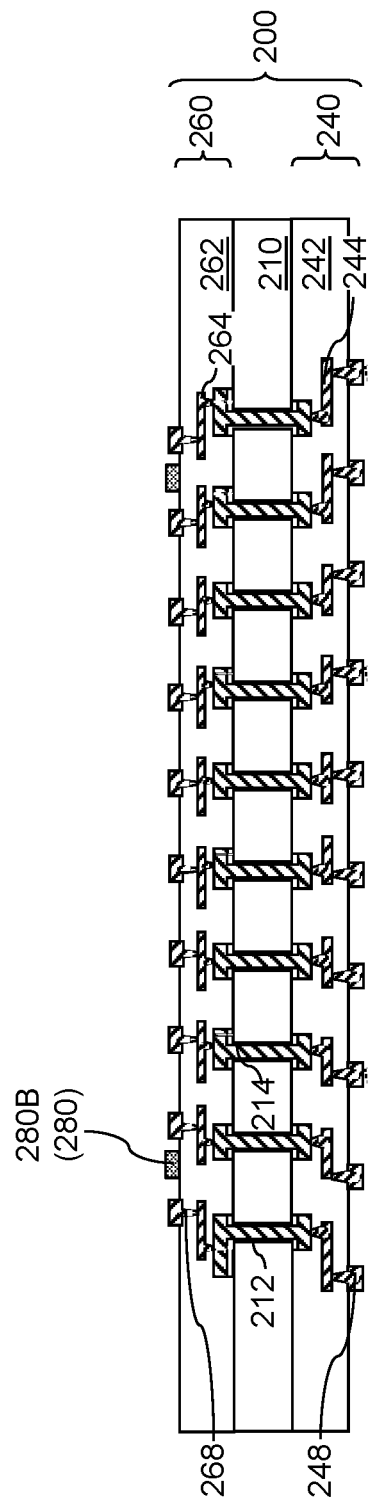
FIG. 24A is a vertical cross-sectional view of a packaging substrate after formation of substrate-side flow guide structures according to the third embodiment of the present disclosure.

Referring to FIGS. 24A and 24B, a packaging substrate 200 according to the third embodiment of the present disclosure is illustrated, which may be derived from the packaging substrate 200 illustrated in FIGS. 11A and 11B by providing substrate-side flow guide structures 280B on the side of the packaging substrate 200 configured to face an interposer 920. The substrate-side flow guide structures 280B are flow guide structures 280 that are formed on a packaging substrate 200. Generally, the substrate-side flow guide structures 280B may be formed on a planar surface of the a plate including a plurality of packaging substrates 20 prior to dicing the packaging substrates 200. Generally, the substrate-side flow guide structures 280B may be formed at locations at which a boundary between a central underfill material portion 291 and a peripheral underfill material portion 292 is to be subsequently formed. In one embodiment, a first subset of the substrate bonding pads 268 may be located inside a set of at least one substrate-side flow guide structures 280B (which may include a plurality of substrate-side flow guide structures 280B). A second subset of the substrate bonding pads 268 may be located outside the set of at least one interposer-side flow guide structures 280A.

Generally, flow guide structures 280 may be formed on at least one of the interposer 920 and the packaging substrate 200. In one embodiment, the flow guide structures 280 may be formed both on the interposer 920 and on the packaging substrate 200. In one embodiment, the flow guide structures 280 may be formed only on the interposer 920. In one embodiment, the flow guide structures 280 may be formed only on the packaging substrate 200. In embodiments in which the flow guide structures 280 are formed both on the interposer 920 and on the packaging substrate 200, the pattern of the substrate-side flow guide structures 280B may be a mirror image pattern of the pattern of the interposer-side flow guide structures 280A, and may be arranged such that the two patterns overlap in a plan view upon bonding the interposer 920 to the packaging substrate 200.

Figure 25A:
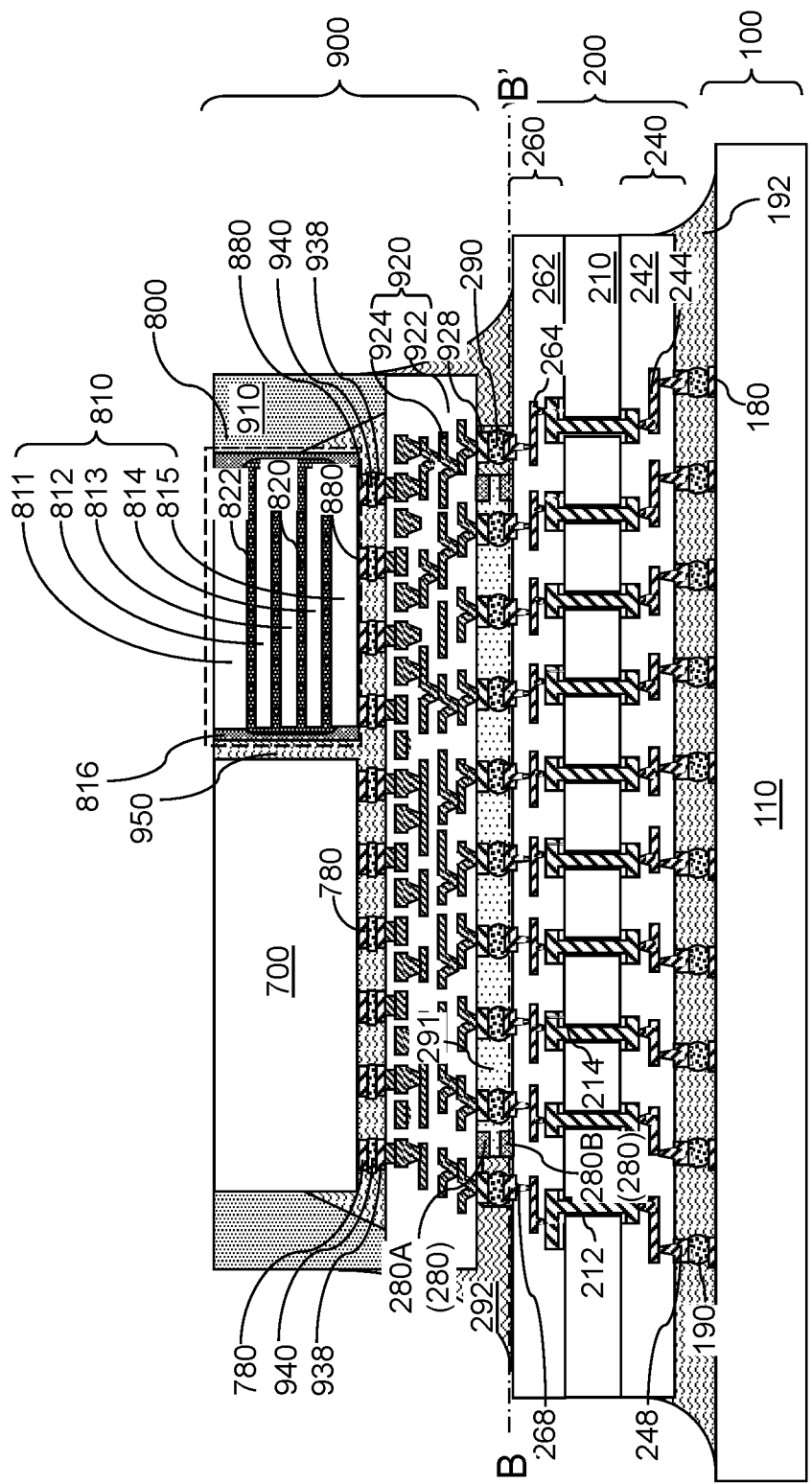
FIG. 25A is a vertical cross-sectional view of the third exemplary structure after the packaging substrate is attached to a printed circuit board (PCB) according to the third embodiment of the present disclosure.
Figure 25B:
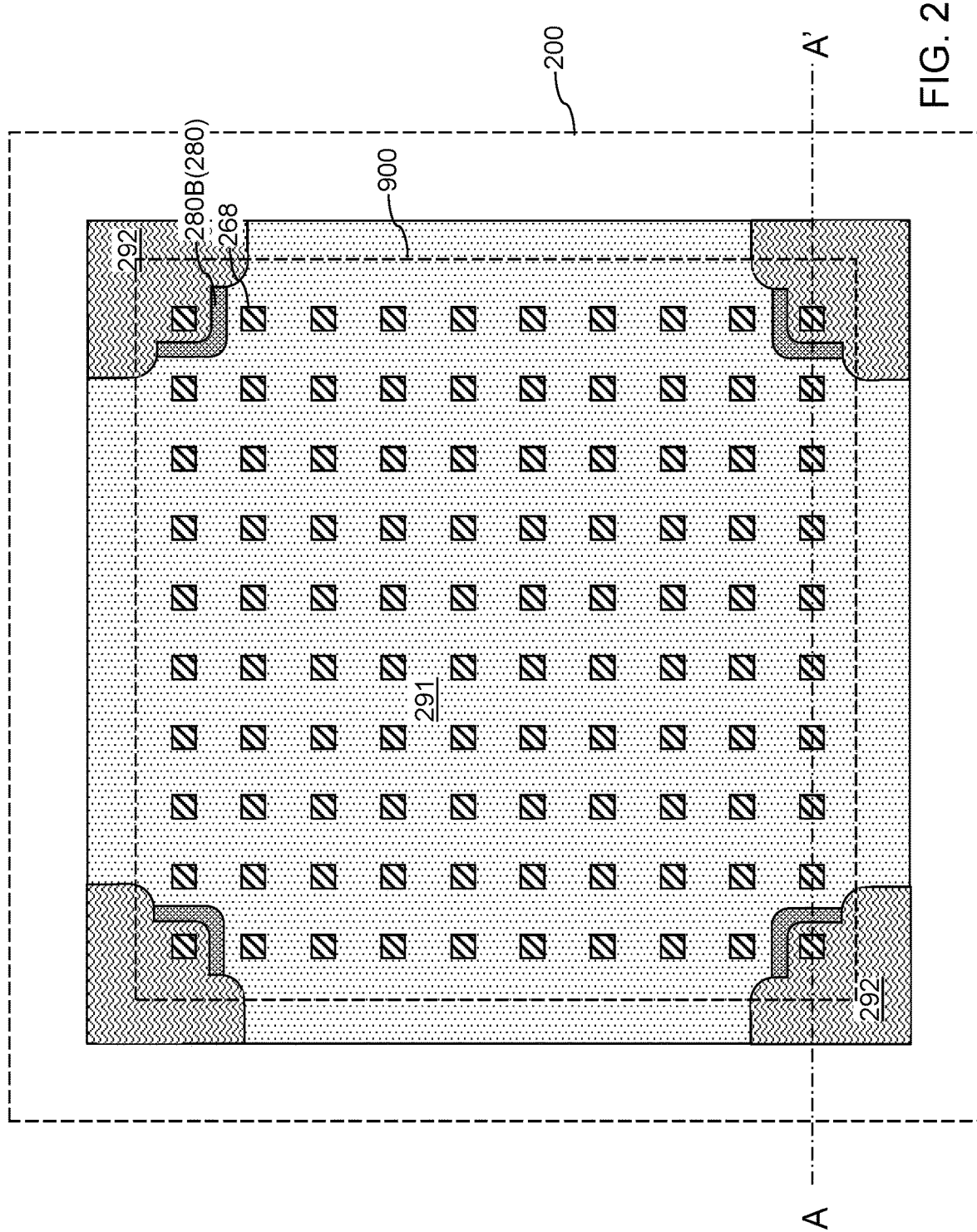
FIG. 25B is a horizontal cross-sectional view of the third exemplary structure along the horizontal plane B-B' of FIG. 25A.

Referring to FIGS. 25A and 25B, the processing steps of FIGS. 12, 13A and 13B, and 14A and 14B may be performed, or the processing steps of FIGS. 16A and 16B, 17, 18, 19A and 19B, and 20A and 20B may be performed. In embodiments in which the processing steps of FIGS. 12, 13A and 13B, and 14A and 14B. The illustrated example of FIGS. 25A and 25B corresponds to an embodiment in which peripheral underfill material portions 292 are formed first, and a central underfill material portions 291 is formed at a subsequent processing step. The processing steps for forming the first exemplary structure or the processing steps for forming the second exemplary structure may be used to form the third exemplary structure.

Generally, a central underfill material may be applied over the interposer 920 or the packaging substrate 200. The flow guide structures 280 may limit flow of the central underfill material from a center region of a gap between the interposer 920 and the packaging substrate 200 toward edge regions of the gap. A peripheral underfill material may be applied over the interposer 920 or the packaging substrate 200 prior to, or after, application of the central underfill material. The flow guide structures 280 limit flow of the peripheral underfill material from a respective edge region of a gap between the interposer 920 and the packaging substrate 200 toward a center region regions of the gap. In one embodiment, the interposer-side flow guide structures 280A do not contact the substrate-side flow guide structures 280B so that the peripheral underfill material portion(s) 292 may effectively absorb stress and alleviate the effect of deformation in the fan-out package 900 and/or in the packaging substrate 200.

Generally, the substrate-side flow guide structures 280B may be located on the packaging substrate 200, and may contact the central underfill material portion 291 on one side and contacting a respective one of the at least peripheral underfill material portion 292 on another side. The interposer-side flow guide structures 280A may be located on the interposer 920, and may contact the central underfill material portion 291 on one side and may contact a respective one of the at least one peripheral underfill material portion 292 on another side. In one embodiment, the interposer-side flow guide structures 280A and the substrate-side flow guide structures 280B have horizontal cross-sectional shapes that overlap in a plan view along a vertical direction that is perpendicular to a horizontal surface of the packaging substrate 200.

Subsequently, the processing steps of FIG. 15 or FIG. 21 may be performed.

Figure 26A:
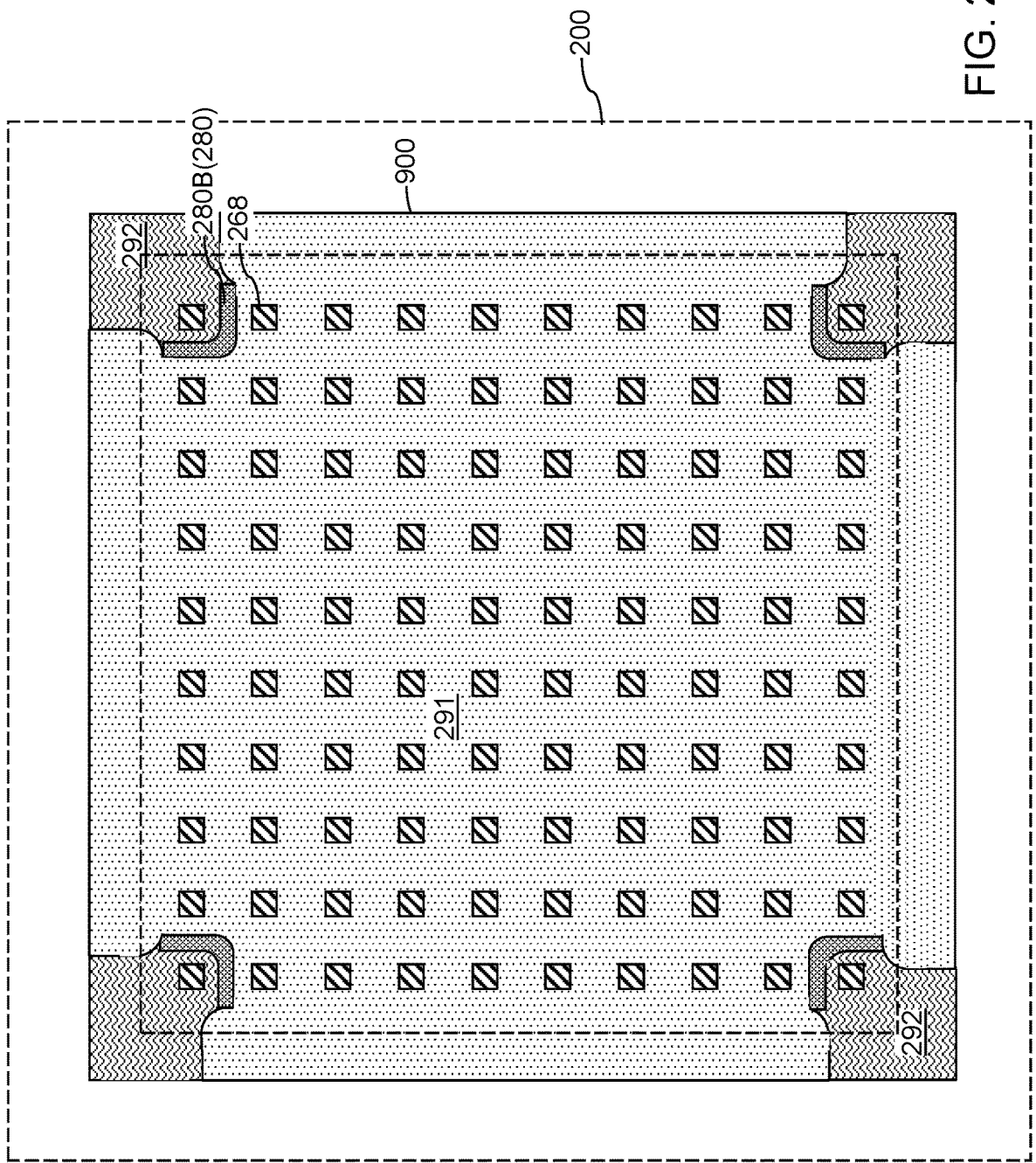
FIGS. 26A-26D are horizontal cross-sectional views of alternative configurations of the third exemplary structure within a horizontal plane including a central underfill material portion and at least one peripheral underfill material portion according to the third embodiment of the present disclosure.
Figure 26B:
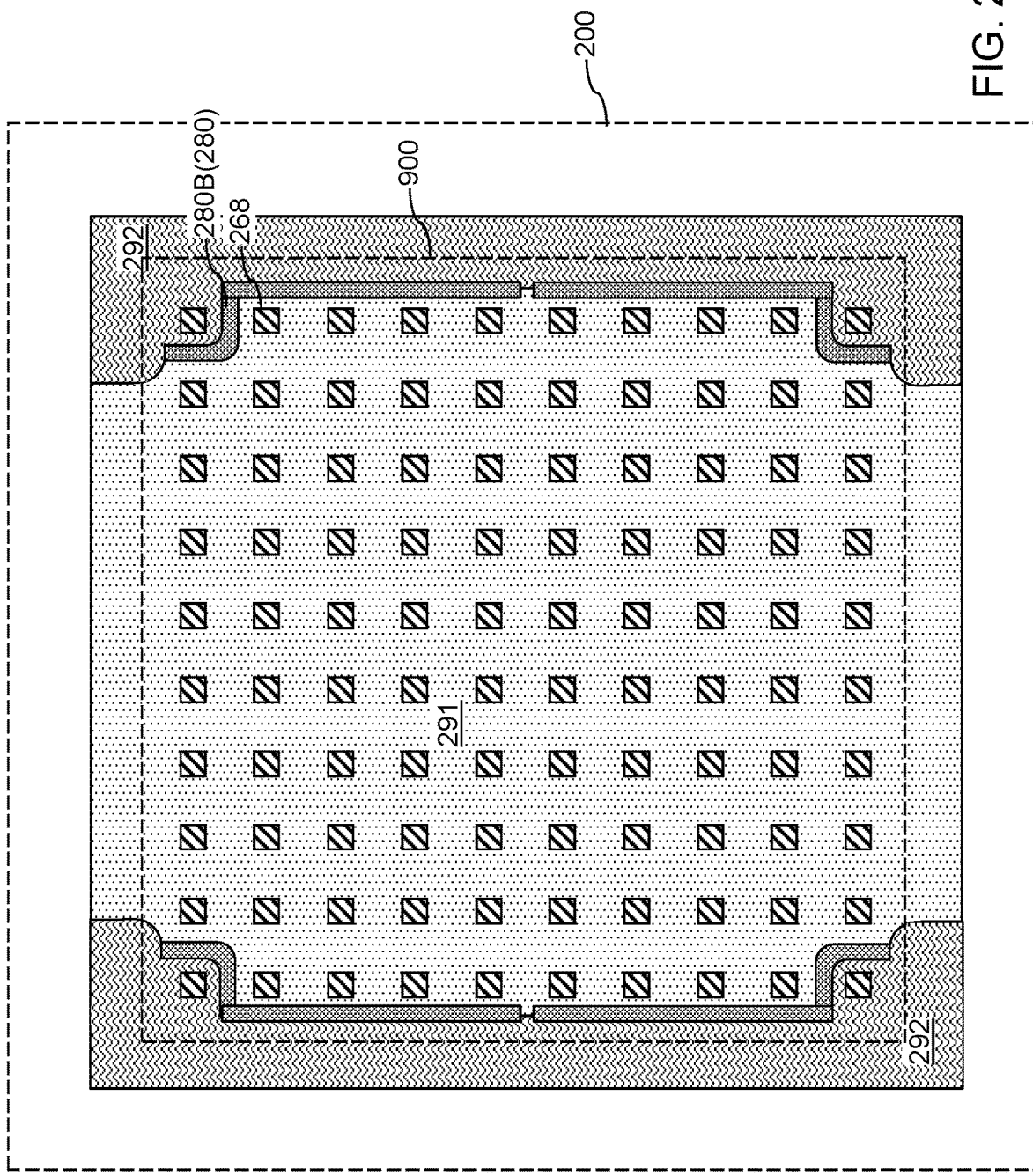
Figure 26C:
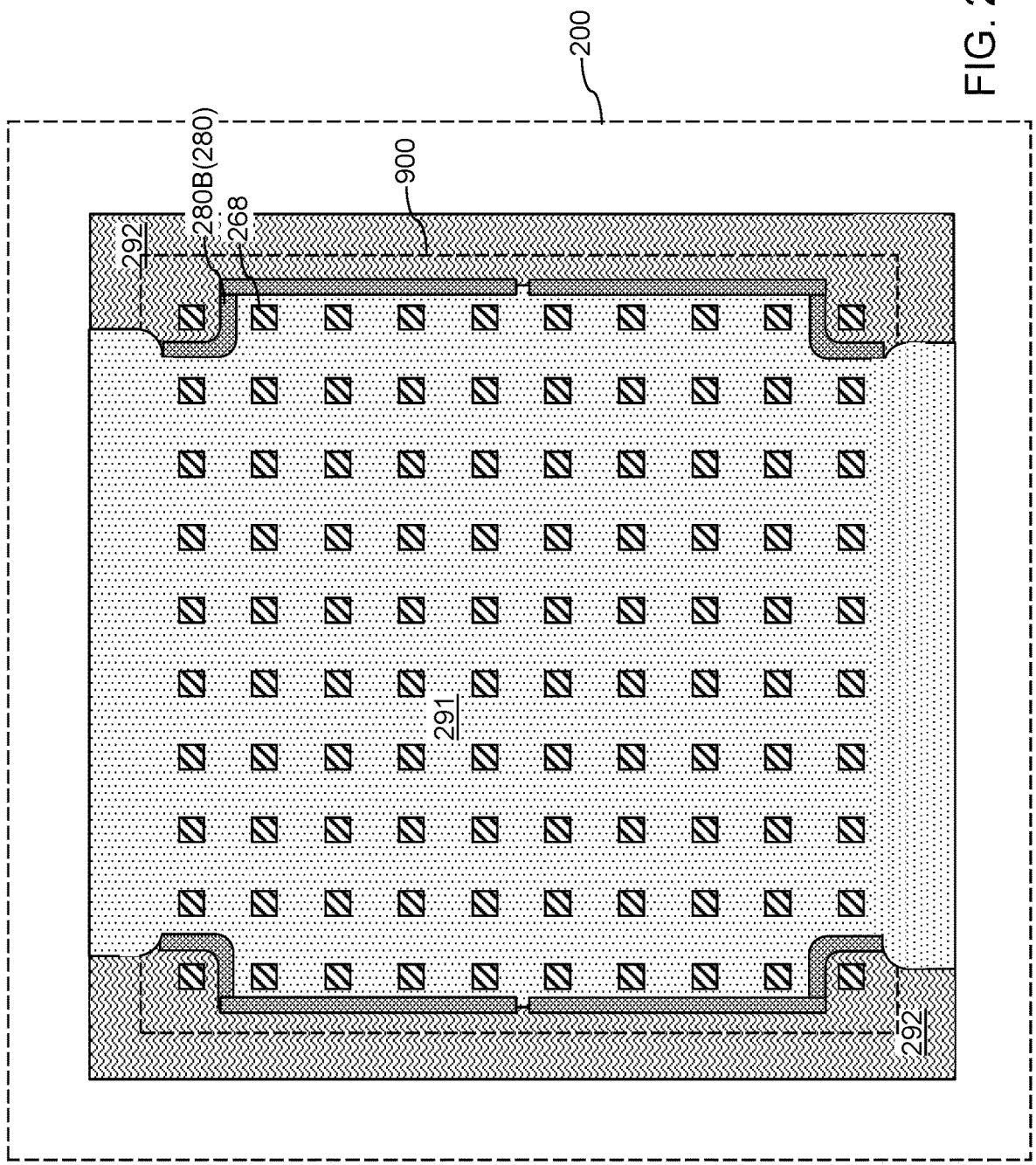

FIGS. 26A-26C are horizontal cross-sectional views of alternative configurations of the third exemplary structure within a horizontal plane including a central underfill material portion 291 and at least one peripheral underfill material portion 292 according to the third embodiment of the present disclosure.

Referring to FIG. 26A, a first alternative configuration of the third exemplary structure may be derived from the third exemplary structure by forming a central underfill material portion 291 first, and then forming peripheral underfill material portions 292 in a subsequent processing step.

Referring to FIG. 26B, a second alternative configuration of the third exemplary structure is illustrated. The at least one peripheral underfill material portion 292 may be formed as two discrete peripheral underfill material portions 292 laterally extending continuously between a respective set of two corners of the interposer 920 and spaced from each other by the central underfill material portion 291. The flow guide structures 280 may comprise at least one section that laterally extends along a respective side of the interposer 920 or along a respective side of the packaging substrate 200. In the illustrated example, the peripheral underfill material portions 292 may be formed prior to formation of the central underfill material portion 291.

Referring to FIG. 26C, a third alternative configuration of the third exemplary structure is illustrated. The third configuration may be derived from the second configuration by forming the central underfill material portions 291 prior to formation of the peripheral underfill material portions 292.

Figure 26D:
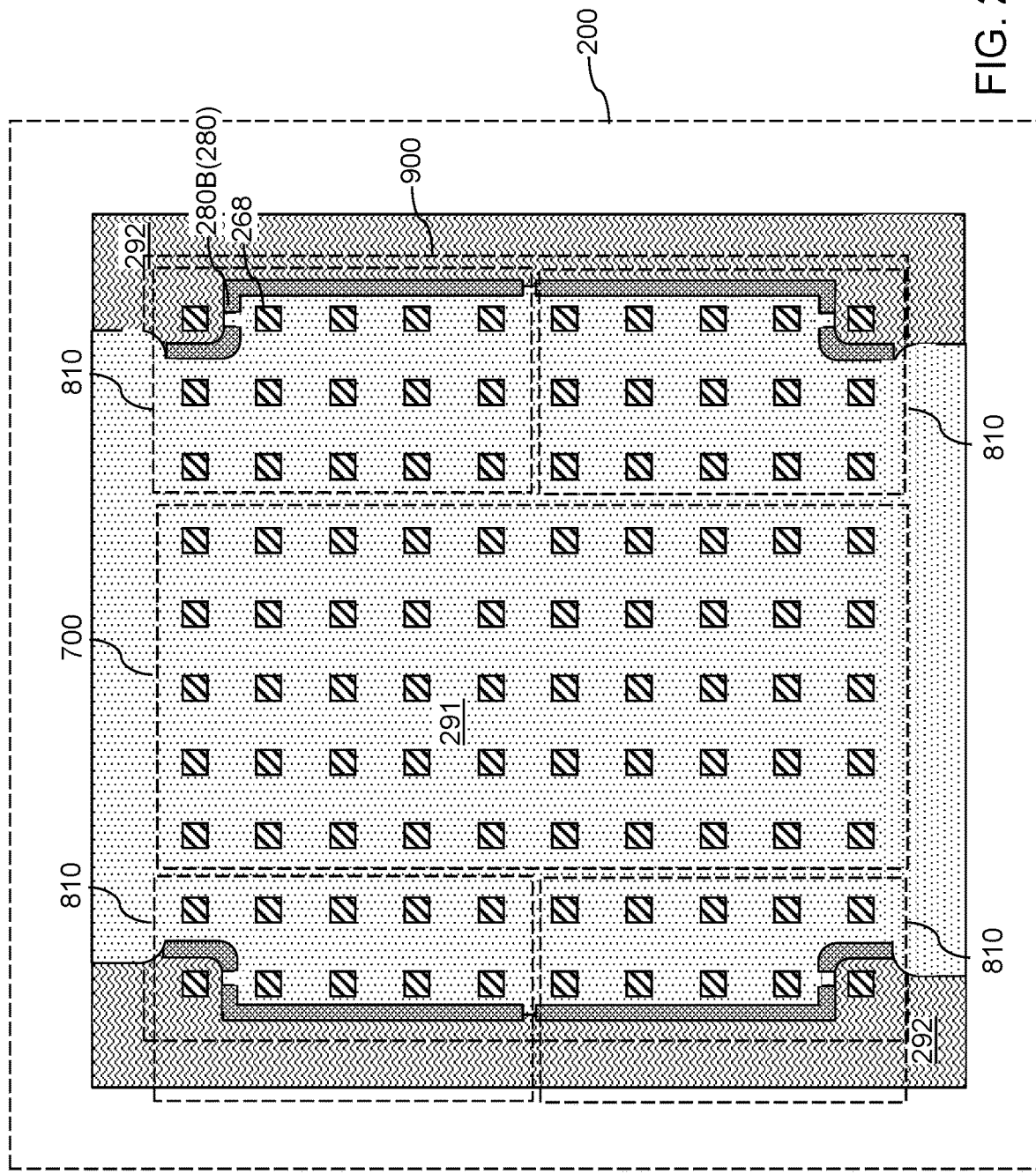

Referring to FIG. 26D, a fourth alternative configuration of the third exemplary structure is illustrated. The fourth configuration may be derived from the fourth configuration by forming additional openings in the flow guide structures 280. Peripheries of an SoC die 800 and four HBM dies 810 in a plan view are juxtaposed to the horizontal cross-sectional view in dotted lines.

FIG. 27 is a flowchart illustrating steps for forming an exemplary structure according to an embodiment of the present disclosure.

Referring to step 2710 and FIGS. 1A-10, 16A-18, and 23A and 23B, a package (such as a fan-out package 900) including at least one semiconductor die (700, 800) and an interposer 920 may be provided.

Referring to step 2720 and FIGS. 11A and 11B, and 24A and 24B, a packaging substrate 200 comprising substrate bonding pads 268 may be provided.

Referring to step 2730 and FIGS. 19A and 19B, 22A-22C, 25A and 25B, 26A-26C, the package may be bonded to the packaging substrate 200 using an array of solder material portions 290.

Referring to step 2740 and FIGS. 19A-22C, 25A and 25B, 26A-26C, a central underfill material portion 291 laterally surrounding a first subset of the solder material portions 290 and at least one peripheral underfill material portion 292 located at corner regions of the interposer 920 may be formed.

Referring to all drawings and according to various embodiments of the present disclosure, a semiconductor structure is provided, which comprises: an assembly (such as a fan-out package 900) including at least one semiconductor die (700, 800) and an interposer 920 including interposer bonding pads 928; a packaging substrate 200 comprising substrate bonding pads 268; an array of solder material portions 290 bonded to the interposer bonding pads 928 and the substrate bonding pads 268; a central underfill material portion 291 laterally surrounding a first subset of the solder material portions 290; and at least one peripheral underfill material portion 292 contacting corner regions of the interposer 920 and a respective surface segment of the central underfill material portion 291 and having a different material composition than the central underfill material portion 291.

In one embodiment, each of the at least one peripheral underfill material portion 292 may contact a respective horizontal surface segment of the packaging substrate 200. In one embodiment, each of the at least one peripheral underfill material portion 292 contacts a respective set of at least one solder material portion within a second subset of the solder material portions 290. In one embodiment, surfaces of a solder material portion within a second subset of the solder material portions 290 may be in contact with one of the interposer bonding pads 928, one of the substrate bonding pads 268, or the at least one peripheral underfill material portion 292, and do not contact the central underfill material portion 291. In one embodiment, the central underfill material portion 291 may include a peripheral region that protrudes out of an area of the interposer 920 in a plan view; and the at least one peripheral underfill material portion 292 may include a first region located within the area of the interposer 920 in the plan view and a second region located outside the area of the interposer 920 in the plan view. In one embodiment, the central underfill material portion 291 may include a central filler material at a volume fraction in a range from 70% to 90% and a central resin at a volume fraction in a range from 1% to 30%; and the at least one peripheral underfill material portion 292 comprises a peripheral filler material at a volume fraction in a range from 0.01% to 80% and a peripheral resin at a volume fraction in a range from 20% to 99.9%. In one embodiment, the at least one peripheral underfill material portion 292 may be free of any filler material. In one embodiment, the semiconductor structure may also include interposer-side flow guide structures 280A located on the interposer 920 and contacting the central underfill material portion 291 on one side and contacting a respective one of the at least one peripheral underfill material portion 292 on another side. In one embodiment, the semiconductor structure may also include substrate-side flow guide structures 280B located on the packaging substrate 200 and contacting the central underfill material portion 291 on one side and contacting a respective one of the at least peripheral underfill material portion 292 on another side. In one embodiment, the interposer-side flow guide structures 280A and the substrate-side flow guide structures 280B may have horizontal cross-sectional shapes that overlap in a plan view along a vertical direction that is perpendicular to a horizontal surface of the packaging substrate 200.

According to another aspect of the present disclosure, a semiconductor structure is provided, which comprises: a fan-out package 900 comprising at least one semiconductor die (700, 800), an interposer 920 attached to the at least one semiconductor die (700, 800) and comprising interposer bonding pads 928, and a die-side underfill material portion 950 located between the at least one semiconductor die (700, 800) and the interposer 920; a packaging substrate 200 comprising substrate bonding pads 268; an array of solder material portions 290 bonded to the substrate bonding pads 268 and to interposer bonding pads 928; a central underfill material portion 291 laterally surrounding a first subset of the solder material portions 290 and contacting a first horizontal surface segment and first sidewall surface segments of the interposer 920; and at least one peripheral underfill material portion 292 contacting corner regions of the interposer 920 and a respective surface segment of the central underfill material portion 291 and having a different material composition than the central underfill material portion 291 and contacting second horizontal surface segments and second sidewall surface segments of the interposer 920.

In one embodiment, the at least one peripheral underfill material portion 292 contacts a subset of the interposer bonding pads 928 and a subset of the substrate bonding pads 268. In one embodiment, the at least one peripheral underfill material portion 292 may include four discrete peripheral underfill material portions located at four corners of the interposer 920 and spaced from one another by the central underfill material portion 291. In one embodiment, the at least one peripheral underfill material portion 292 may include two discrete peripheral underfill material portions laterally extending continuously between a respective set of two corners of the interposer 920 and spaced from each other by the central underfill material portion 291. In one embodiment, the at least one peripheral underfill material portion 292 may include a continuous peripheral underfill material portion laterally surrounding the central underfill material portion 291 and continuously extending underneath four corners of the interposer 920.

The various embodiments of the present disclosure may be used to provide dual-underfill encapsulation for the solder material portions 290 providing electrical connection between an interposer 920 and a packaging substrate 200. The peripheral underfill material portion(s) 292 may have a lower Young's modulus than the central underfill material portion 291. The differential in the Young's moduli may be advantageously used to absorb mechanical deformation at corner regions of an assembly of a package (such as a fan-out package 900) and a packaging substrate 200.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
an assembly including at least one semiconductor die and an interposer including interposer bonding pads;
a packaging substrate comprising substrate bonding pads;
an array of solder material portions bonded to the interposer bonding pads and the substrate bonding pads;
a central underfill material portion laterally surrounding a first subset of the array of solder material portions;
at least one peripheral underfill material portion contacting corner regions of the interposer and a respective surface segment of the central underfill material portion and having a different material composition than the central underfill material portion; and
interposer-side flow guide structures disposed between the interposer and the packaging substrate.

2. The semiconductor structure of claim 1, wherein:
each of the at least one peripheral underfill material portion contacts a respective horizontal surface segment of the packaging substrate; and
surfaces of the at least one peripheral underfill material portion that contact the central underfill material portions have a straight vertical cross-sectional profile, a concave vertical cross-sectional profile, or a convex cross-sectional profile.

3. The semiconductor structure of claim 1, wherein each of the at least one peripheral underfill material portion contacts a respective set of at least one solder material portion within a second subset of the solder material portions.

4. The semiconductor structure of claim 1, wherein all surfaces of a solder material portion within a second subset of the array of solder material portions are in contact with one of the interposer bonding pads, one of the substrate bonding pads, or the at least one peripheral underfill material portion, and do not contact the central underfill material portion.

5. The semiconductor structure of claim 1, wherein:
the central underfill material portion comprises a peripheral region that protrudes out of an area of the interposer in a plan view; and
the at least one peripheral underfill material portion comprises a first region located within the area of the interposer in the plan view and a second region located outside the area of the interposer in the plan view.

6. The semiconductor structure of claim 1, wherein:
the central underfill material portion comprises a central filler material at a volume fraction in a range from 70% to 90% and a central resin at a volume fraction in a range from 1% to 30%; and
the at least one peripheral underfill material portion comprises a peripheral filler material at a volume fraction in a range from 0.01% to 80% and a peripheral resin at a volume fraction in a range from 20% to 99.9%.

7. The semiconductor structure of claim 1, wherein the at least one peripheral underfill material portion is free of any filler material.

8. The semiconductor structure of claim 1, further comprising substrate-side flow guide structures located on the packaging substrate and contacting the central underfill material portion on one side and contacting a respective one of the at least peripheral underfill material portion on another side.

9. The semiconductor structure of claim 8, wherein the interposer-side flow guide structures and the substrate-side flow guide structures have horizontal cross-sectional shapes that overlap in a plan view along a vertical direction that is perpendicular to a horizontal surface of the packaging substrate.

10. The semiconductor structure of claim 1, wherein the interposer-side flow guide structures is located on the interposer and contacts the central underfill material portion on one side and contacts a respective one of the at least one peripheral underfill material portion on another side.

11. A semiconductor structure comprising:
a fan-out package comprising at least one semiconductor die, an interposer attached to the at least one semiconductor die and comprising interposer bonding pads, and a die-side underfill material portion located between the at least one semiconductor die and the interposer;
a packaging substrate comprising substrate bonding pads;
an array of solder material portions bonded to the substrate bonding pads and to interposer bonding pads;
a central underfill material portion laterally surrounding a first subset of the array of solder material portions and contacting a first horizontal surface segment and first sidewall surface segments of the interposer;
at least one peripheral underfill material portion contacting corner regions of the interposer and a respective surface segment of the central underfill material portion and having a different material composition than the central underfill material portion and contacting second horizontal surface segments and second sidewall surface segments of the interposer; and
interposer-side flow guide structures disposed between the interposer and the packaging substrate.

12. The semiconductor structure of claim 11, wherein:
the at least one peripheral underfill material portion contacts a subset of the interposer bonding pads and a subset of the substrate bonding pads; and
surfaces of the at least one peripheral underfill material portion that contact the central underfill material portions have a straight vertical cross-sectional profile, a concave vertical cross-sectional profile, or a convex cross-sectional profile.

13. The semiconductor structure of claim 11, wherein the at least one peripheral underfill material portion comprises four discrete peripheral underfill material portions located at four corners of the interposer and spaced from one another by the central underfill material portion.

14. The semiconductor structure of claim 11, wherein the at least one peripheral underfill material portion comprises two discrete peripheral underfill material portions laterally extending continuously between a respective set of two corners of the interposer and spaced from each other by the central underfill material portion.

15. The semiconductor structure of claim 11, wherein the at least one peripheral underfill material portion comprises a continuous peripheral underfill material portion laterally surrounding the central underfill material portion and continuously extending underneath four corners of the interposer.

16. The semiconductor structure of claim 11, wherein the interposer-side flow guide structures is located on the interposer and contacts the central underfill material portion on one side and contacts a respective one of the at least one peripheral underfill material portion on another side.

17. A semiconductor structure comprising:
an assembly including at least one semiconductor die and an interposer including interposer bonding pads;
a packaging substrate comprising substrate bonding pads;
an array of solder material portions bonded to the interposer bonding pads and the substrate bonding pads;
a central underfill material portion contacting a first subset of the array of solder material portions and not in direct contact with a second subset of the array of solder material portions;
at least one peripheral underfill material portion contacting the interposer and having a different material composition than the central underfill material portion; and
interposer-side flow guide structures disposed between the interposer and the packaging substrate.

18. The semiconductor structure of claim 17, wherein the at least one peripheral underfill material portion contacts a respective surface segment of the central underfill material portion.

19. The semiconductor structure of claim 17, wherein the at least one peripheral underfill material portion comprises a plurality of peripheral underfill material portions that do not contact one another.

20. The semiconductor structure of claim 17, wherein:
first surface segments of the central underfill material portion are in direct contact with the at least one peripheral underfill material portion; and second surface segments of the central underfill material portion are physically exposed to an ambient environment.

* * * * *